(12) United States Patent
Takano et al.

(10) Patent No.: US 7,786,526 B2
(45) Date of Patent: Aug. 31, 2010

(54) NONVOLATILE SEMICONDUCTOR MEMORY DEVICE

(75) Inventors: Tamae Takano, Kanagawa (JP); Makoto Furuno, Kanagawa (JP); Yoshinobu Asami, Kanagawa (JP); Shunpei Yamazaki, Tokyo (JP)

(73) Assignee: Semiconductor Energy Laboratory Co., Ltd., Atsugi-shi, Kanagawa-ken ( * ) Notice: Subject to any disclaimer, the term of this patent is extended or adjusted under 35 U.S.C. 154(b) by 120 days.

(21) Appl. No.: 11/730,184

(22) Filed: Mar. 29, 2007

(65) Prior Publication Data
US 2007/0228449 A1    Oct. 4, 2007

(30) Foreign Application Priority Data
Mar. 31, 2006   (JP)   ............... 2006-101052

(51) Int. Cl.
H01L 29/792   (2006.01)
(52) U.S. Cl. .............. 257/324; 257/311; 257/316; 257/E29.309
(58) Field of Classification Search ........... 257/311, 257/316, 324, E29.309
See application file for complete search history.

(56) References Cited

U.S. PATENT DOCUMENTS

| | | | |
|---|---|---|---|
| 3,878,549 A | 4/1975 | Yamazaki et al. | |
| 5,448,513 A * | 9/1995 | Hu et al. ............... | 365/150 |
| 5,808,336 A | 9/1998 | Miyawaki | |
| 6,324,101 B1 | 11/2001 | Miyawaki | |
| 6,417,538 B1 | 7/2002 | Choi | |
| 6,498,369 B1 | 12/2002 | Yamazaki et al. | |
| 6,518,594 B1 | 2/2003 | Nakajima et al. | |
| 6,551,948 B2 | 4/2003 | Ohmi et al. | |
| 6,597,034 B2 | 7/2003 | Yamazaki et al. | |
| 6,613,630 B2 | 9/2003 | Lee | |
| 6,699,754 B2 | 3/2004 | Huang | |
| 6,713,834 B2 | 3/2004 | Mori et al. | |
| 6,812,086 B2 | 11/2004 | Murthy et al. | |
| 6,828,623 B1 | 12/2004 | Guo et al. | |
| 6,861,689 B2 | 3/2005 | Burnett | |
| 7,098,504 B2 | 8/2006 | Kawashima et al. | |
| 7,245,010 B2 | 7/2007 | Powell et al. | |

(Continued)

FOREIGN PATENT DOCUMENTS

EP   0 682 370   9/2000

(Continued)

Primary Examiner—Victor A Mandala
(74) Attorney, Agent, or Firm—Eric J. Robinson; Robinson Intellectual Property Law Office, P.C.

(57) ABSTRACT

It is an object of the present invention to provide a nonvolatile semiconductor memory device which has superior writing characteristics and electric charge retention characteristics. In addition, it is an object of the present invention to provide a nonvolatile semiconductor memory device in which a writing voltage can be reduced. The nonvolatile semiconductor memory device includes a semiconductor region with a channel formation region formed between a pair of impurity regions which are formed to be apart from each other; and a first insulating layer, a charge accumulation layer, a second insulating layer, and a control gate are formed in a location which is a top layer portion of the semiconductor region and which roughly overlaps with the channel formation region. The charge accumulation layer is insulative and is formed as a layer in which electric charge can be trapped.

15 Claims, 49 Drawing Sheets

U.S. PATENT DOCUMENTS

| | | |
|---|---|---|
| 7,482,651 B2 | 1/2009 | Bhattacharyya |
| 7,485,526 B2 | 2/2009 | Mouli et al. |
| 7,554,854 B2 | 6/2009 | Osame et al. |
| 2002/0079533 A1 | 6/2002 | Horiguchi et al. |
| 2002/0093073 A1 | 7/2002 | Mori et al. |
| 2002/0175376 A1 | 11/2002 | Ohtani et al. |
| 2003/0049900 A1 | 3/2003 | Forbes et al. |
| 2003/0107077 A1 | 6/2003 | Yamazaki et al. |
| 2004/0043638 A1 | 3/2004 | Nansei et al. |
| 2004/0104426 A1 | 6/2004 | Forbes et al. |
| 2004/0119110 A1 | 6/2004 | Park |
| 2005/0023577 A1 | 2/2005 | Ito |
| 2005/0095786 A1 | 5/2005 | Chang et al. |
| 2005/0112820 A1* | 5/2005 | Chen et al. ............... 438/257 |
| 2005/0230743 A1 | 10/2005 | Nakagawa et al. |
| 2006/0003531 A1 | 1/2006 | Chang et al. |
| 2006/0043463 A1 | 3/2006 | Liu et al. |
| 2006/0118858 A1* | 6/2006 | Jeon et al. ............... 257/321 |
| 2006/0186458 A1 | 8/2006 | Forbes et al. |
| 2006/0246738 A1 | 11/2006 | Isobe et al. |
| 2007/0132004 A1 | 6/2007 | Yasuda et al. |
| 2007/0200167 A1 | 8/2007 | Yamazaki |
| 2007/0221971 A1 | 9/2007 | Yamazaki et al. |
| 2007/0221985 A1 | 9/2007 | Yamazaki et al. |
| 2007/0228448 A1 | 10/2007 | Yamazaki et al. |
| 2007/0228449 A1 | 10/2007 | Takano et al. |
| 2007/0228452 A1 | 10/2007 | Asami |
| 2007/0228453 A1 | 10/2007 | Yamazaki et al. |
| 2007/0230254 A1 | 10/2007 | Osame et al. |
| 2007/0235793 A1 | 10/2007 | Yamazaki et al. |
| 2007/0235794 A1 | 10/2007 | Yamazaki et al. |
| 2009/0257283 A1 | 10/2009 | Osame et al. |

FOREIGN PATENT DOCUMENTS

| | | |
|---|---|---|
| JP | 51-007036 | 3/1976 |
| JP | 52-023532 | 6/1977 |
| JP | 55-015869 | 4/1980 |
| JP | 03-119765 | 5/1991 |
| JP | 06-097454 | 4/1994 |
| JP | 06-244432 | 9/1994 |
| JP | 08-097307 | 4/1996 |
| JP | 2656986 | 9/1997 |
| JP | 10-135357 | 5/1998 |
| JP | 11-040682 | 2/1999 |
| JP | 2000-058685 | 2/2000 |
| JP | 2004-221448 | 8/2004 |
| JP | 2005-347328 | 12/2005 |
| JP | 2006-114905 | 4/2006 |

* cited by examiner

Charge Retention State

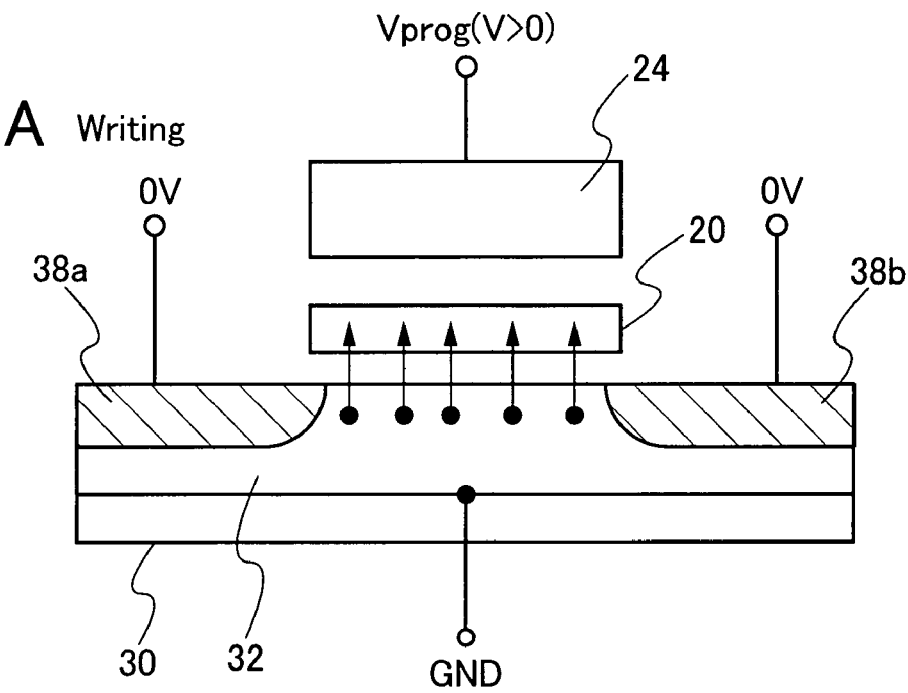
FIG. 6A Writing
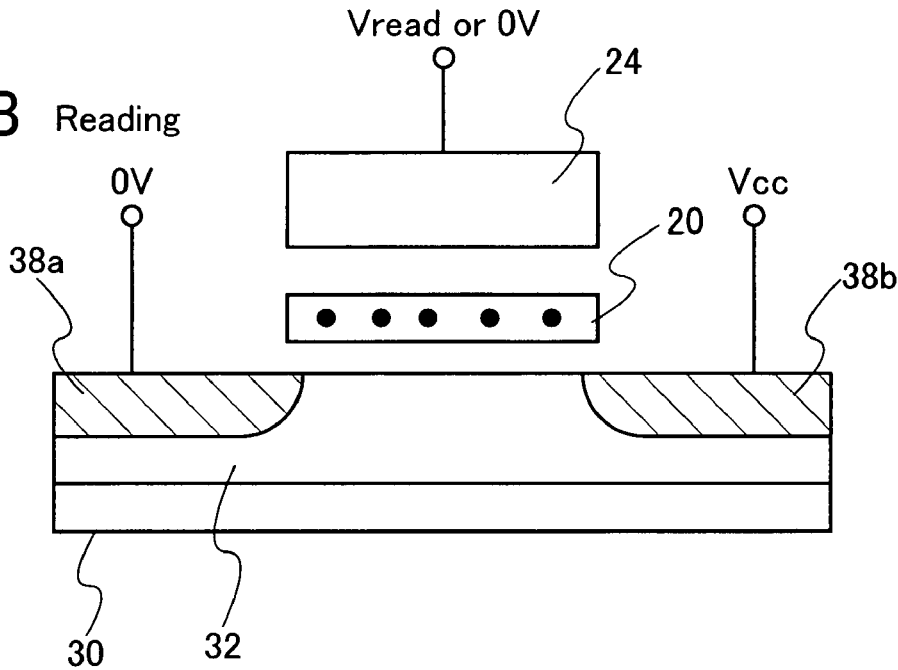
FIG. 6B Reading

FIG. 7A Erasing
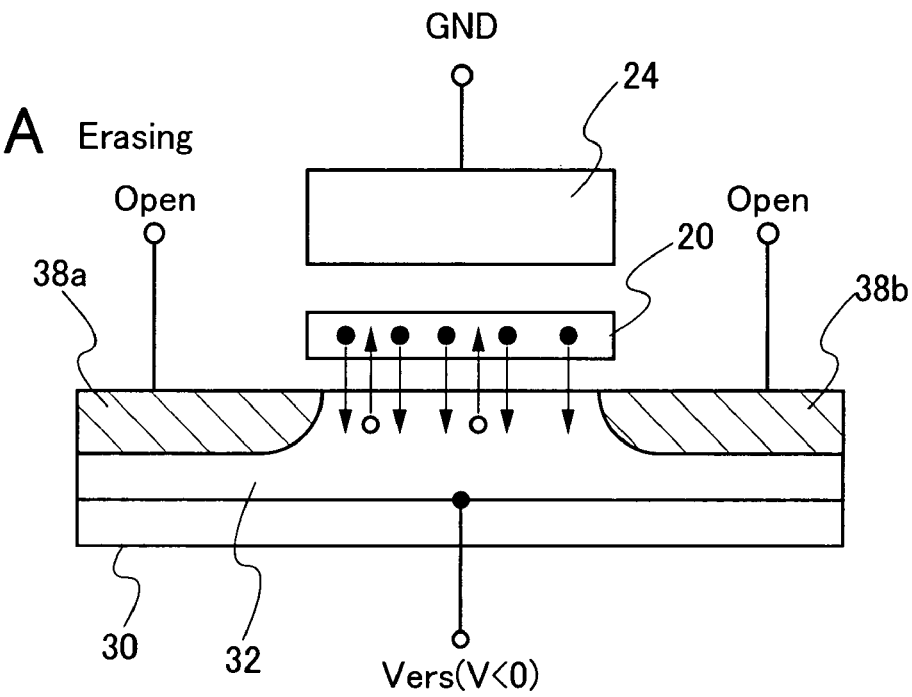
FIG. 7B Erasing
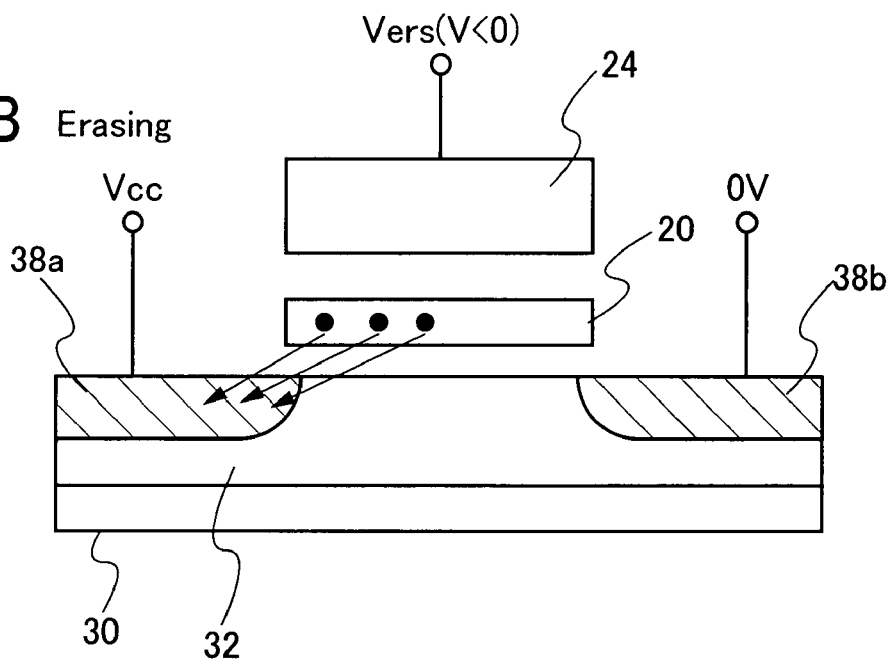

FIG. 11A  "0" writing
FIG. 11B  "1" writing
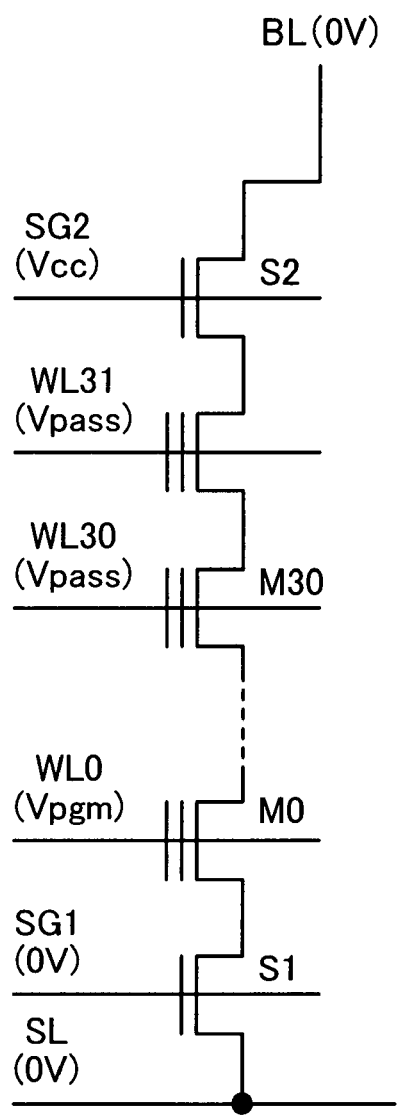
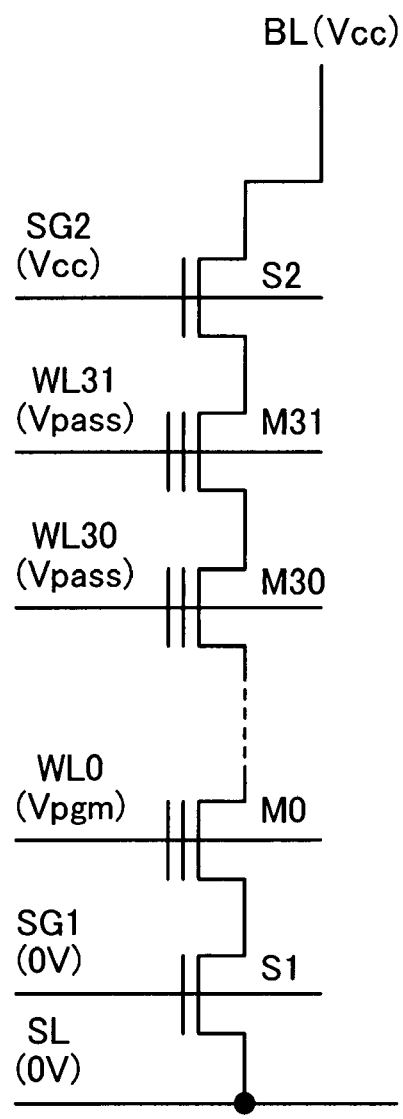

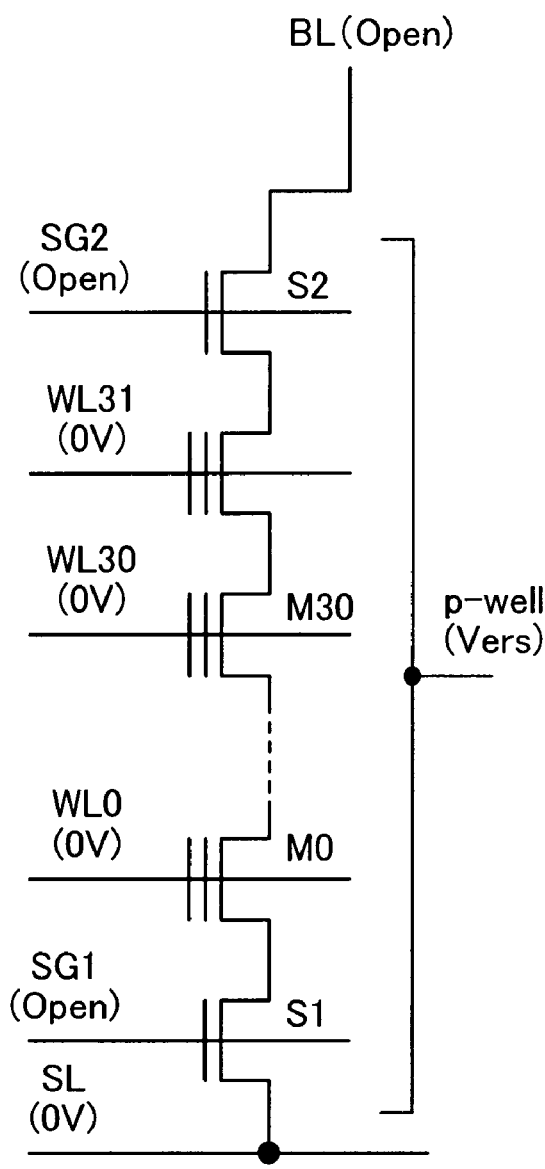
FIG. 12A  Erasing
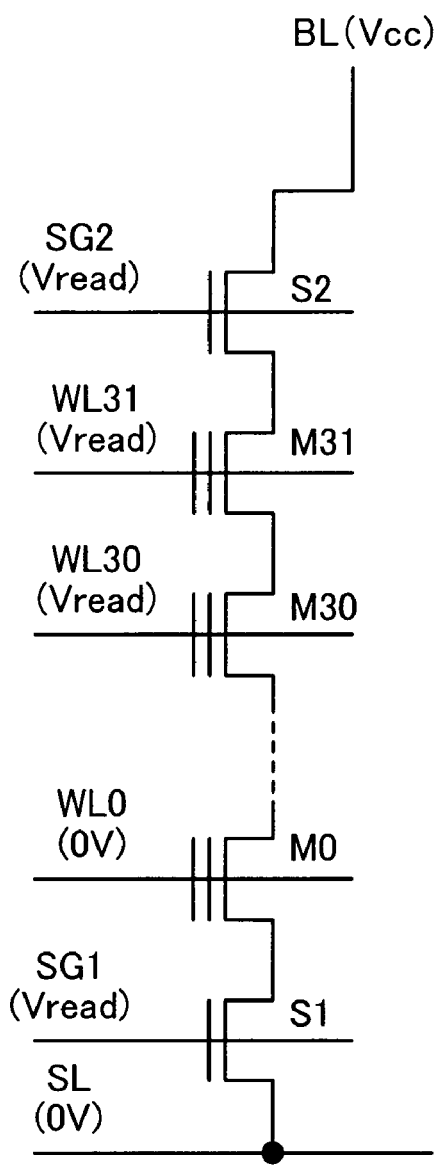
FIG. 12B  Reading

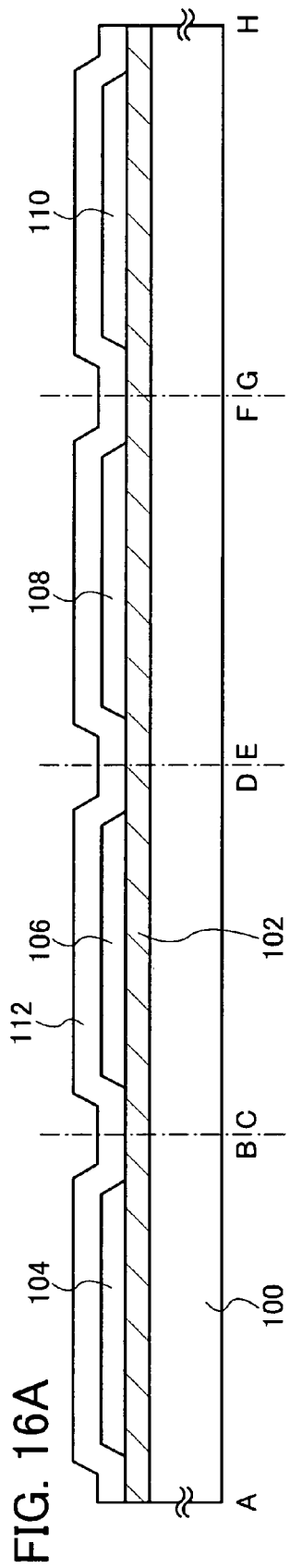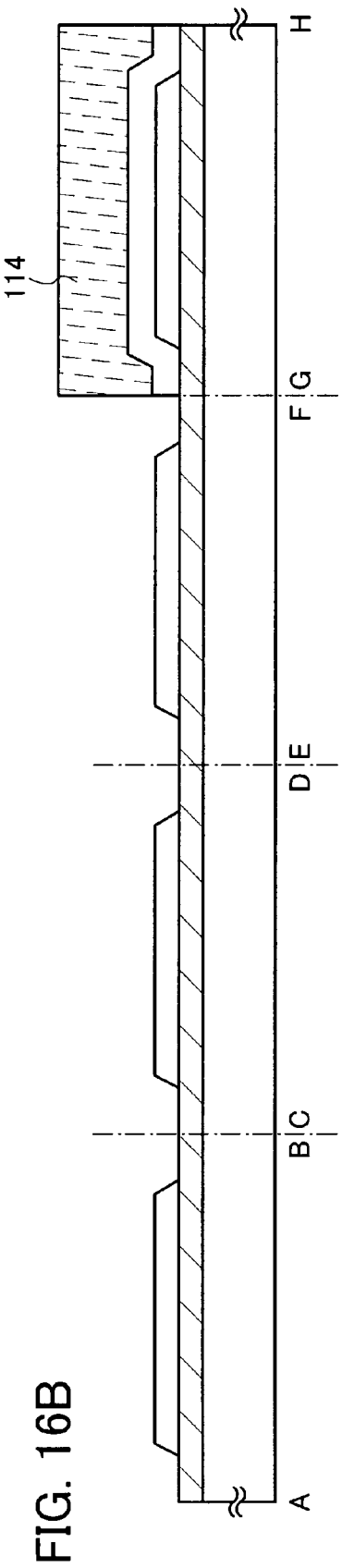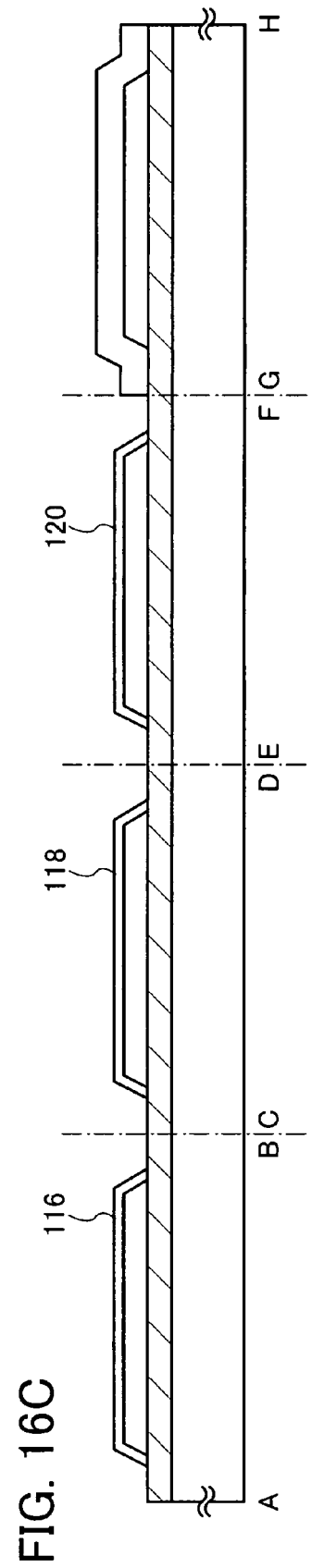

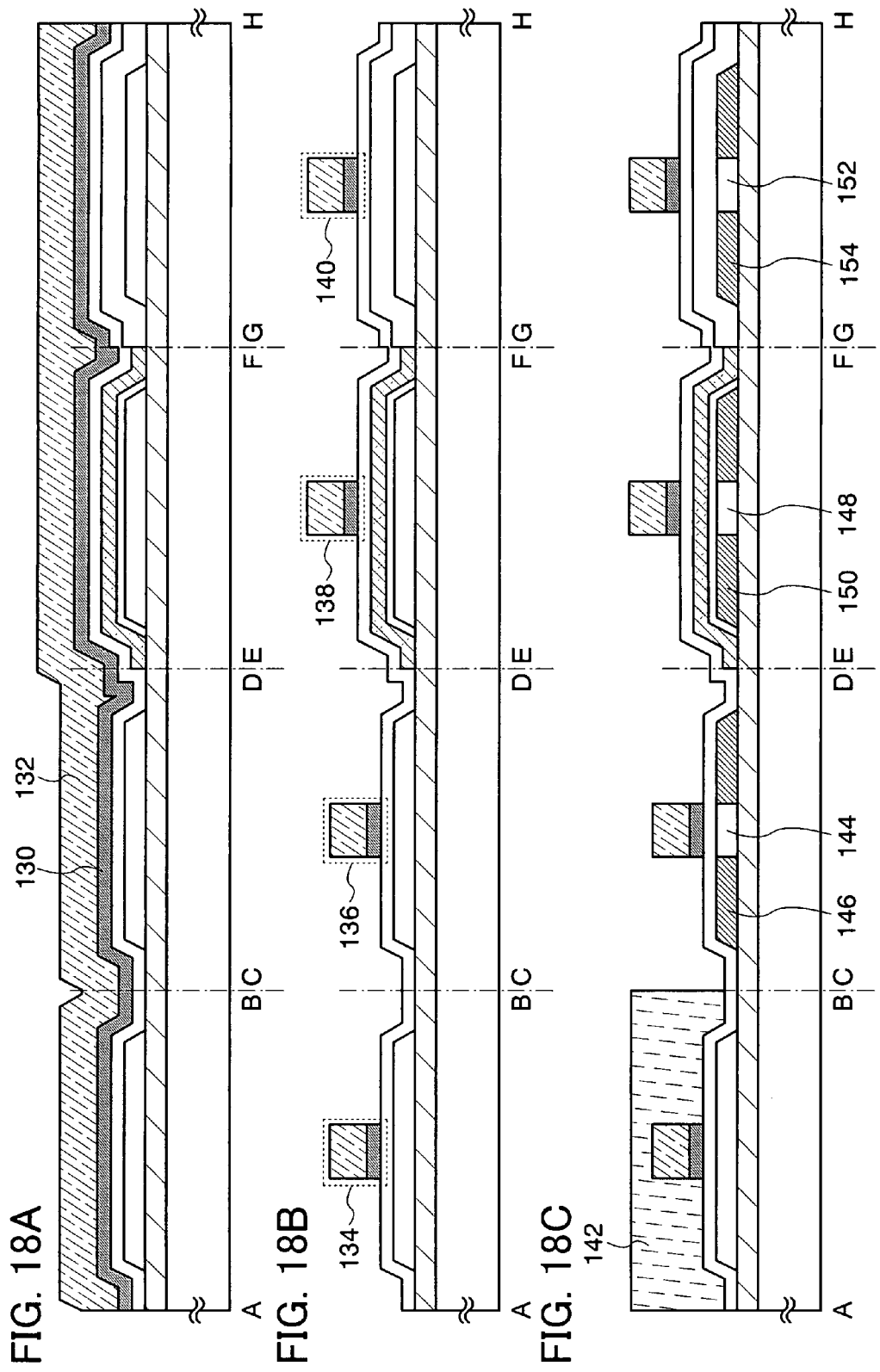

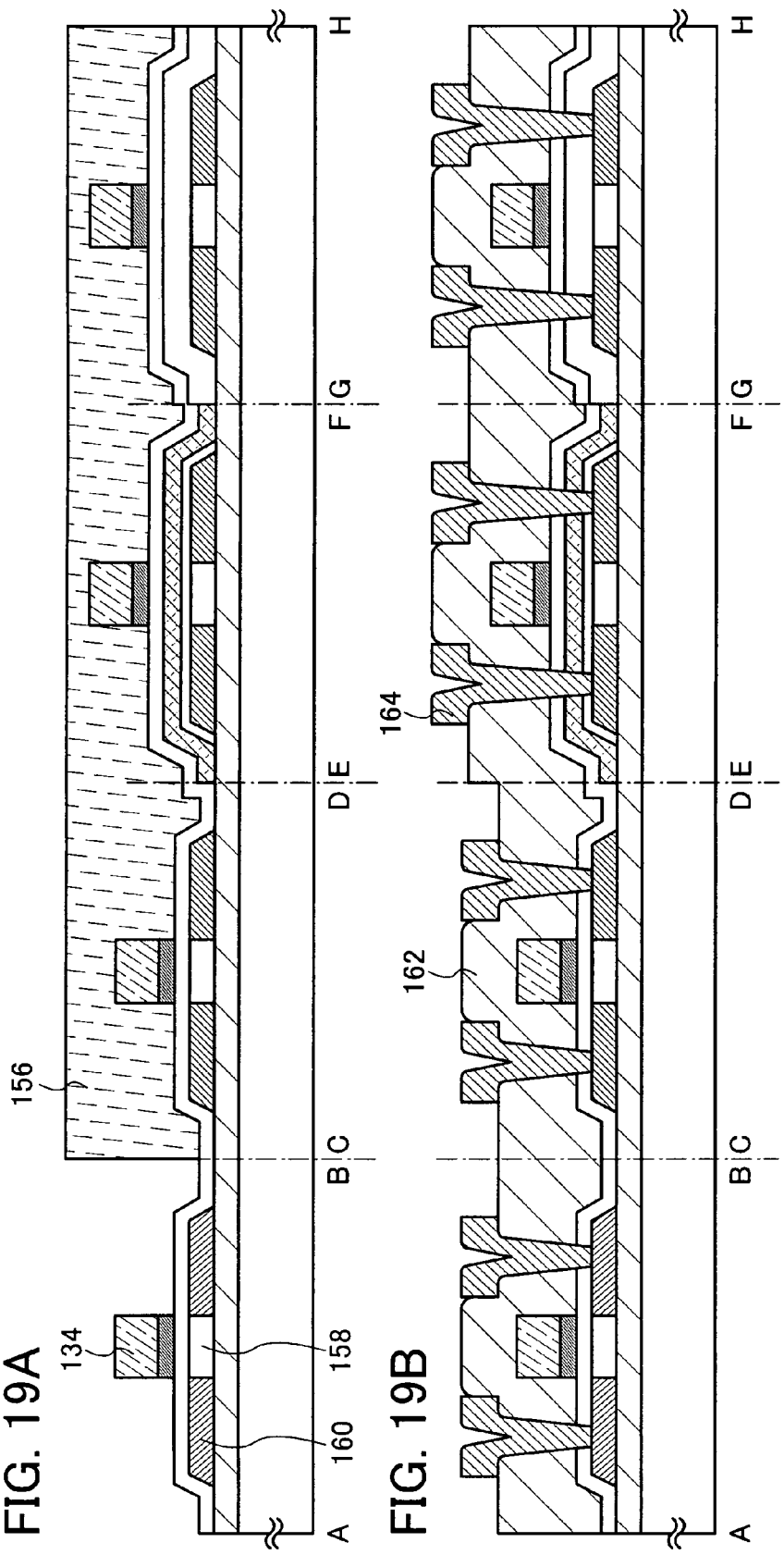

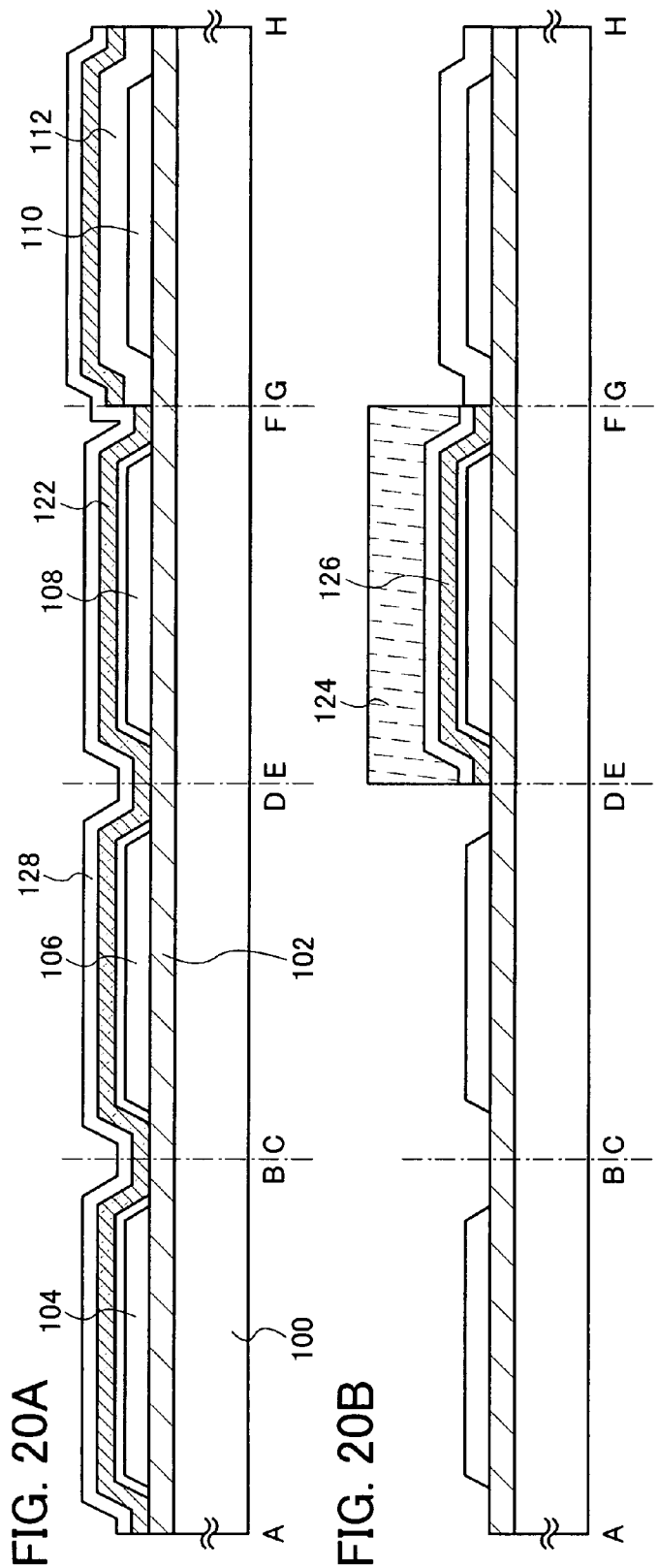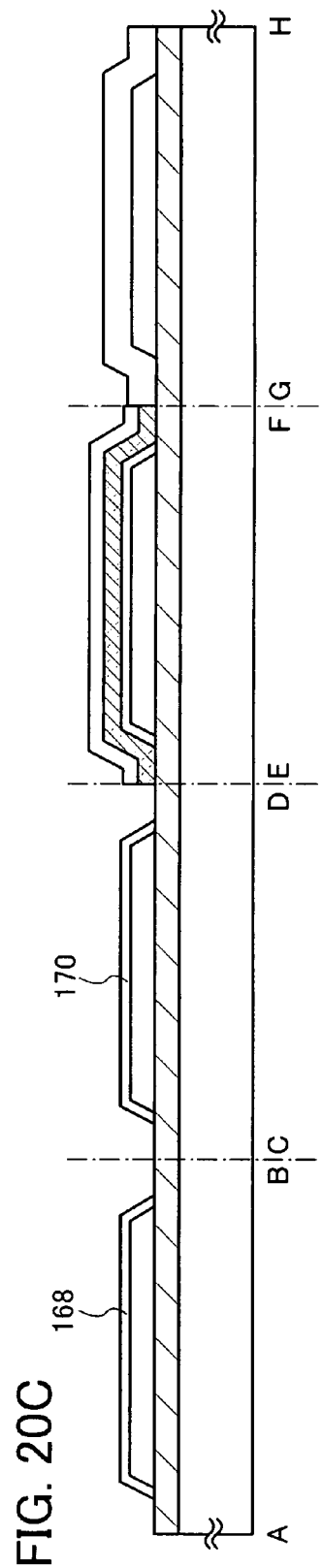

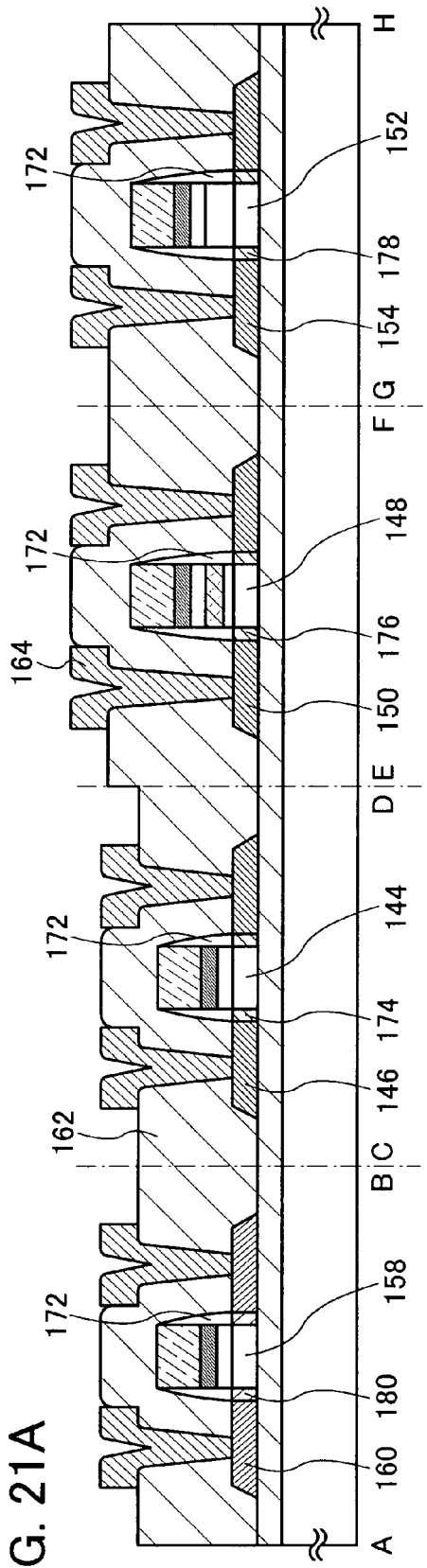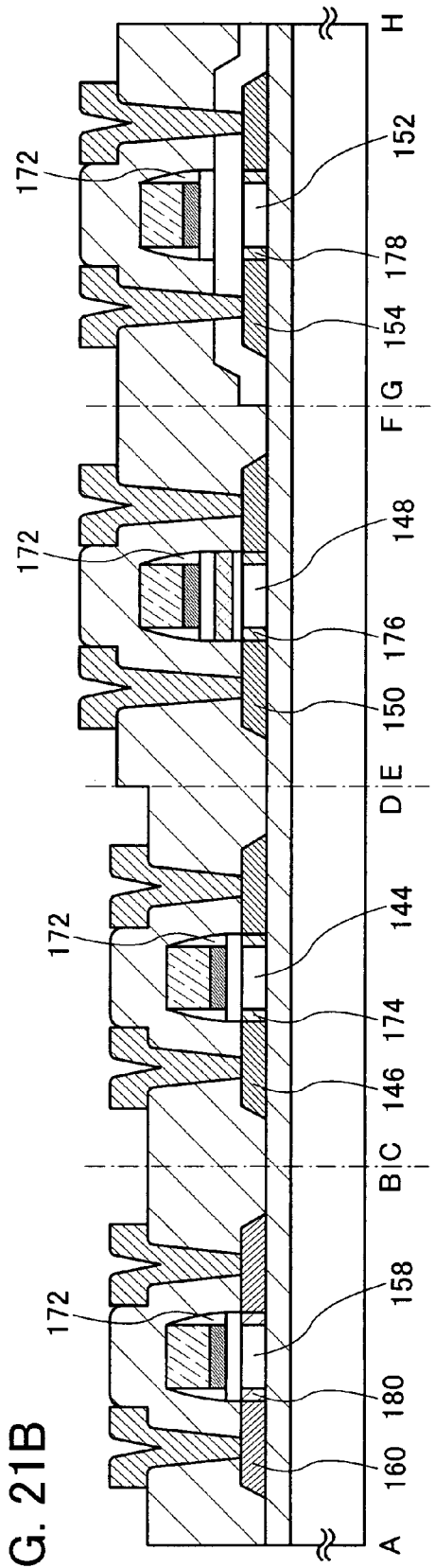

FIG. 23
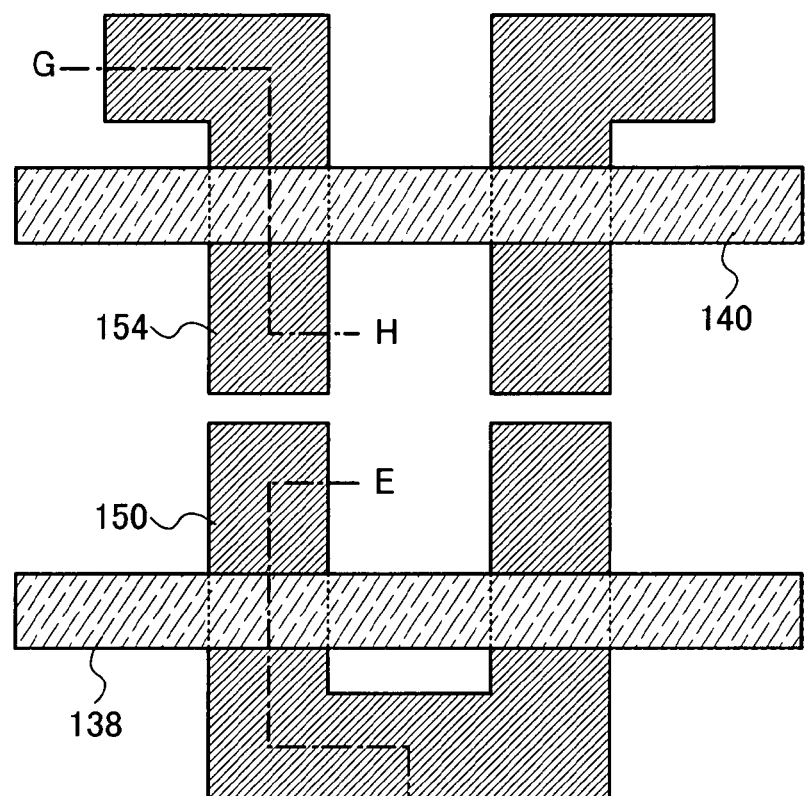
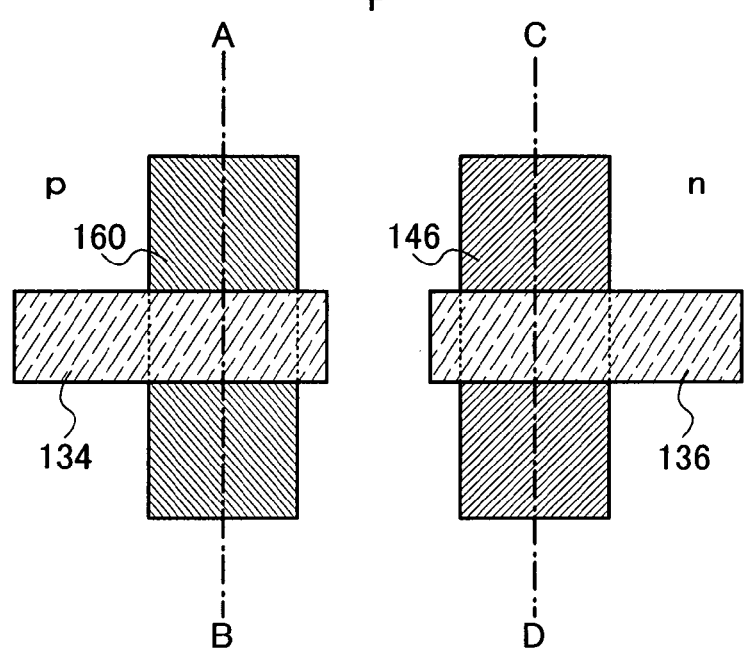

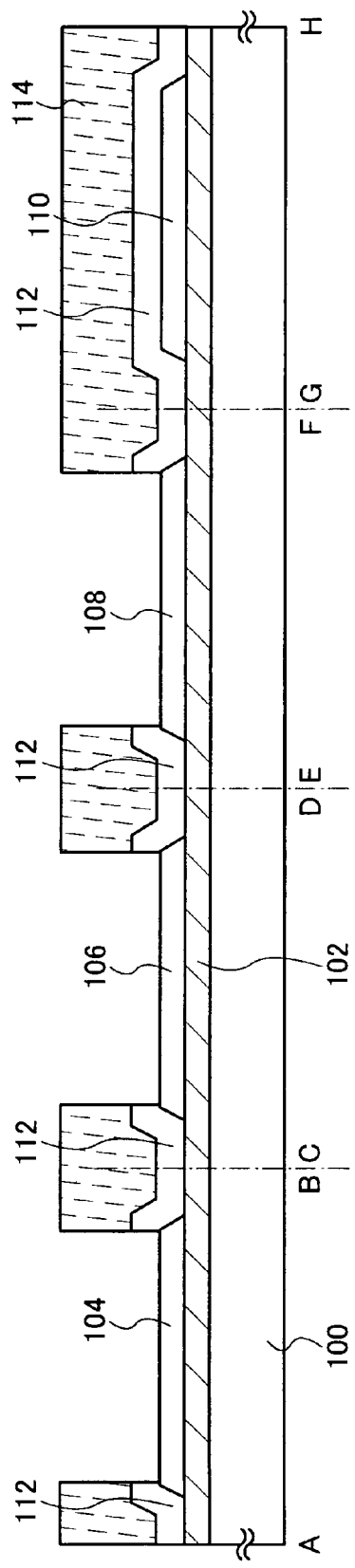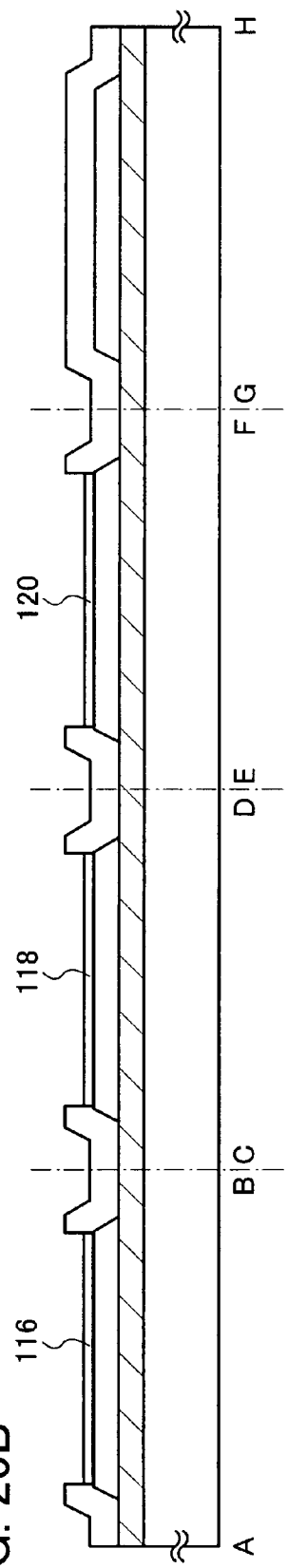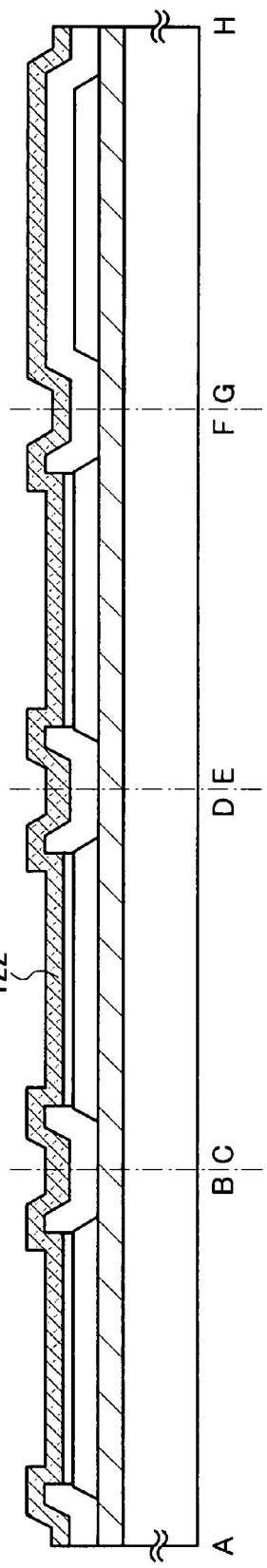

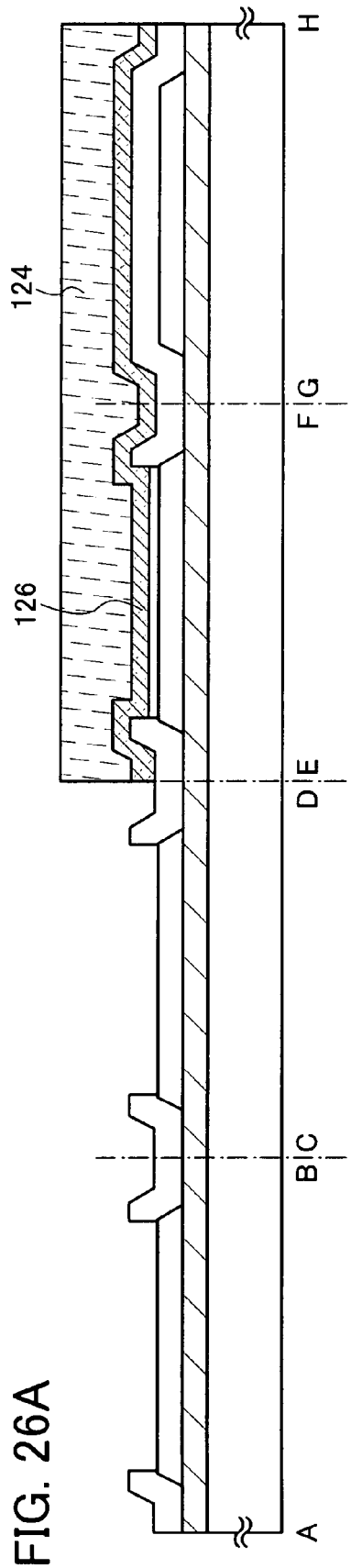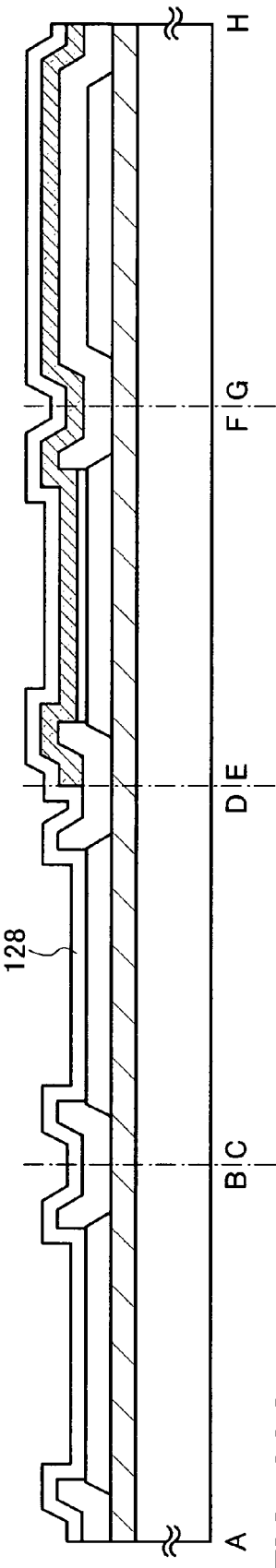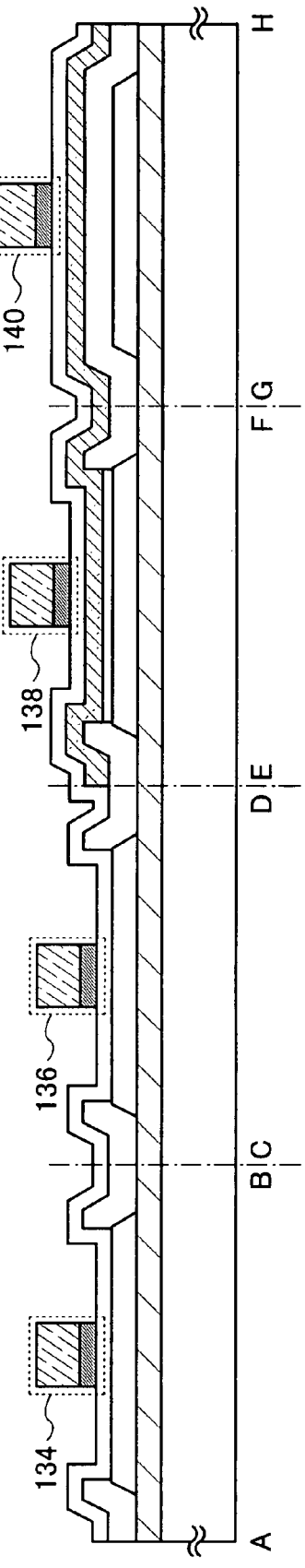

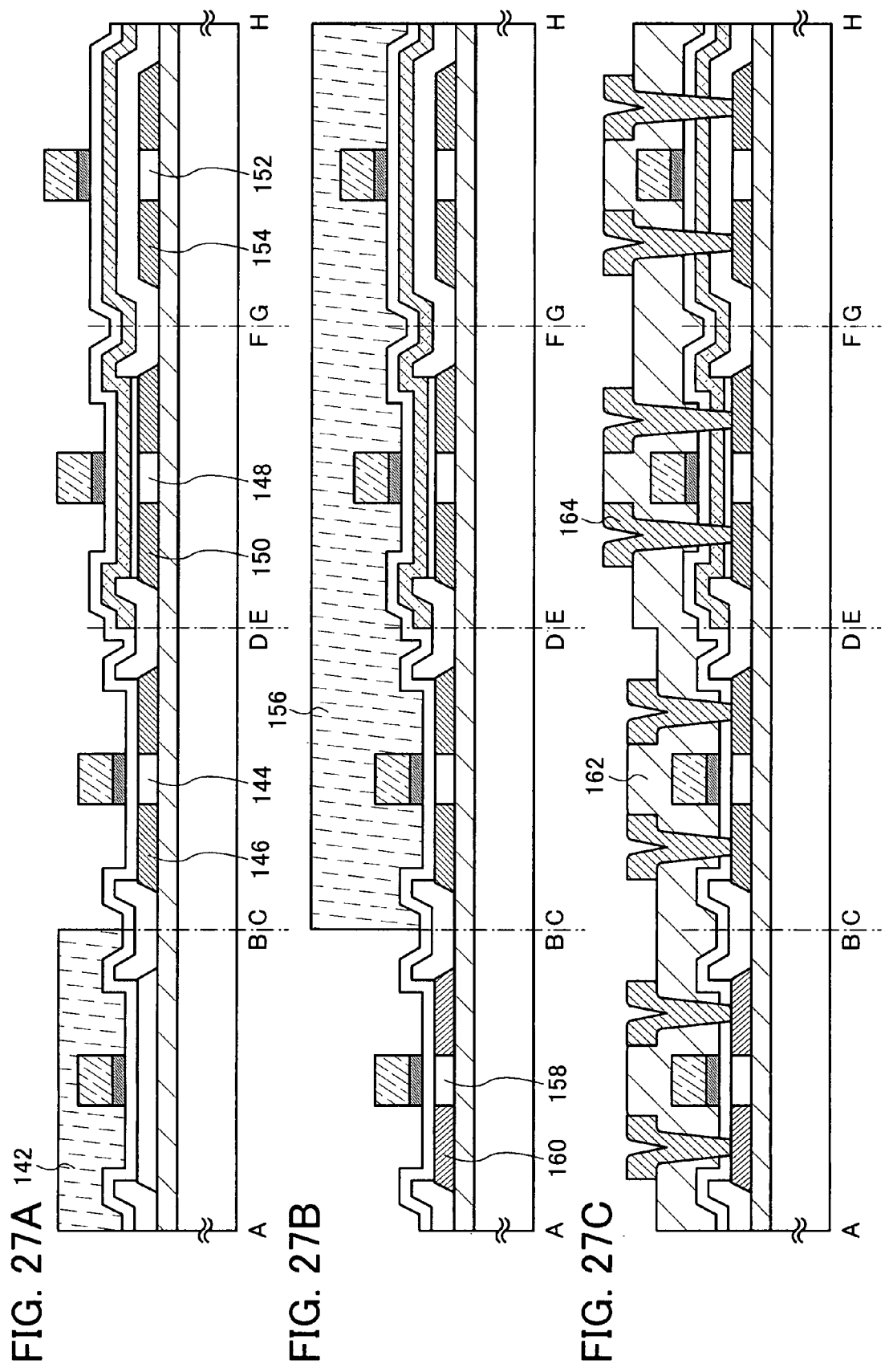

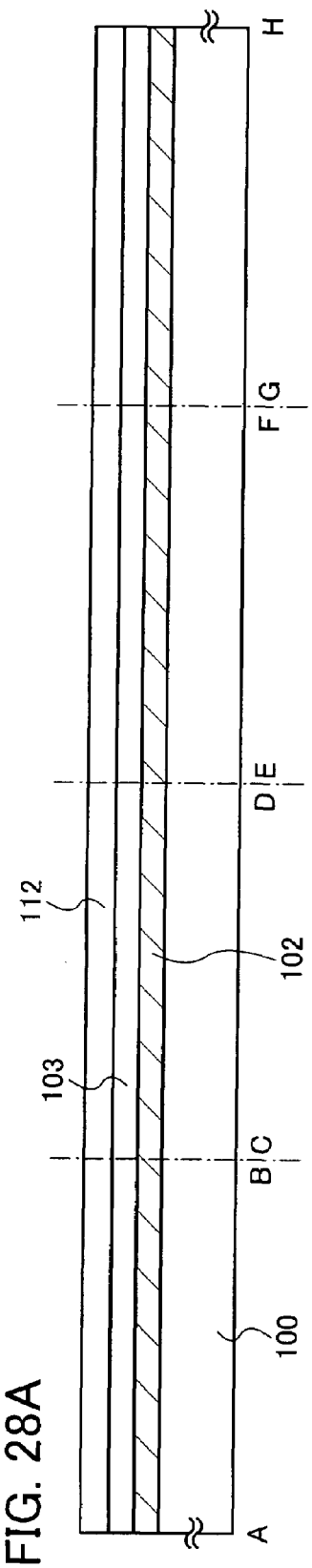
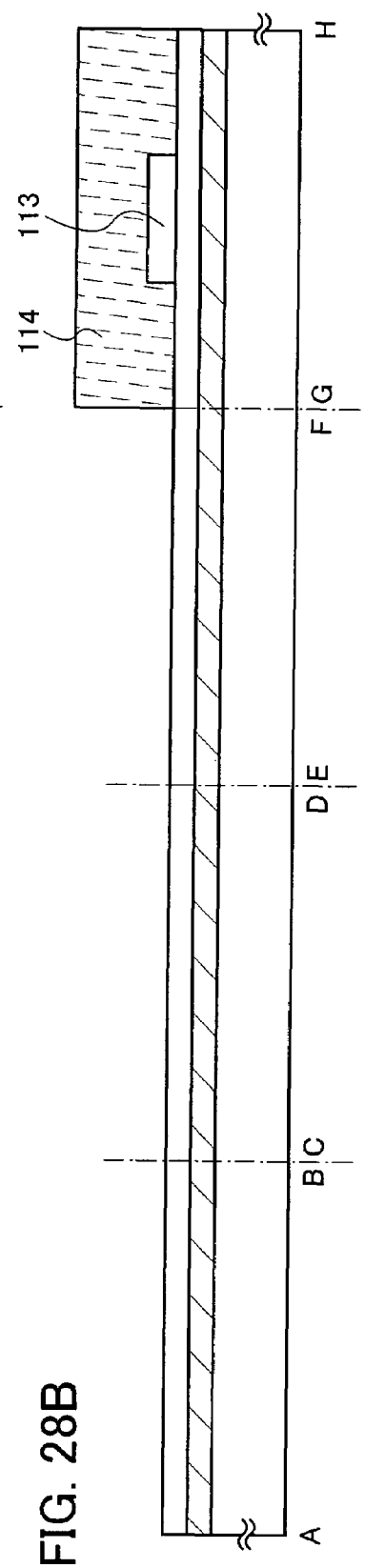
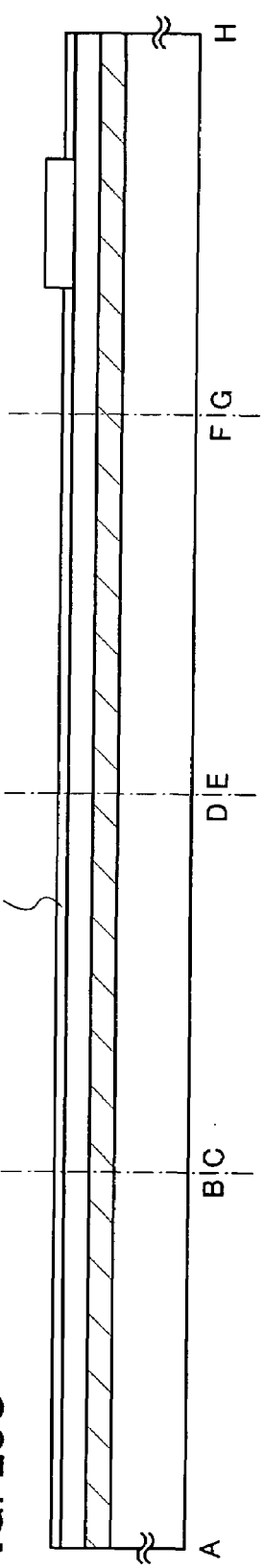
FIG. 28A
FIG. 28B
FIG. 28C

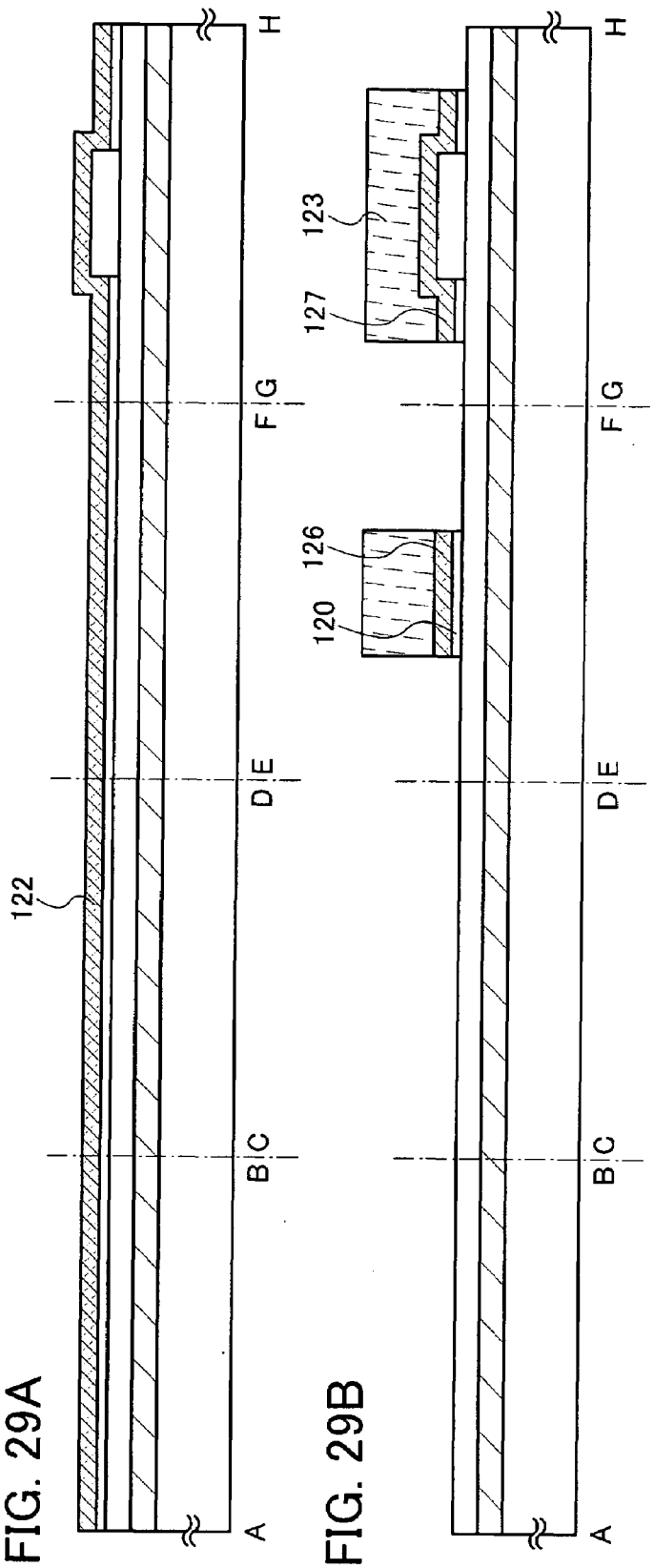

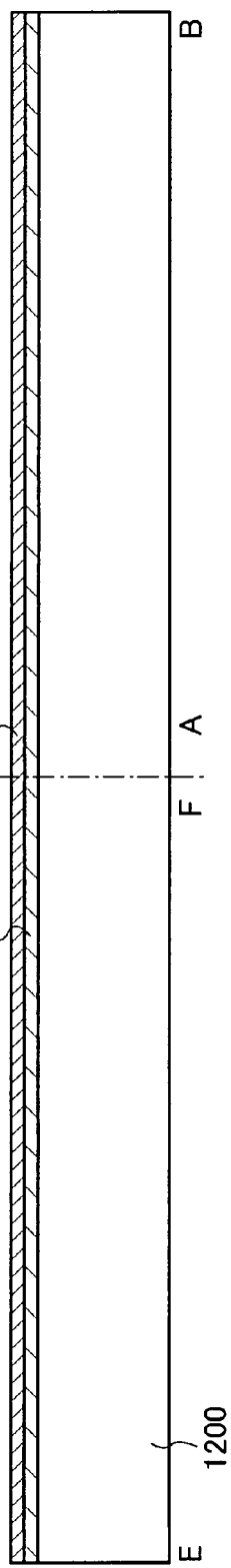
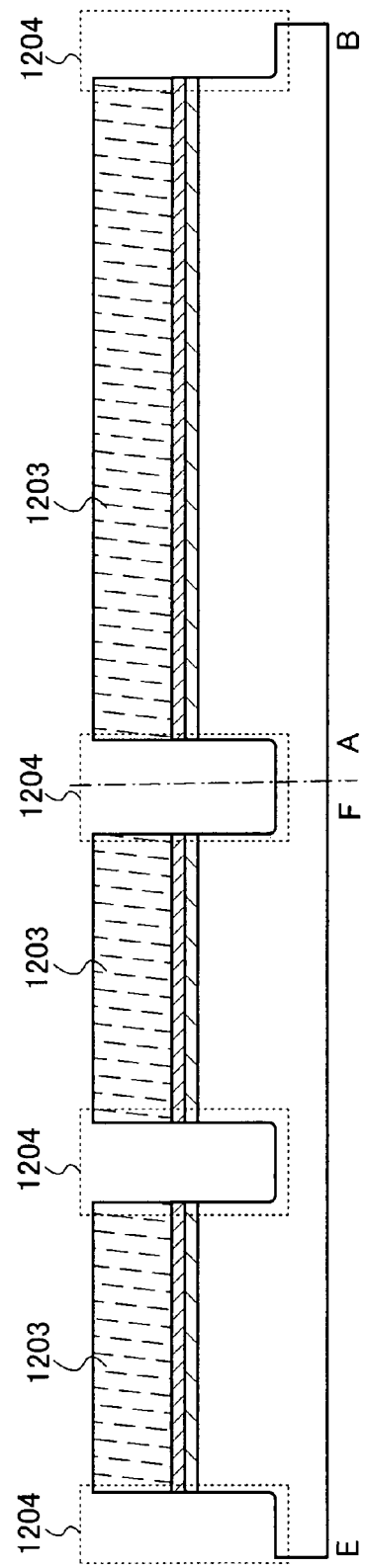
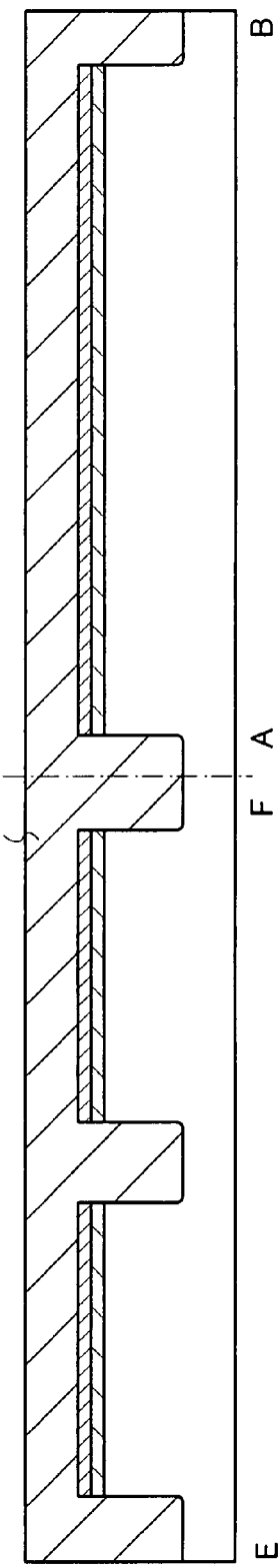

1206
1209

1207
1208

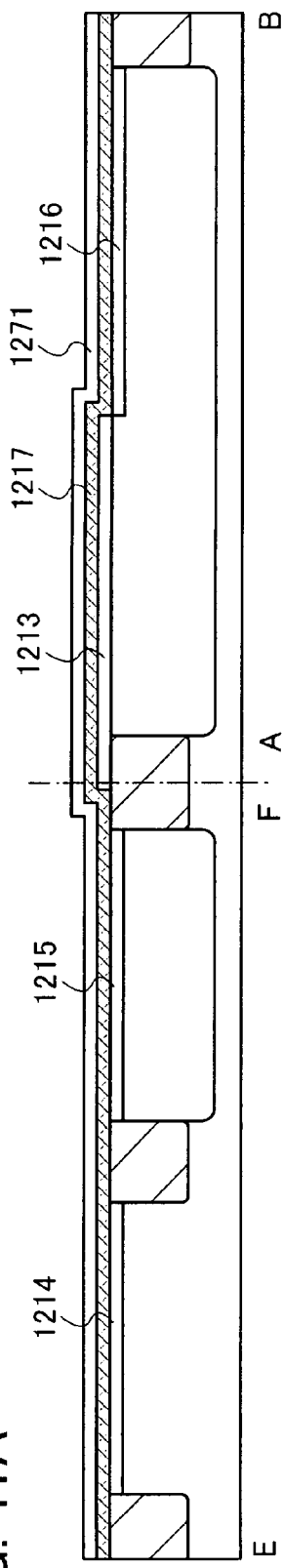
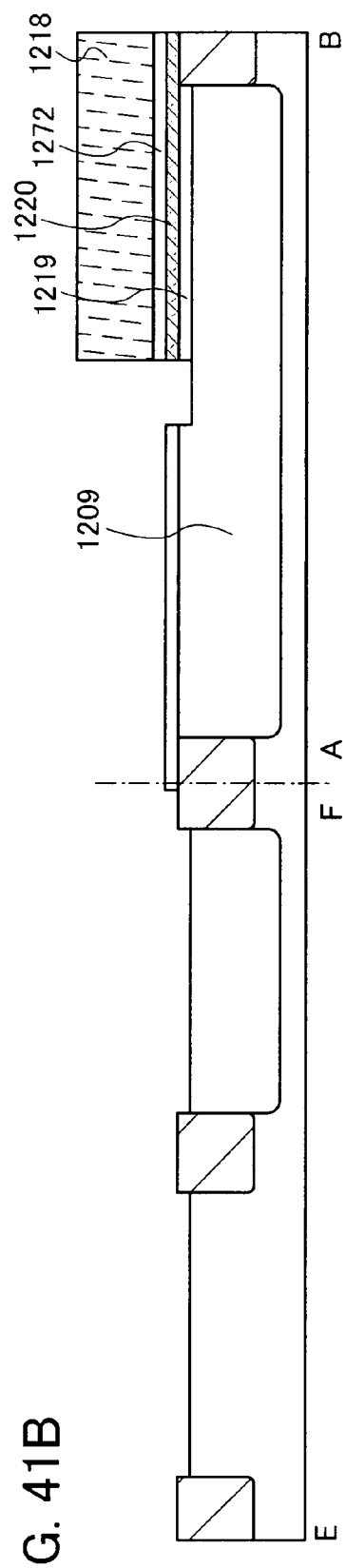
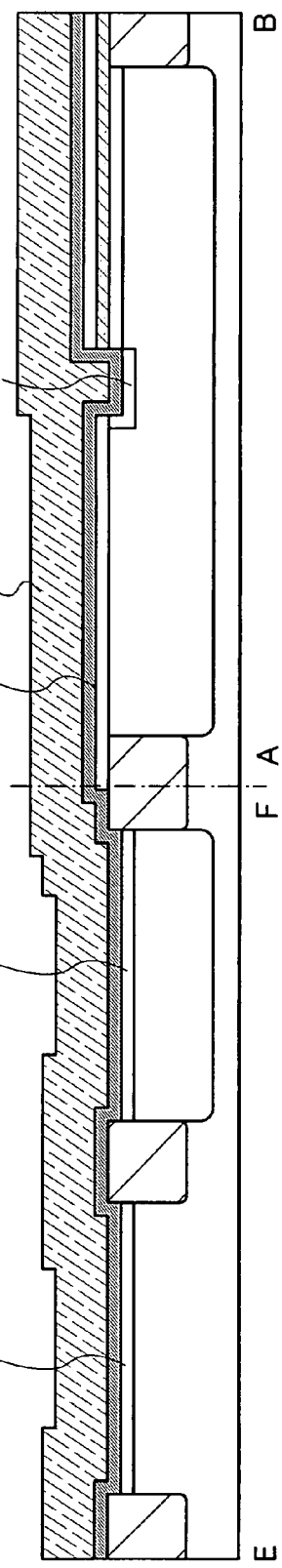

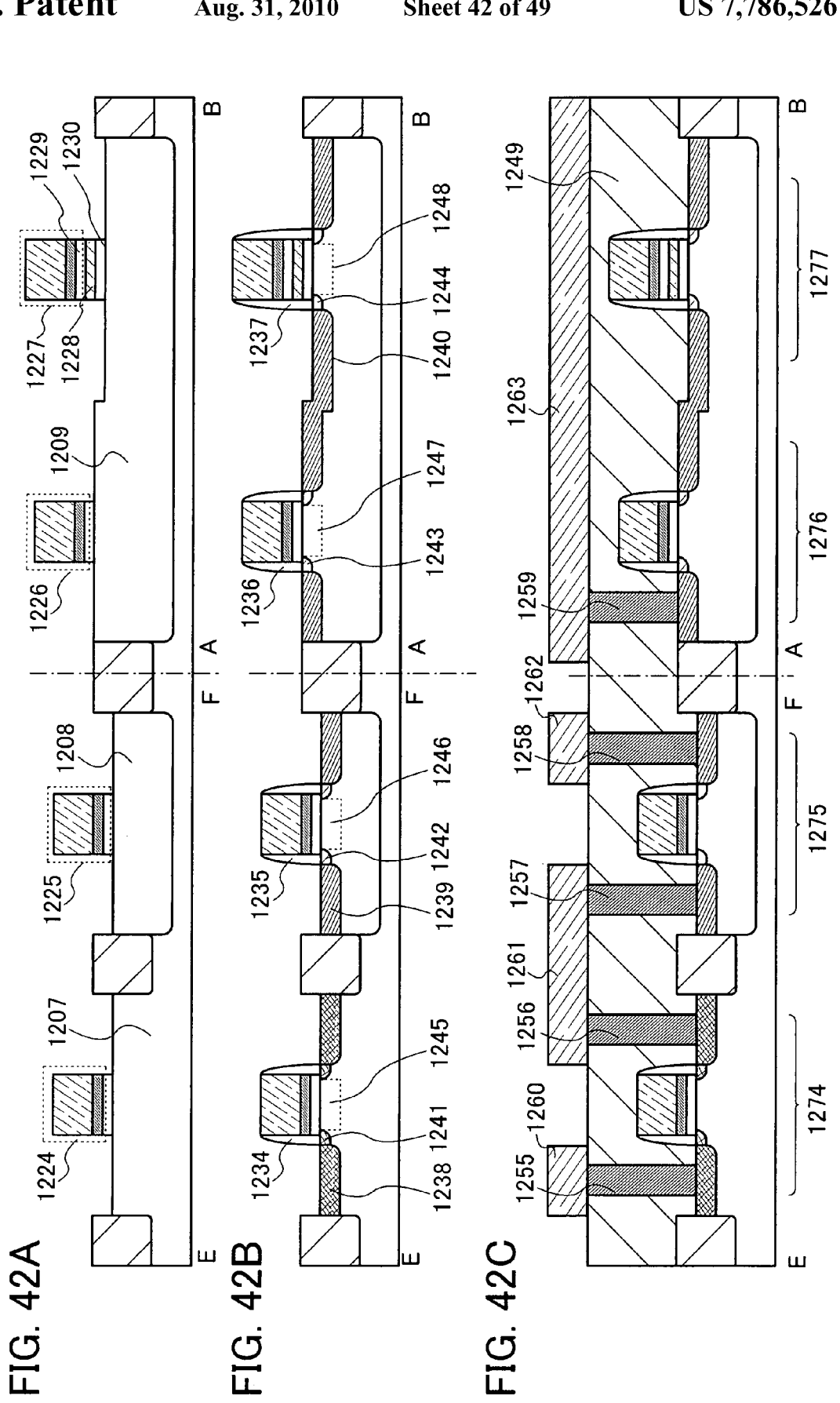

FIG. 47A  Writing
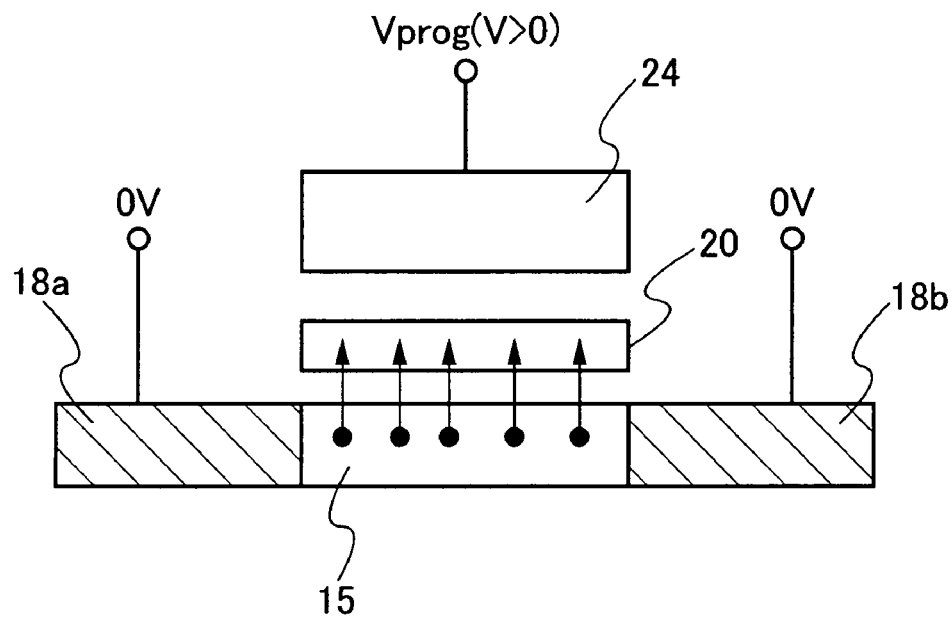
FIG. 47B  Reading
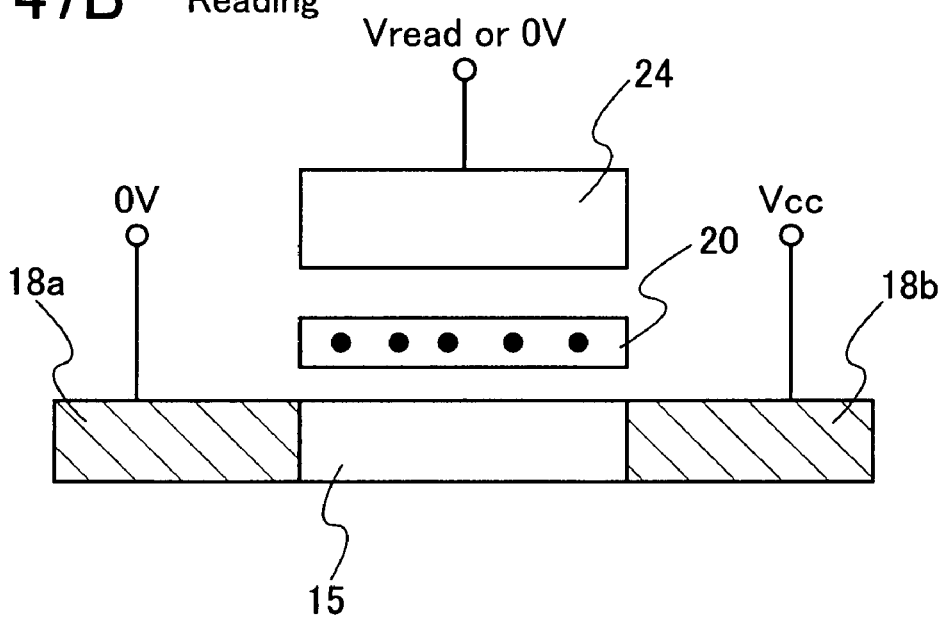

FIG. 48A  Erasing
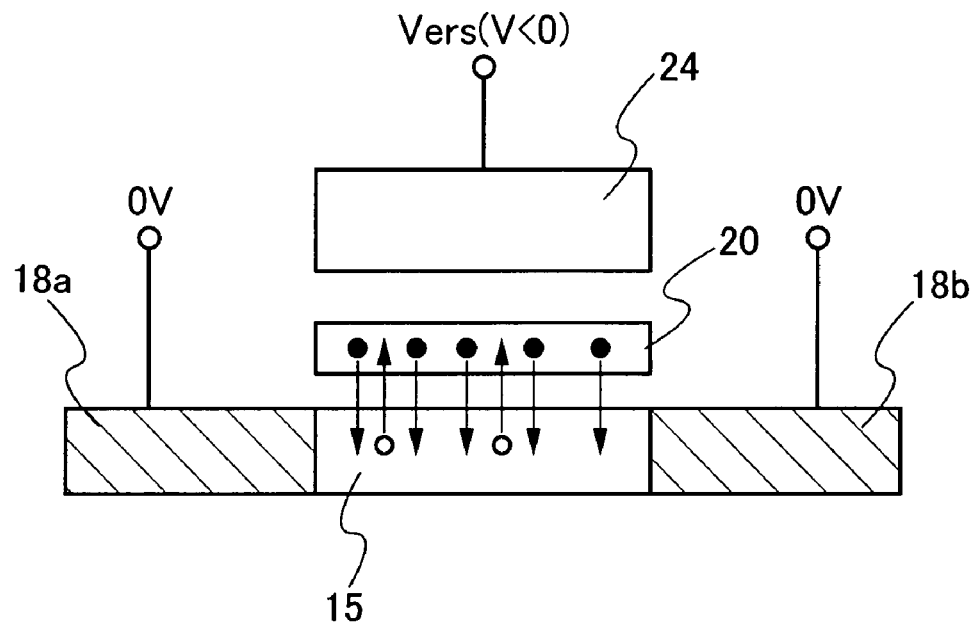
FIG. 48B  Erasing
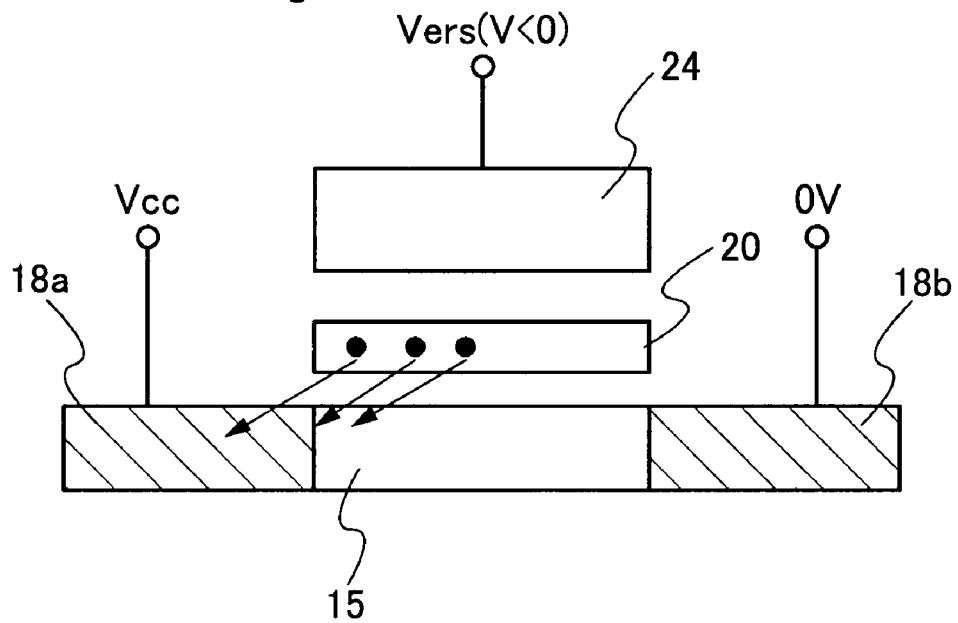

FIG. 49  Erasing
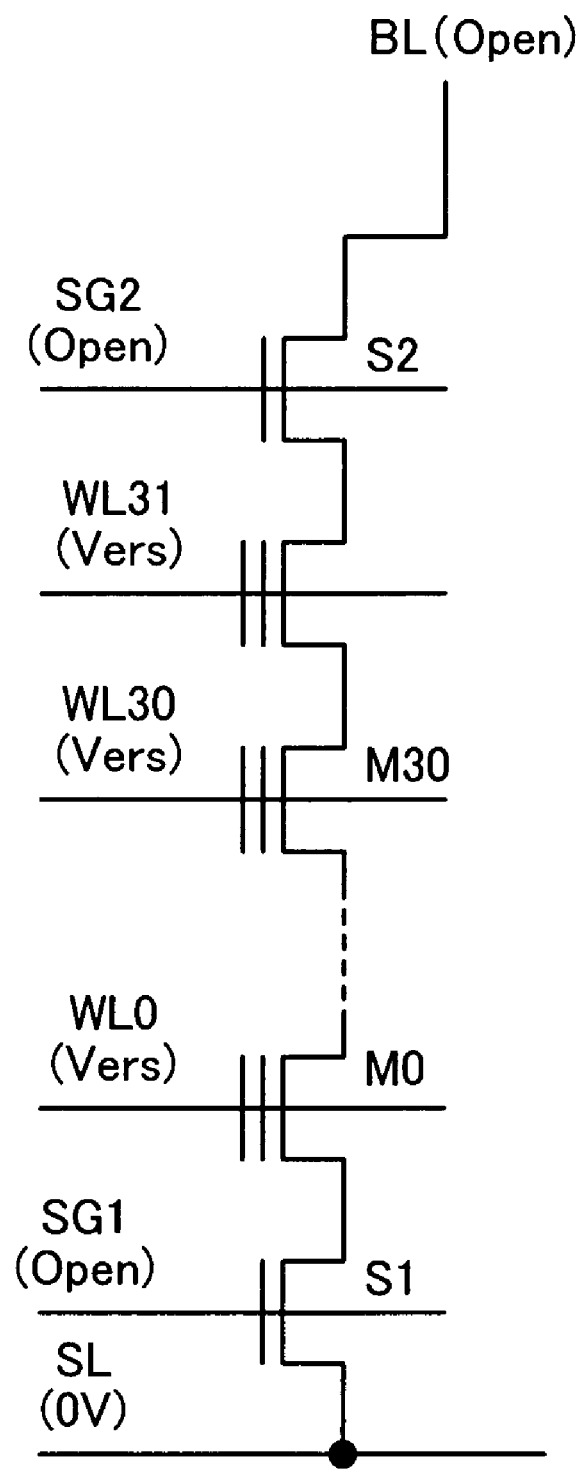

NONVOLATILE SEMICONDUCTOR MEMORY DEVICE

BACKGROUND OF THE INVENTION

1. Field of the Invention

The present invention relates to a nonvolatile semiconductor memory device which is electrically writable, readable, and erasable, and a manufacturing method thereof. More specifically, the present invention relates to the structure of a floating gate in the nonvolatile semiconductor memory device.

2. Description of the Related Art

Nonvolatile memory to which data can be electrically rewritten and stored even with the power turned off has expanded in the marketplace. Features of a nonvolatile memory lie in that its structure is similar to that of a MOSFET (Metal Oxide Semiconductor Field Effect Transistor) and a region capable of accumulating (storing) electric charge for a long period of time is provided over a channel forming region. This electric charge accumulation region is formed over an insulating layer and also referred to as a floating gate due to being insulated from the surrounding area. A control gate is further provided over the floating gate with an insulating layer interposed between the control gate and the floating gate.

Operations in which electric charge is stored in the floating gate and then released by application of a voltage to the control gate are performed in a so-called floating gate type of nonvolatile memory that has such a structure. That is, in the structure, data is stored through transfer of charge into and out of the floating gate. Specifically, injection and release of electric charge to and from the floating gate is performed by application of a high voltage between the semiconductor layer forming the channel formation region and the control gate. At this time, it is said that a Fowler-Nordheim type (F-N type) of tunneling current (NAND type) or thermoelectrons (NOR type) flow in the insulating layer formed over the channel formation region. Because of this, the insulating layer is also called a tunneling insulating layer.

As for a floating-gate type of nonvolatile memory, in order that reliability be guaranteed, a property through which charge can be stored in the floating gate for ten years or more is required. For that purpose, in the tunneling insulating layer, with the tunneling insulating layer being formed at a thickness at which tunneling current can flow, a high insulating property is required so that charge does not leak.

In addition, the floating gate formed over the tunneling insulating layer is formed of silicon, the same semiconductor material of which the semiconductor layer forming the channel formation region is formed. Specifically, a method of forming the floating gate of polycrystalline silicon has expanded; for example, a floating gate formed of a polycrystalline silicon film deposited at a thickness of 400 nm is known (refer to Patent Document 1: Japanese Published Patent Application No. 2000-58685 (Page 7, FIG. 7).

SUMMARY OF THE INVENTION

Since a floating gate and a channel forming region of a nonvolatile memory are formed using the same silicon material, energy levels at the bottom of the conduction band are the same from the aspect of a band model. If the floating gate is formed using polycrystalline silicon and is intended to be formed thinly, the energy level at the bottom of the conduction band becomes higher than that of the semiconductor layer forming the channel forming region. With such a state, electrons are not easily injected from the semiconductor layer which forms the channel forming region to the floating gate; thus, writing voltage is necessarily increased. In order to reduce the writing voltage as much as possible in the nonvolatile memory in which the floating gate is formed using polycrystalline silicon, the floating gate is required to be doped with an n-type impurity such as phosphorus or arsenic so that a Fermi level is shifted to the conduction band side.

A thickness of a gate insulating layer provided between the floating gate and the semiconductor layer is required to be thin so that charge is injected to the floating gate at low voltage. On the other hand, the thickness of the gate insulating layer is required to be thick so that charge is prevented from leaking and charge in the floating gate is thus stably retained for a long period of time.

From this kind of present condition, in traditional nonvolatile memory, a high writing voltage is necessary for writing of information. In addition, with respect to charge retention characteristics and deterioration due to repetition of rewriting of data, a response such as error detection, error correction, or the like is made and reliability is ensured through installation of a redundant memory cell and innovation of a controller.

Thus, it is an object of the present invention to provide a nonvolatile semiconductor memory device which has exceptional writing characteristics and charge retention characteristics. Furthermore, it is another object of the present invention to provide a nonvolatile semiconductor memory device in which writing voltage can be reduced.

The present invention is a nonvolatile semiconductor memory device including a semiconductor layer or semiconductor substrate having a channel formation region interposed between a pair of impurity regions which are formed at a distance from each other; and a first insulating layer, a charge accumulation layer, a second insulating layer, and a control gate that are formed in a location which is a top layer portion of the semiconductor region and which roughly overlaps with the channel formation region. In the present invention, the charge accumulation layer is formed to be a layer that is insulative and in which charge can be trapped.

For the material forming the charge accumulation layer, one or more germanium compounds selected from germanium nitride, germanium oxide, germanium nitride to which oxygen is added, germanium oxide to which nitrogen is added, germanium nitride to which oxygen and hydrogen are added, germanium oxide to which nitrogen and hydrogen are added, and the like can be used.

In addition, the charge accumulation layer can be formed as a layer using one or more of the above germanium compounds which includes particles. It is preferable that the band gap of the particles contained in the charge accumulation layer be smaller than the band gap of the semiconductor layer. It is preferable that, for example, with the difference between the band gap of the particles contained in the charge accumulation layer and the band gap of the semiconductor layer as 0.1 eV or more, the former is smaller.

For a material of the particles contained in the charge accumulation layer, typically, germanium or a germanium compound is preferable. For a germanium compound used as the material forming the particles contained in the charge accumulation layer, there is a silicon-germanium alloy or the like.

In addition, it is preferable that the first insulating layer be formed using solid-phase oxidation or solid-phase nitridation by performing a plasma treatment on the surface of the semiconductor layer or semiconductor substrate. Because the insulating layer formed by this method is dense with high dielectric strength and excellent reliability, the insulating layer formed by this method can be formed thinly, and the insulating layer formed by this method is suitable for use as the first insulating layer, which is a tunneling insulating layer used for injection of charge into the charge accumulation layer.

In the nonvolatile semiconductor memory device of the present invention, it is preferable that a semiconductor layer be formed over the insulating surface into separated island shapes. At the very least, it is preferable that a semiconductor layer forming memory elements and a semiconductor layer forming logic circuits be separated. In other words, the present invention is a nonvolatile semiconductor memory device that includes a semiconductor layer with a channel formation region interposed between a pair of impurity regions which are formed at a distance from each other; a first insulating layer, a charge accumulation layer, a second insulating layer, and a control gate that are formed in a location which is a top layer portion of a semiconductor region and which roughly overlaps with the channel formation region; and the semiconductor layer is formed over an insulating surface.

When a charge accumulation layer is formed over a semiconductor region (either a semiconductor layer or a semiconductor substrate) with a first insulating layer functioning as a tunneling insulating layer interposed between the charge accumulation layer and the semiconductor region, through use of layer formed of a germanium compound that is insulative or a layer with particles containing germanium diffused throughout a layer formed of a germanium compound that is insulative, because there are a number of sites (traps or dots) at which electric charge is stored found in the electric charge storage layer, charge can easily be stored in the charge accumulation layer. In addition, because the charge accumulation layer has an insulating property, even if there are defects in the first insulating layer, leakage of the charge stored in the charge accumulation layer into the semiconductor layer can be reduced. As a result, while the charge retention characteristics in the charge accumulation layer are improved, because the thickness of the first insulating layer can be decreased, data can be written at low voltage and high efficiency.

In addition, through formation of the charge accumulation layer using a material from the same group of the periodic table as silicon, a nonvolatile semiconductor memory device with excellent characteristics can be manufactured with no loss in productivity. Germanium is a material from the same group fourteen of the periodic table as silicon and is a semiconductor, so there is no imposed burden on manufacturing facilities, and thin film microfabrication can be performed.

BRIEF DESCRIPTION OF THE DRAWINGS

FIGS. 6A and 6B are diagrams used to explain writing and reading operations of a nonvolatile memory element.

FIGS. 7A and 7B are diagrams used to explain erasing operations of a nonvolatile memory element.

FIGS. 11A and 11B are diagrams used to explain writing operations of a NAND-type nonvolatile memory.

FIGS. 12A and 12B are diagrams used to explain erasing and reading operations of a NAND-type nonvolatile memory array.

FIGS. 16A to 16C are diagrams used to illustrate an example of a manufacturing method of the nonvolatile semiconductor memory device of the present invention.

FIGS. 18A to 18C are diagrams used to illustrate an example of a manufacturing method of the nonvolatile semiconductor memory device of the present invention.

FIGS. 19A and 19B are diagrams used to illustrate an example of a manufacturing method of the nonvolatile semiconductor memory device of the present invention.

FIGS. 20A to 20C are diagrams used to illustrate an example of a manufacturing method of the nonvolatile semiconductor memory device of the present invention.

FIGS. 21A and 21B are diagrams used to illustrate an example of a manufacturing method of the nonvolatile semiconductor memory device of the present invention.

FIG. 23 is a diagram used to illustrate an example of a top view of a nonvolatile semiconductor memory device of the present invention.

FIGS. 25A to 25C are diagrams used to illustrate an example of a manufacturing method of the nonvolatile semiconductor memory device of the present invention.

FIGS. 26A to 26C are diagrams used to illustrate an example of a manufacturing method of the nonvolatile semiconductor memory device of the present invention.

FIGS. 27A to 27C are diagrams used to illustrate an example of a manufacturing method of the nonvolatile semiconductor memory device of the present invention.

FIGS. 28A to 28C are diagrams used to illustrate an example of a manufacturing method of the nonvolatile semiconductor memory device of the present invention.

FIGS. 29A to 29C are diagrams used to illustrate an example of a manufacturing method of the nonvolatile semiconductor memory device of the present invention.

FIGS. 31A to 31C are diagrams used to illustrate an example of a manufacturing method of the nonvolatile semiconductor memory device of the present invention.

FIGS. 41A to 41C are diagrams used to illustrate an example of a manufacturing method of the nonvolatile semiconductor memory device of the present invention.

FIGS. 42A to 42C are diagrams used to illustrate an example of a manufacturing method of the nonvolatile semiconductor memory device of the present invention.

FIGS. 47A and 47B are diagrams used to explain writing and reading operations of a nonvolatile memory element.

FIGS. 48A and 48B are diagrams used to explain erasing operations of a nonvolatile memory element.

FIG. 49 is a diagram used to explain erasing and reading operations of a NAND-type nonvolatile memory chips.

DETAILED DESCRIPTION OF THE INVENTION

Figure 1A:
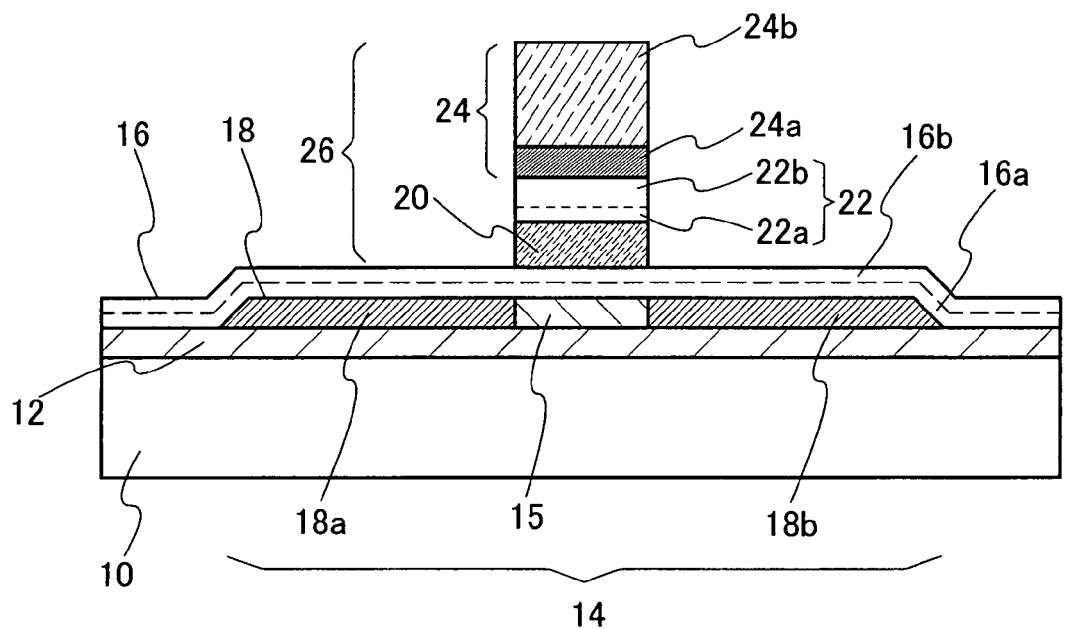
FIGS. 1A and 1B are diagrams of cross-sectional views used to illustrate the main structure of the nonvolatile semiconductor memory device according to the present invention.

Embodiment Modes of the present invention will be explained below with reference to the accompanying drawings. However, it is to be easily understood that various changes and modifications will be apparent to those skilled in the art. Therefore, unless such changes and modifications depart from the scope of the invention, they should be construed as being included therein. Note that identical portions or portions having the same function in all figures used for explaining embodiment modes are denoted by the same reference numerals and detailed descriptions thereof are omitted.

EMBODIMENT MODE 1

Figure 1B:
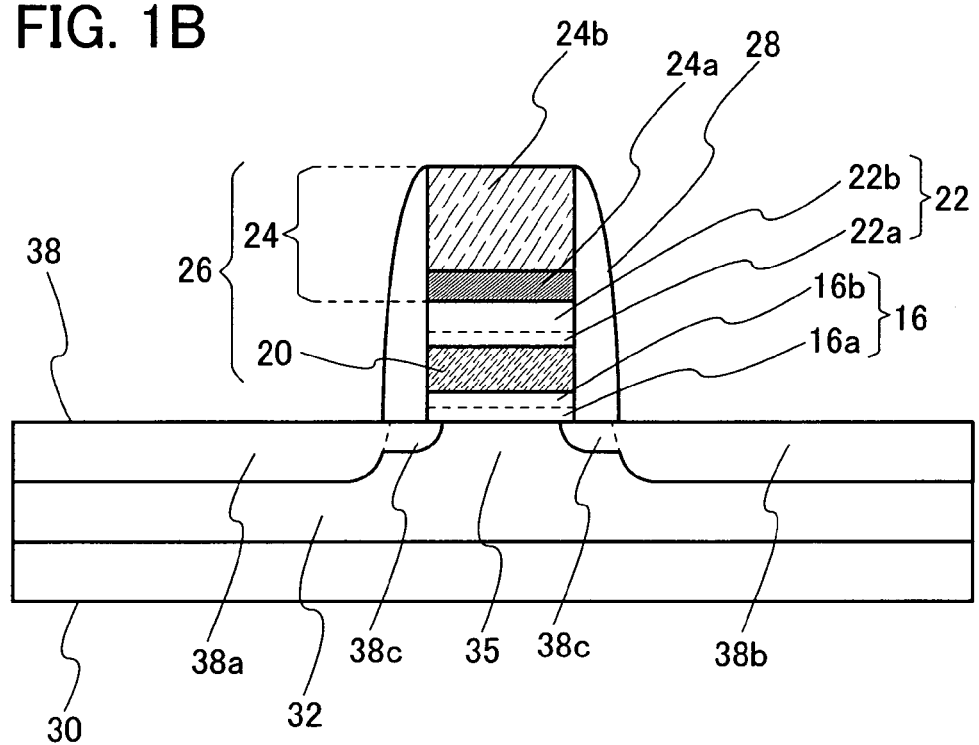

FIGS. 1A and 1B are cross-sectional views used to explain the main structure of a nonvolatile semiconductor memory element according to the present invention. FIG. 1A shows an essential portion of a nonvolatile memory element, in particular. This nonvolatile memory element is manufactured using a substrate 10 that has an insulating surface. For the substrate 10 that has an insulating surface: a glass substrate, a quartz substrate, a sapphire substrate, a ceramic substrate, a metal substrate with an insulating layer formed over the surface thereof, or the like can be used.

A semiconductor layer 14 is formed over the substrate 10 having an insulating surface. An insulating layer 12 that functions as a base film may be formed between the substrate 10 and the semiconductor layer 14. This insulating layer 12 is used to prevent diffusion and contamination by an impurity such as an alkali metal or the like into the semiconductor layer 14 from the substrate 10, and the insulating layer 12 may be formed as a blocking layer, as appropriate.

The insulating layer 12 is formed of an insulating material such as silicon oxide, silicon nitride, silicon containing oxygen and nitrogen (oxynitride silicon), or the like, using a CVD method, a sputtering method, or the like. For example, when the insulating layer 12 is formed as a two-layer structure, a silicon oxynitride layer may be formed as a first insulating layer, and a silicon oxynitride layer with a composition different from the composition of the first layer may be formed as a second insulating layer. Alternatively, a silicon nitride layer may be formed as the first insulating layer, and a silicon oxide layer may be formed as the second insulating layer.

As for the semiconductor layer 14, it is preferable that a layer formed of a single-crystal semiconductor or a polycrystalline semiconductor be used. For example, after a semiconductor layer formed over the entire surface of the substrate 10 by a sputtering method, a plasma CVD method, or a low-pressure CVD method is crystallized, a plurality of semiconductor layers 14 can be formed by selective etching of the crystallized semiconductor layer. In other words, from an object of element separation, it is preferable that a plurality of island-like semiconductor layers be formed on an insulating surface or one or a plurality of nonvolatile memory elements be formed using the semiconductor layers. As for the semiconductor material, silicon is preferable, but a silicon germanium semiconductor can be used in place of silicon for the semiconductor material. As for a crystallization method for a semiconductor film, a laser crystallization method, a crystallization method by heat treatment that uses a rapid thermal anneal (RTA) method or an annealing furnace, a crystallization method that uses a metallic element from the periodic table of elements to promote crystallization, or a combination of one or more of any of these methods can be employed.

In this way, by separation of the semiconductor layer formed over the insulating surface into island shapes, elements can be separated effectively even when a memory element array and a periphery circuit are formed over the same substrate. In other words, even if a memory element array that requires a voltage for writing and erasing operations of approximately 10 V to 20 V and a periphery circuit, mainly used for performing input and output of data and control of commands, that requires a voltage of 3 V to 7 V are formed over the same substrate, mutual interference due to differences in the voltages applied to each element can be prevented.

A p-type impurity may be injected into the semiconductor layer 14. For the p-type impurity, for example, boron may be used and added at a concentration of approximately $5\times10^{15}$ atoms/cm$^3$ to $1\times10^{16}$ atoms/cm$^3$. This p-type impurity is used to control the threshold voltage of a transistor, and by being added to a channel formation region, the p-type impurity functions effectively. The channel forming region is formed in a region which roughly overlaps with a gate 26, which will be described below, and interposed between a pair of impurity regions 18 of the semiconductor layer 14.

The pair of impurity regions 18 are regions that each function as a source region or drain region in a nonvolatile memory element. The pair of impurity regions 18 are formed by doping of phosphorus or arsenic, which are n-type impurities, at a peak concentration of approximately $10^{21}$ atoms/cm$^3$.

A first insulating layer 16, a charge accumulation layer 20, a second insulating layer 22, and a control gate electrode 24 are formed over the semiconductor layer 14 as a stacked layer, and in the present specification, the layered structure from the charge accumulation layer 20 through the control gate electrode 24 is also referred to as a gate 26.

The first insulating layer 16 can function as a tunneling insulating layer in a nonvolatile memory element. The second insulating layer 22 can function as a control insulating layer in a nonvolatile memory element. The first insulating layer 16 is formed of silicon oxide or formed as a multilayer structure of silicon oxide and silicon nitride. The first insulating layer 16 may be formed by deposition of an insulating layer using a plasma CVD method or a low-pressure CVD method, or preferably, the first insulating layer 16 may be formed by solid phase oxidation or solid phase nitridation by plasma treatment. Since the insulating layer is formed by oxidation or nitridation by plasma treatment of the semiconductor layer (typically, a silicon layer), the insulating layer is dense, has high dielectric voltage and excellent reliability. Because the first insulating layer 16 is used as a tunneling insulating layer for injecting charge into the charge accumulation layer 20, it is preferred that the first insulating layer 16 is strong enough that an insulating property can be maintained even when the thickness is reduced. It is preferable that this first insulating layer 16 be formed at a thickness greater than or equal to 1 nm and less than or equal to 10 nm; more preferably, the first insulating layer 16 is formed at a thickness greater than or equal to 1 nm and less than or equal to 5 nm. For example, when gate length is set to be 600 nm, the first insulating layer 16 can be formed at a thickness greater than or equal to 1 nm and less than or equal to 3 nm.

It is preferable that plasma that has an electron density of greater than or equal to $1\times10^{11}$ cm$^{-3}$ and less than or equal to $1\times10^{13}$ cm$^{-3}$ and an electron temperature of greater than or equal to 0.5 eV and less than or equal to 1.5 eV and that has been excited by a microwave (typically, a microwave with a frequency of 2.45 GHz) be used for the solid phase oxidation or solid phase nitridation by plasma treatment. The solid phase oxidation or solid phase nitridation is performed at a temperature of less than or equal to 500° C. so that a dense insulating layer is formed and an applicable response speed is obtained.

When the surface of the semiconductor layer 14 is oxidized by plasma treatment, plasma treatment is performed under an oxygen atmosphere (for example, under an atmosphere of either oxygen ($O_2$) or nitrous oxide ($N_2O$) and a noble gas (containing at least one of He, Ne, Ar, Kr, and Xe); or under an atmosphere of either oxygen or nitrous oxide and hydrogen ($H_2$) and a noble gas). When the surface of the semiconductor layer 14 is nitrided by plasma treatment, plasma treatment is performed under a nitrogen atmosphere (for example, under an atmosphere of nitrogen ($N_2$) and a noble gas (containing at least one of He, Ne, Ar, Kr, and Xe); under an atmosphere of nitrogen, hydrogen, and a noble gas; or under an atmosphere of $NH_3$ and a noble gas). As for the noble gas, argon, for example, can be used. Alternatively, a gas mixture of Ar and Kr may be used.

Figure 15:
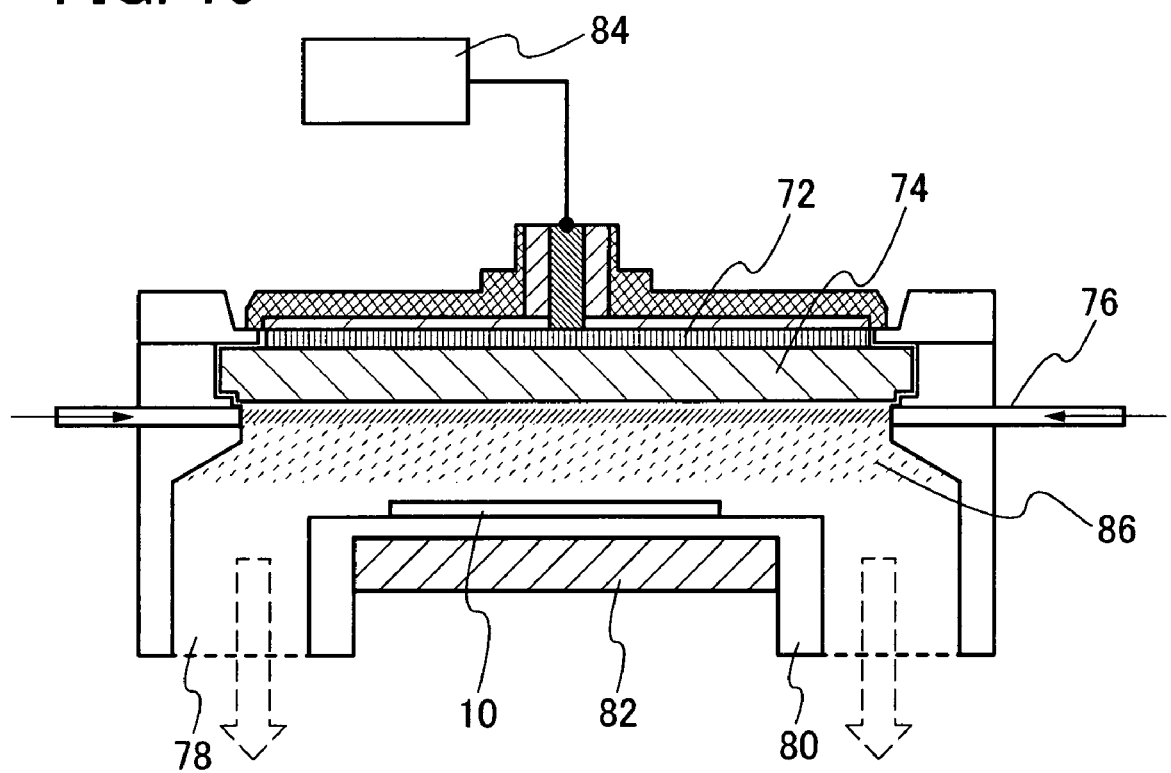
FIG. 15 is a diagram used to explain a structure of a plasma treatment apparatus.

FIG. 15 illustrates an example of a structure of a device used for performing plasma treatment. This plasma treatment device includes a support stand 80 used for positioning the substrate 10; a gas supply 76 used for introducing gas into the device; an exhaust opening 78, which is connected to a vacuum pump, used for evacuating gas from the device; an antenna 72; a dielectric plate 74; and a microwave supply 84 used for supplying microwaves that are used to generate a plasma. Furthermore, by having a temperature control 82 provided in the support stand 80, the temperature of the substrate 10 can be controlled.

Hereinafter, plasma treatment will be explained. It is to be noted that plasma treatment includes oxidation, nitridation, oxynitridation, hydrogenation, and surface modification treatment on a semiconductor substrate, insulating layer, and conductive layer. For each treatment, a gas supplied from the gas supply 76 may be selected depending on the objective of the treatment.

Oxidation or nitridation may be performed as will be hereinafter described. First, a treatment chamber is drawn down to vacuum, and a gas used for plasma treatment that contains oxygen or nitrogen is introduced into the treatment chamber from the gas supply 76. The substrate 10 is heated to room temperature or to a temperature of from 100° C. to 550° C. by use of the temperature control 82. It is to be noted that the distance between the substrate 10 and the dielectric plate 74 is in the range of 20 nm to 80 nm (preferably, the distance is in the range of 20 nm to 60 nm). Next, microwaves are supplied to the antenna 72 from the microwave supply 84, and a plasma 86 is generated by introduction of microwaves from the antenna 72 into the treatment chamber through the dielectric plate 74. Through excitation of the plasma by introduction of microwaves, a plasma with a low electron temperature (less than or equal to 3 eV; preferably, less than or equal to 1.5 eV) and a high electron concentration (greater than or equal to $1\times10^{11}$ cm$^{-3}$) can be generated. The surface of the semiconductor substrate can be oxidized or nitrided using oxygen radicals (which may include OH radicals), nitrogen radicals (which may include NH radicals), or both oxygen radicals and nitrogen radicals that have been generated by the high density plasma. If a noble gas such as argon or the like is mixed in with the gas used for plasma treatment, the oxygen radicals or nitrogen radicals can be generated rather efficiently through use of an excited species of the noble gas. With this method, the activated radicals that have been excited by the plasma are used effectively, whereby oxidization and nitridation can be performed by a solid phase reaction at a low temperature of less than or equal to 500° C.

An example of a preferred first insulating layer 16 formed by plasma treatment is shown in FIGS. 1A and 1B. A silicon oxide layer is formed over the surface of the semiconductor layer 14 at a thickness greater than or equal to 3 nm and less than or equal to 6 nm by plasma treatment under an oxidizing atmosphere, and then, a nitrogen plasma-treated layer treated by nitrided plasma is formed over the surface of the silicon oxide layer under a nitrogen atmosphere. Specifically, first, a silicon oxide layer is formed over the semiconductor layer 14 at a thickness greater than or equal to 3 nm and less than or equal to 6 nm by plasma treatment under an oxygen atmosphere. Then, continuously, under a nitrogen atmosphere, plasma treatment is performed, whereby a nitrogen plasma-treated layer is formed in the interface between the silicon oxide layer and the charge accumulation layer or formed near the surface of the silicon oxide layer. It is to be noted that "near the surface" of the silicon oxide layer refers to a depth of, approximately, greater than or equal to 0.5 nm and less than or equal to 1.5 nm from the surface of the silicon oxide layer. For example, through performance of plasma treatment under a nitrogen atmosphere, a structure is obtained in which nitrogen at a rate of 20 to 50 atom percent is contained at a depth of approximately 1 nm from the surface of the silicon oxide layer 16a.

A dense oxidized layer without formation of any distortion in the interface can be formed through oxidization by plasma treatment of the surface of a silicon layer, which is a typical example of the semiconductor layer 14. In addition, through nitridation by plasma treatment of the oxide layer, oxygen on a portion of a surface is substituted for by nitrogen and a nitrogen layer is formed, whereby the layer can be made even denser. Through these steps, an insulating layer with a high dielectric strength can be formed, and the insulating layer can be formed more thinly. In addition, with nitridation by plasma treatment, there are advantages in that Hall conductivity increases in a nonvolatile memory element and erasing of the nonvolatile memory element becomes easier.

In any event, through use of the aforementioned solid phase oxidation or solid phase nitridation, even if a glass substrate with a heat resistance temperature of less than or equal to 700° C. is used, an insulating layer equal to a thermal oxidation film that is formed at a temperature of from 950° C. to 1050° C. can be obtained. In other words, a tunneling insulating layer with high reliability can be formed as the tunneling insulating layer of a nonvolatile memory element.

A charge accumulation layer 20 is formed over the first insulating layer 16. It is preferable that the charge accumulation layer 20 has insulating properties and be a layer that has traps for retaining charge. As a typical example of this kind of material, a germanium compound is given. A germanium compound can be selected from germanium nitride, germanium oxide, germanium nitride to which oxygen has been added, germanium oxide to which nitrogen has been added, germanium nitride to which oxygen and hydrogen have been added, germanium oxide to which nitrogen and hydrogen have been added, and the like. In addition, the charge accumulation layer 20 may contain germanium particles or silicon-germanium particles.

As for the germanium particles or silicon-germanium particles contained in the charge accumulation layer 20, the barrier energy for electrons of the charge accumulation layer 20 formed by the first insulating layer 16 becomes higher than the barrier energy for electrons of the semiconductor layer 14 formed by the first insulating layer 16. For this reason, charge (electrons) is easily injected into the charge accumulation layer 20 from the semiconductor layer 14, and leakage of charge from the charge accumulation layer 20 can be prevented.

It is to be noted that, for the silicon-germanium particles contained in the charge accumulation layer 20, it is preferable that the amount of germanium particles contained with respect to the amount of silicon particles contained be 10 at. % or more. If the concentration of the germanium is 10 at. % or more, the effects caused by a constituent element are reduced, which is because the band gap effectively does not become small.

When a germanium compound such as germanium nitride, germanium oxide, germanium nitride to which oxygen is added, germanium oxide to which nitrogen is added, germanium nitride to which oxygen and hydrogen are added, germanium oxide to which nitrogen and hydrogen are added, and the like is used for the charge accumulation layer, a charge accumulation layer can be formed by performing a plasma CVD method under an atmosphere containing elemental germanium (for example, an atmosphere containing $GeH_4$ and $N_2$, $GeH_4$ and $NH_3$, $GeH_4$ and $N_2O$, or the like). In addition, a charge accumulation layer using germanium nitride can be formed by deposition of a sintered body after germanium oxide has been heated in an ammonia atmosphere. Furthermore, germanium particles and silicon-germanium particles can be formed through performance of a plasma CVD method in an atmosphere that contains $GeH_4$ and $H_2$; $GeH_4$, $SiH_4$, and $H_2$; or the like.

The second insulating layer 22 is formed as a single layer or as a plurality of layers by a low-pressure CVD method, a plasma CVD method, or the like, using silicon oxide, silicon nitride, silicon oxynitride, aluminum oxide, or the like. The second insulating layer 22 is formed at a thickness greater than or equal to 1 nm and less than or equal to 20 nm; preferably, the second insulating layer 22 is formed at a thickness of from greater than or equal to 5 nm and less than or equal to 10 nm. For example, the second insulating layer 22 can be formed in the following manner: a silicon nitride layer 22a is deposited at a thickness of 3 nm, and a silicon dioxide layer 22b is deposited at a thickness of 5 nm.

It is preferable that the control gate electrode 24 be formed of a metal such as tantalum (Ta), tungsten (W), titanium (Ti), molybdenum (Mo), chromium (Cr), niobium (Nb), or the like or formed of an alloy material or compound material with one or more of these elements as the main component or components. Alternatively, the control gate electrode 24 can be formed using polycrystalline silicon to which an impurity element such as phosphorus (P) or the like is added. In addition, the control gate electrode 24 may be formed as a stacked structure which includes: a single layer or a plurality of layers of a metal nitride layer 24a and at least one of the aforementioned metal layers 24b. For the metal nitride, tungsten nitride, molybdenum nitride, or titanium nitride can be used. By providing the metal nitride layer 24a, adhesiveness of the metal layer 24b can be improved, and detachment can be prevented. In addition, because the work function of a metal nitride such as tantalum nitride or the like is high, the thickness of the first insulating layer 16 can be increased due to the multiplier effect of the second insulating layer 22.

In addition, as shown in FIG. 1B, a nonvolatile memory element may be manufactured using a semiconductor substrate 30. It is preferable that a single-crystal silicon substrate (a silicon wafer) be used for the semiconductor substrate 30. Alternatively, an SOI (Si-On-Insulator) substrate can be used. As the SOI substrate, a so-called SIMOX (Separation by IMplanted OXygen) substrate having no defects in a surface layer together with an oxide layer formed at a fixed depth from a surface, formed by performing high-temperature annealing after injection of oxygen ions into a mirror-polished wafer, can also be used.

When the semiconductor substrate 30 is an n-type semiconductor substrate, a p-well 32 into which a p-type impurity is injected is formed. For the p-type impurity, for example, boron is used and added at a concentration of from approximately $5\times10^{15}$ cm$^{-3}$ to $1\times10^{16}$ cm$^{-3}$. With the p-well 32 being formed, an n-channel transistor can be formed in this region. In addition, the p-type impurity added to the p-well 32 has a function of controlling the threshold voltage of the transistor.

A channel formation region 35 formed in the semiconductor substrate 30, in a region that roughly corresponds to a gate 26 (described below), is placed between a pair of impurity regions 38 formed in the semiconductor substrate 30.

The pair of impurity regions 38 each function as a source or drain region in a nonvolatile memory element. The pair of impurity regions 38 are formed with phosphorus or arsenic, which are n-type impurities, added at a peak concentration of approximately $10^{21}$ cm$^{-3}$.

Spacers 28 are formed on the sidewalls of the gate 26, and an effect is obtained in that leak current (for example, current that flows between the charge accumulation layer 20 and the control gate electrode 24) in the edges of the spacers 28 is prevented. In addition, through use of these spacers 2S, low concentration impurity regions 38c can be formed at opposite ends of the gate 26 in the channel length direction. These low concentration impurity regions 38c function as lightly doped drains (LDD). Although these lightly doped impurity regions are not necessarily required structures, by having these regions formed, the electric field in a drain terminal is moderated, and deterioration due to the repetition of writing and erasing operations can be controlled.

Similar to the way in which the nonvolatile memory element shown in FIG. 1A is formed, a first insulating layer 16, a charge accumulation region 20, a second insulating layer 22, and a control gate electrode 24 are formed over the semiconductor substrate 30. It is to be noted that the first insulating layer 16 may be formed through oxidization of the surface of the semiconductor substrate 30 by thermal oxidation.

It is to be noted that, in FIGS. 1A and 1B, a mode is shown in which the width of the charge accumulation layer 20 and the width of the control gate electrode 24 are equal; however, in addition to this mode, a mode in which the width of the charge accumulation layer 20 is larger than the width of the control gate electrode 24 or a mode in which the width of the charge accumulation layer 20 is smaller than the width of the control gate electrode 24 can also be used.

An operation mechanism of the nonvolatile memory element shown in FIGS. 1A and 1B will be explained with reference to a band diagram. In the band diagram that will be described below, components that are the same as those shown in FIGS. 1A and 1B will be designated by the same reference numerals. Here, the operation mechanism is explained using a nonvolatile memory element that has a thin film semiconductor layer like the one shown in FIG. 1A; however, the band diagram can be applied to a nonvolatile memory element that uses a single-crystal semiconductor substrate like the one shown in FIG. 1B, as well. In addition, a layer containing germanium particles or silicon-germanium particles that is used for the charge accumulation layer 20 will be described below. In the following description, a charge accumulation layer 20 that contains germanium particles will be explained.

Figure 2:
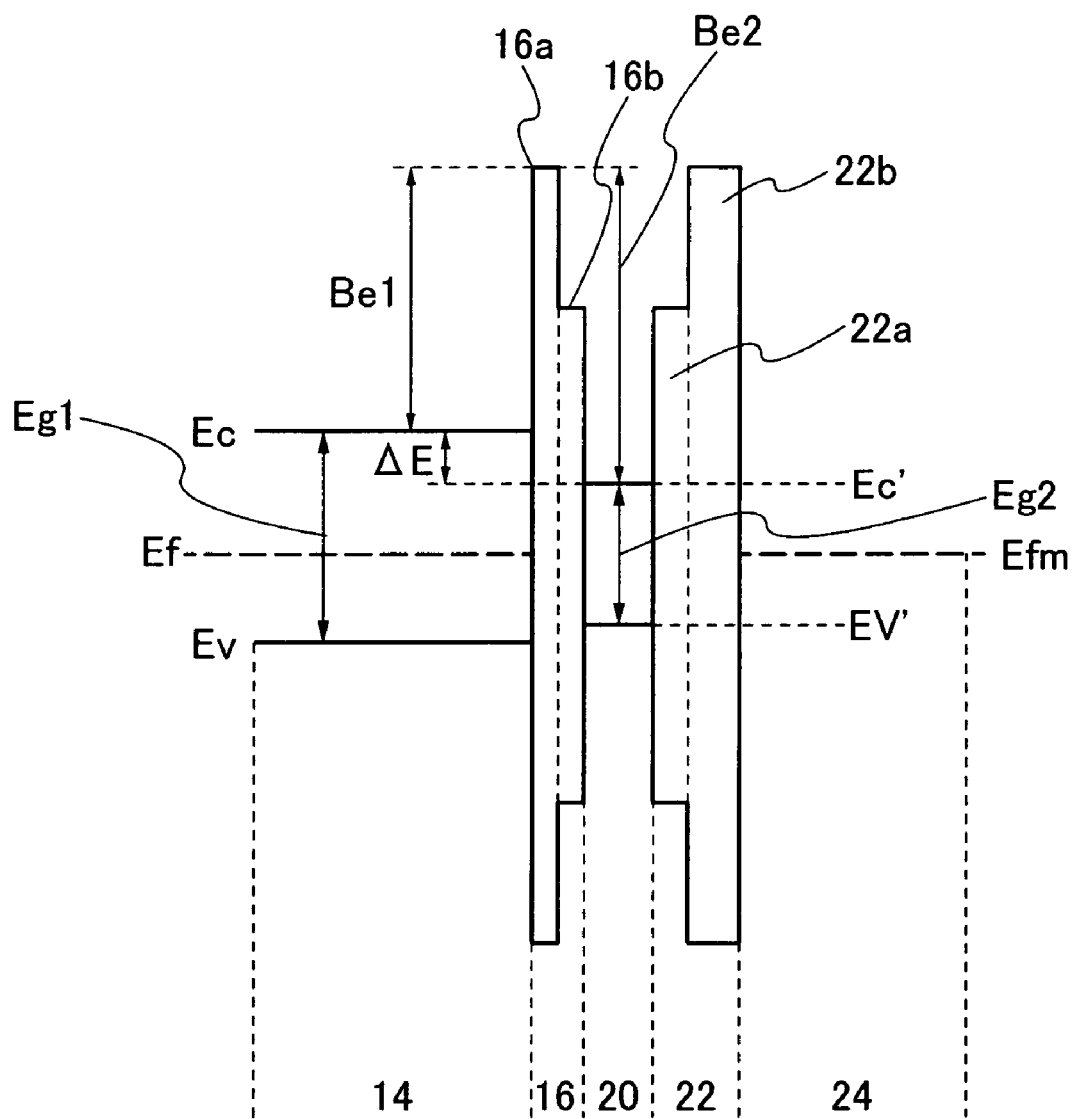
FIG. 2 is a band diagram for a nonvolatile memory element in an initial state (charge emission state).

In FIG. 2, a state is shown in which a semiconductor layer 14, a first insulating layer 16, a charge accumulation layer 20, a second insulating layer 22, and a control gate electrode 24 are stacked together. FIG. 2 shows the case in which no voltage is applied to the control gate electrode 24 and the Fermi level Ef of the semiconductor layer 14 is equal to the Fermi level Efm of the control gate electrode 24.

The semiconductor layer 14 and the charge accumulation layer 20 are formed using different materials with the first insulating layer 16 formed therebetween. The band gap Eg1 of the semiconductor layer 14 and the band gap Eg2 of the charge accumulation layer 20 are made to differ from each other, and the semiconductor layer 14 and the charge accumulation layer 20 are combined so that the band gap of the latter is smaller. For example, the two can be combined such that silicon (1.12 eV) is used for the semiconductor layer 14 and germanium (0.72 eV) or silicon-germanium (from 0.73 to 1.0 eV) is used for the charge accumulation layer 20. The germanium or silicon-germanium may be hydrogenated. The content of hydrogen with respect to germanium or silicon-germanium may range from 1 at. % through 30 at. %. By formation of a first floating gate electrode layer 20a using germanium that contains hydrogen, recombination centers found in an interface of the first insulating layer 16 can be reduced.

It is to be noted that the first insulating layer 16 is shown as a silicon oxide layer 16a (approximately 8 eV) and a nitrogen plasma-treated layer 16b (approximately 5 eV) formed through nitridation of the silicon oxide by plasma treatment. In addition, the second insulating layer 22 is shown as a silicon nitride layer 22a and a silicon oxide layer 22b stacked from a side of the charge accumulation layer 20.

The semiconductor layer 14 and the charge accumulation layer 20 are formed using different materials with the first insulating layer 16 interposed therebetween. In this case, the band gap of the semiconductor layer 14 and the band gap of the charge accumulation layer 20 are different from each other, and the semiconductor layer 14 and the charge accumulation layer 20 are combined so that the band gap of the latter is smaller. For example, silicon (1.12 eV) can be used for the semiconductor layer 14 and germanium (0.72 eV) or silicon-germanium (from 0.73 to 1.1 eV) can be used for the charge accumulation layer 20. In other words, the relationship of the band gap Eg1 of the silicon used for the semiconductor layer 14 to the band gap Eg2 of the germanium used for the charge accumulation layer 20 is such that Eg1>Eg2 is fulfilled. For each of the semiconductor layer 14 and the charge accumulation layer 20, as for an energy barrier for electrons by the first insulating layer 16, a first barrier Be1 and a second barrier Be2, become different values such that the relationship Be2>Be1 can be satisfied. In this kind of state, a difference in energy ΔE between the energy level at the bottom of the conduction band for the semiconductor layer 14 and the energy level at the bottom of the conduction band for the charge accumulation layer 20 is generated. As will be explained below, this difference in energy ΔE makes a contribution in lowering the writing voltage because the difference in energy ΔE functions in a direction of acceleration of an electron when an electron is injected into the charge accumulation layer 20 from the semiconductor layer 14.

Incidentally, for injecting electrons into the charge accumulation layer 20, there is a method using thermoelectrons (hot electrons) and a method using F-N tunneling current. When thermoelectrons are used, a positive voltage is applied to the control gate electrode 24 and a high voltage is applied to a drain, whereby thermoelectrons are generated. Because of this, thermoelectrons can be injected into the charge accumulation layer 20. When F-N tunneling current is used, a positive voltage is applied to the control gate electrode 24 and an F-N tunneling current flows from the semiconductor layer 14, whereby electrons are injected into the charge accumulation layer 20.

FIG. 47A shows a voltage applied when electrons are injected into the charge accumulation layer by F-N tunneling current. Furthermore, FIG. 6A shows an example in which a nonvolatile memory element is formed using a semiconductor substrate 30 instead of the semiconductor layer 14, as shown in FIG. 1B. While a high voltage of positive polarity (from 10 to 20 V) is applied to the control gate electrode 24, the voltages of a source region 18a and drain region 18b are set to be 0 V. At this time, the band diagram becomes one like the band diagram shown in FIG. 3. Due to the high electric field, electrons are injected into the first insulating layer 16 from the semiconductor layer 14, and an F-N tunneling current flows. As illustrated in FIG. 2, the relationship between the band gap Eg1 of the semiconductor layer 14 and the band gap Eg2 of the charge accumulation layer 20 is such that Eg1>Eg2. This difference in band gaps operates as a self-bias to accelerate electrons injected into the charge accumulation layer 20 from the channel formation region of the semiconductor layer 14. Because of this, electron injection characteristics can be improved.

The energy level at the bottom of the conduction band of the charge accumulation layer 20 is an electron energy level lower by only ΔE relative to the energy level at the bottom of the conduction band of the semiconductor layer 14. For this reason, an internal interface caused by this difference in energy is used for injecting electrons into the charge accumulation layer 20. This can be achieved through combination of the semiconductor layer 14 and the charge accumulation layer 20 as described above. In other words, it becomes easier to inject electrons from the semiconductor layer 14 into the charge accumulation layer 20, and writing characteristics in a nonvolatile memory element can be improved. This operation is similar to the one in which thermoelectrons are used to inject electrons into the charge accumulation layer 20.

It is to be noted that, when the charge accumulation layer 20 is formed only of a layer using a germanium compound, electrons injected from the semiconductor layer 14 are captured in a trap in the germanium compound layer in an interface or near the interface of the first insulating layer 16 and charge accumulation layer 20.

Figure 4:
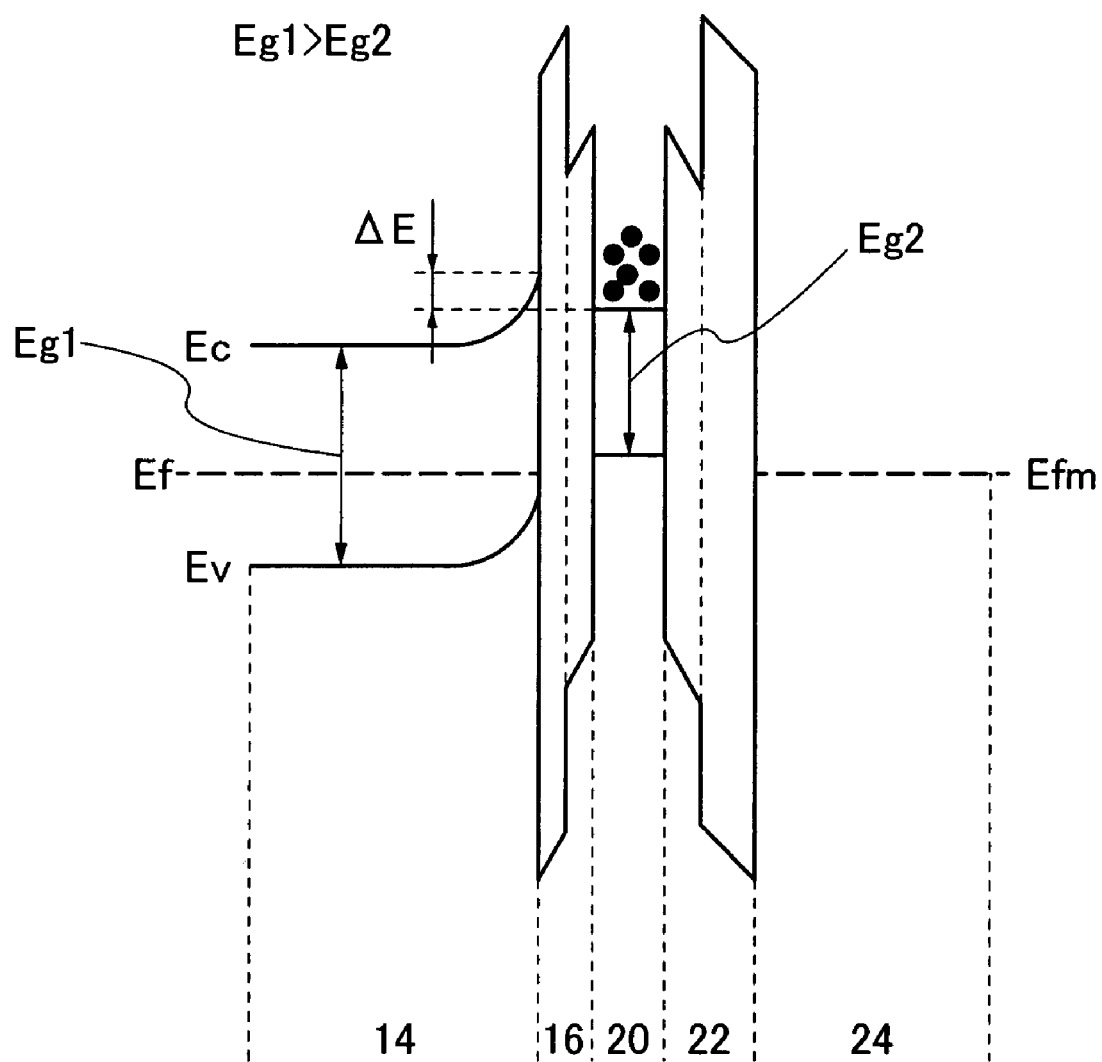
FIG. 4 is a band diagram for a nonvolatile memory element during a charge retention state.

During the time that electrons are retained in the charge accumulation layer 20, the threshold voltage of the nonvolatile memory element shifts in the positive direction. This state can be set to be a state in which data of "0" is written. FIG. 4 shows a band diagram for a charge retention state. The electrons in the charge accumulation layer 20 are sandwiched by the first insulating layer 16 and the second insulating layer 22, whereby the electrons are placed in a state of being confined. Although a potential rises with storage of carriers (electrons) in the charge accumulation layer 20, the electrons will not be discharged from the charge accumulation layer 20 unless an amount of energy greater than the barrier energy is given to the electrons. In this case, electrons will not be discharged from the charge accumulation layer 20 unless an amount of energy greater than the barrier energy is given to the electrons. Furthermore, the energy level at the bottom of the conduction band of the charge accumulation layer 20 is an electron energy level lower by only ΔE relative to the energy level at the bottom of the conduction band of the semiconductor layer 14, and an energy barrier is formed against the electrons. Electrons can be prevented from flowing by tunneling current to the semiconductor layer 14 by the barrier. In other words, even if the semiconductor layer 14 is kept at a constant temperature of 150° C., carriers stored in the charge accumulation layer 20 can be retained.

As for the detection of this data of "0," when the charge accumulation layer 20 is in a state where no charge is being retained and a gate voltage is applied to turn the nonvolatile memory element on, a sensing circuit can be used to detect that a transistor is not turned on. Furthermore, as shown in FIG. 47B or FIG. 6B, when a bias is applied between the source region 18a and drain region 18b and the voltage of the control gate electrode 24 is set to be 0 V, whether the nonvolatile memory element is turned on or not can be determined.

FIG. 48A shows a state in which charge is released from the charge accumulation layer 20 and data is erased from the nonvolatile memory element. In this case, this is performed through a bias of negative polarity being applied to the control gate electrode 24 and an F-N tunneling current flowing between the semiconductor layer 14 and the charge accumulation layer 20. Alternatively, as shown in FIG. 48B, through a bias of negative polarity being applied to the control gate electrode 24 and a high voltage of positive polarity being applied to the source region 18a, an F-N tunneling current is generated, and electrons may be discharged from the source region 18a side.

It is to be noted that when the nonvolatile memory element is formed using a semiconductor substrate shown in FIG. 1B in place of the semiconductor layer 14, as shown in FIGS. 7A and 7B, erasing is performed by grounding of the control gate electrode 24 and application a bias of negative polarity to a p-well 32 of the semiconductor substrate 30 so that an F-N tunneling current flows between the channel formation region of the semiconductor substrate 30 and the charge accumulation layer 20. Alternatively, as shown in FIG. 7B, through a bias of negative polarity being applied to the control gate electrode 24 and a high voltage of positive polarity being applied to the source region 38a, an F-N tunneling current may be generated, and electrons may be extracted from the source region 38a side.

Figure 5:
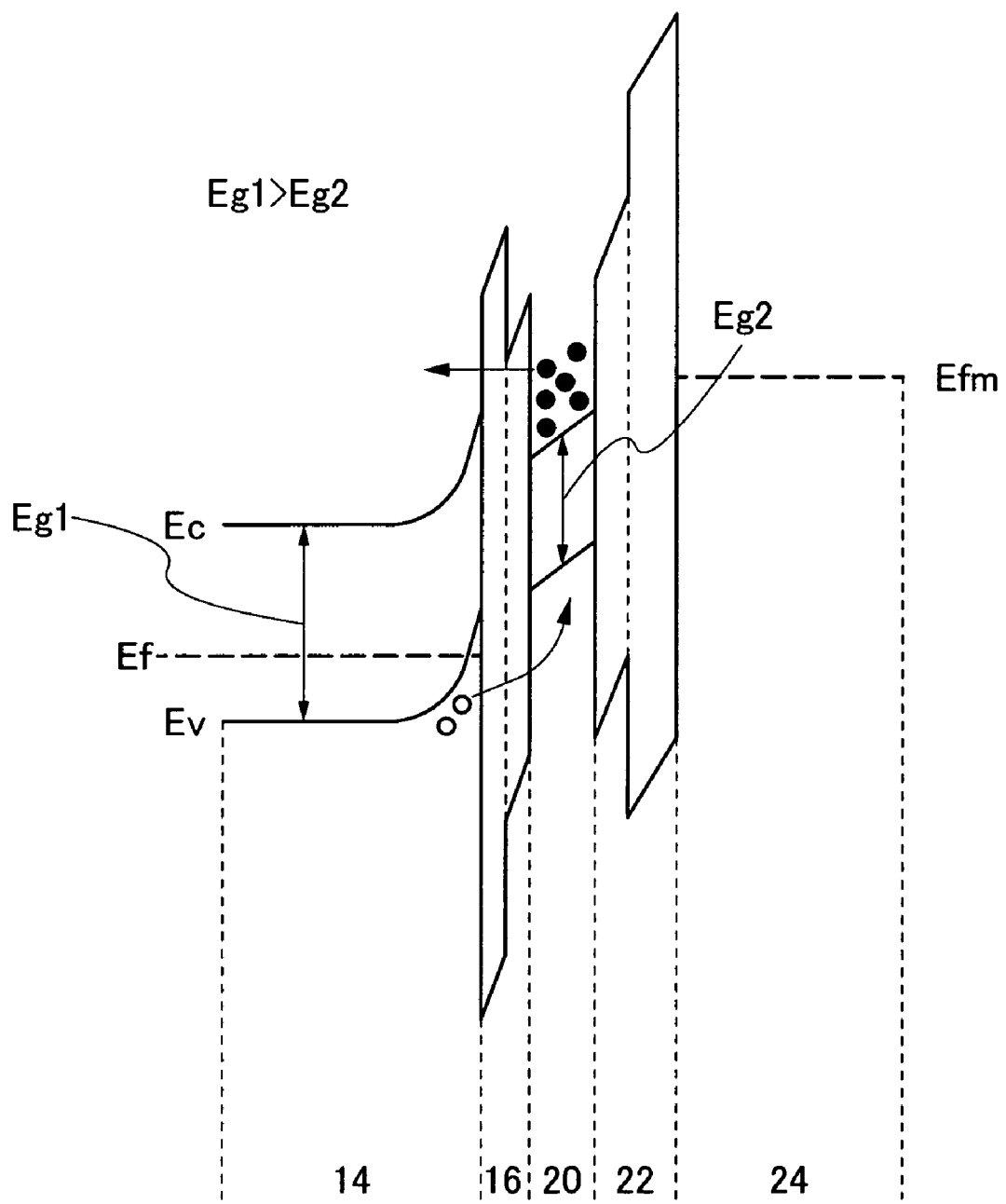
FIG. 5 is a band diagram for a nonvolatile memory element during an erasing state.

FIG. 5 shows a band diagram for this erasing state. During the erasing operation, the first insulating layer 16 can be formed thinly, and electrons from the charge accumulation layer 20 can be discharged into the semiconductor layer 14 side through an F-N tunneling current. In addition, it becomes easier to inject holes from the channel formation region of the semiconductor layer 14, and, by injection of holes into the charge accumulation layer 20, a substantial erasing operation can be performed.

It is to be noted that, when the charge accumulation layer 20 is formed of only a layer that was formed using a germanium compound, holes are injected into the first insulating layer 16 from the semiconductor layer 14 and captured by traps in the charge accumulation layer 20. As a result, electrons captured by the traps during writing are neutralized, whereby the threshold voltage can be shifted in the negative polarity direction and erasing can be done.

Through formation of the charge accumulation layer 20 as a layer containing germanium particles in a germanium compound or germanium compound layer that is insulative, the thickness of the first insulating layer 16 can be decreased. Accordingly, it becomes easier to inject electrons into the charge accumulation layer 20 through the first insulating layer 16 by tunneling current, and operation at low voltage becomes possible. Furthermore, charge can be stored at a low energy level and stored in a stable state, two significant effects that prove to be successful.

Figure 3:
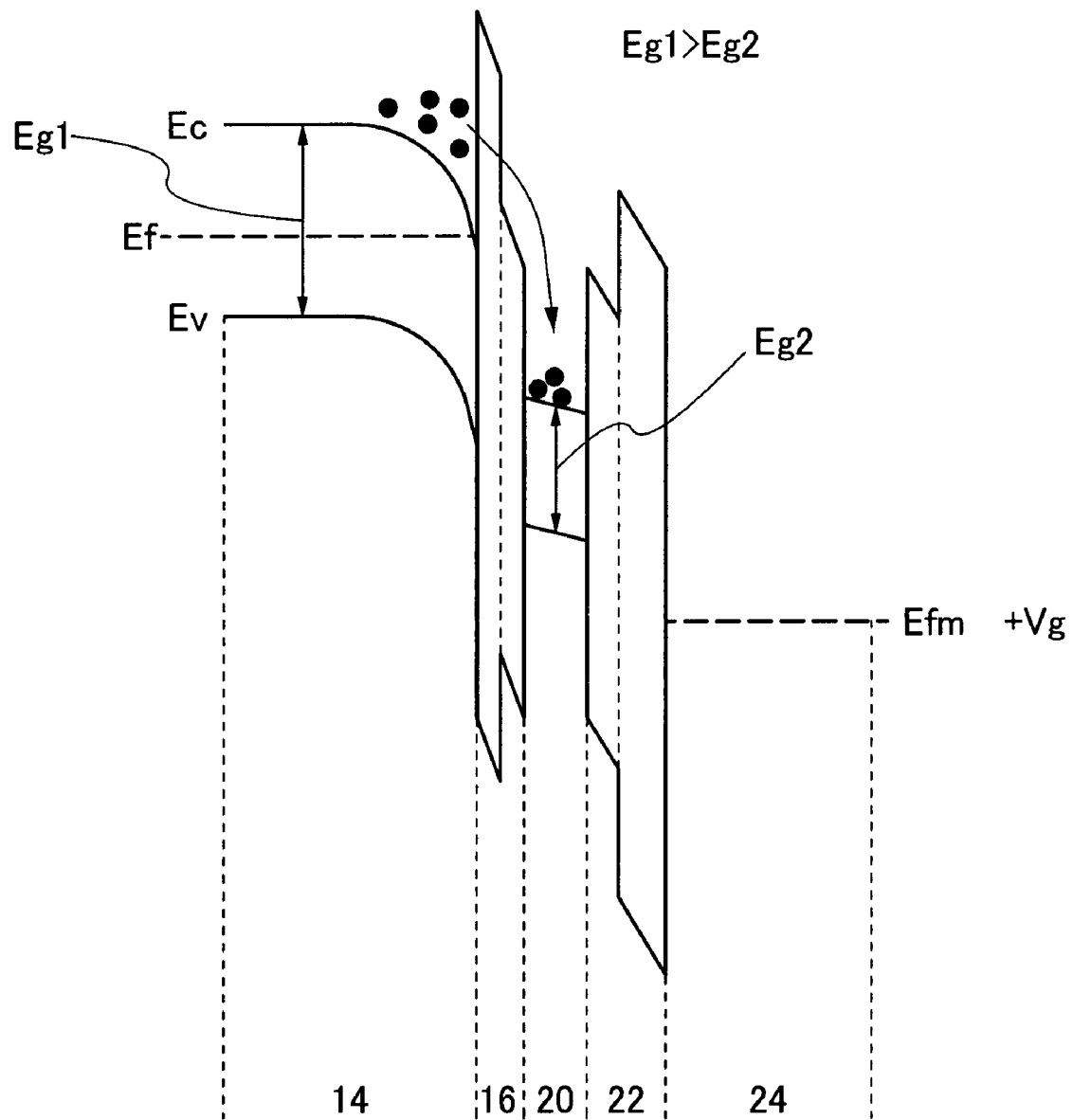
FIG. 3 is a band diagram for a nonvolatile memory element during a writing state.

As shown in FIG. 2 and FIG. 3, the nonvolatile memory element of the present invention is constructed such that a self-bias of Eg1>Eg2 is generated between the semiconductor layer 14 and the charge accumulation layer 20. This relationship is extremely important; when carriers are injected into the charge accumulation layer 20 from the channel formation region of the semiconductor layer 14, the relationship functions so that charge injection becomes easier. In other words, use of a low voltage for the writing voltage can be achieved. Conversely, it becomes difficult to discharge charges from the charge accumulation layer 20. This operation is performed so that memory storage characteristics of a nonvolatile memory element are improved.

As was explained above, the nonvolatile memory element of the present invention is a nonvolatile memory element in which charge can be easily injected into the charge accumulation layer 20 from the semiconductor layer 14 and leakage of charge from the charge accumulation layer 20 can be prevented. That is, when the nonvolatile memory element operates as memory, highly efficient writing can be done at low voltage and charge accumulation characteristics can be improved.

Figure 8:
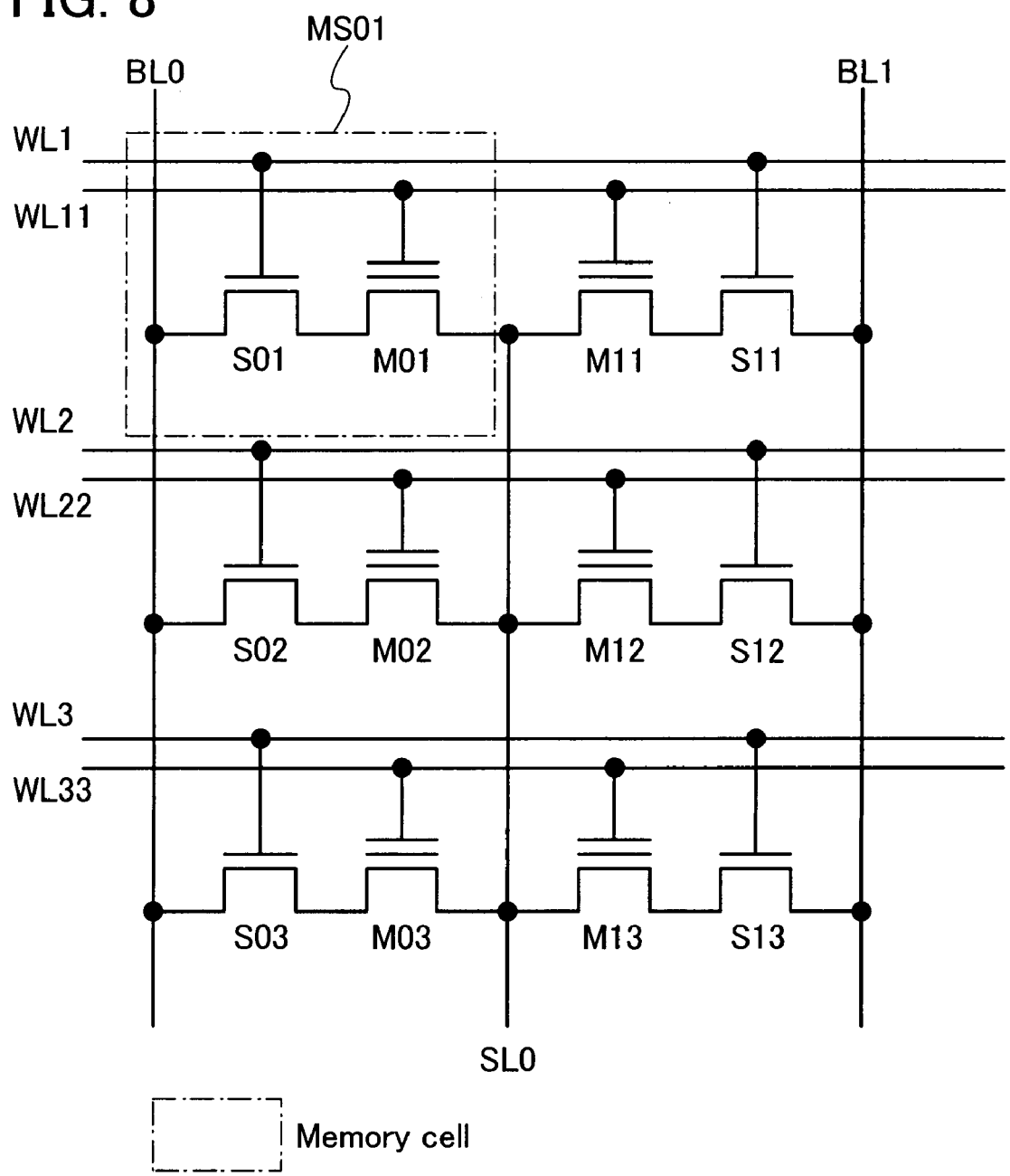
FIG. 8 is a diagram used to illustrate an example of an equivalent circuit of a nonvolatile memory cell array.

By use of this kind of nonvolatile memory element, a nonvolatile semiconductor memory device with several embodiments can be obtained. FIG. 8 shows an example of an equivalent circuit of a nonvolatile memory cell array. A memory cell MS01 that stores information for one bit includes a select transistor S01 and a nonvolatile memory element M01. The select transistor S01 is inserted between a bit line BL0 and the nonvolatile memory element M01 in series, and a gate is connected to a word line WL1. A gate of the nonvolatile memory element M01 is connected to a word line WL11. When data is written to the nonvolatile memory element M01, the word line WL1 and bit line BL0 are set to be H level and a bit line BL1 is set to be L level, and charge is stored in a charge accumulation layer 20 as described above through application of a high voltage to the word line WL11. When data is erased, the word line WL1 and bit line BL0 are set to be H level and a high voltage of negative polarity may be applied to the word line WL11.

In this memory cell MS01, a select transistor S01 and a nonvolatile memory element M01 are each formed using a semiconductor layer separated into island shapes that are formed over an insulating surface so that interference with other select transistors or nonvolatile memory elements can be prevented even if an element separation region is not specially formed. In addition, because the select transistor S01 and the nonvolatile memory element M01 in the memory cell MS01 are both n-channel, through formation of both the select transistor S01 and the nonvolatile memory element M01 using a semiconductor layer separated into one island shape, a circuit trace used to connect the two elements can be omitted.

Figure 9:
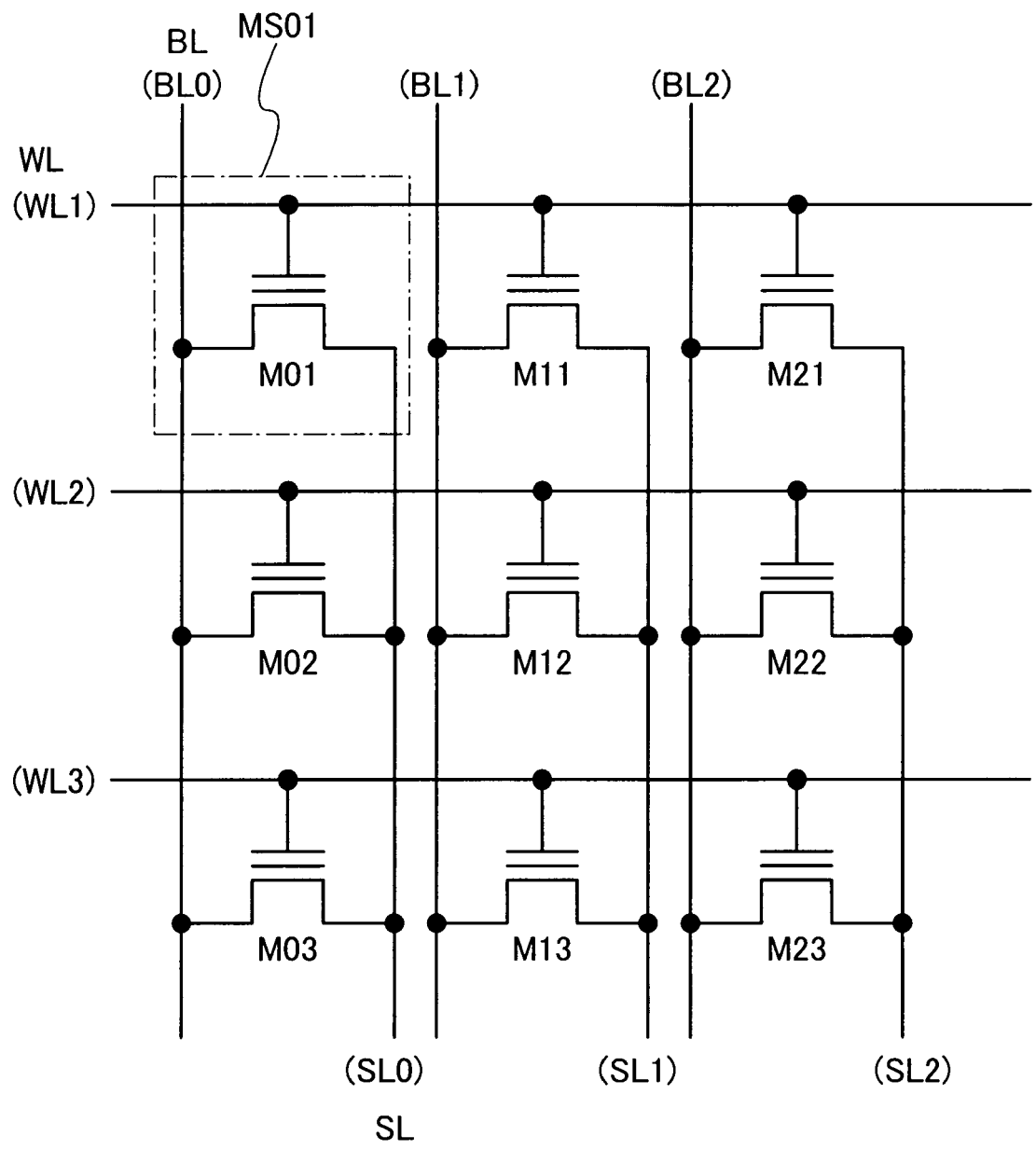
FIG. 9 is a diagram used to illustrate an example of an equivalent circuit of a NOR-type nonvolatile memory cell array.

FIG. 9 shows a NOR-type equivalent circuit in which a nonvolatile memory element is connected to a bit line directly. This memory cell array is arranged where a word line WL and a bit line BL intersect with each other, and a nonvolatile memory element is placed at each intersection. For a NOR-type circuit, the drain of each individual nonvolatile memory element is connected to the bit line BL. The source of each nonvolatile memory element is connected in common to a source line SL.

In this case, in the memory cell MS01, a nonvolatile memory element is formed using a semiconductor layer separated into island shapes that are formed over an insulating surface so that interference with other nonvolatile memory elements can be prevented even if an element separation region is not specially formed. In addition, if a plurality of nonvolatile memory elements (for example, elements M01 to M23 shown in FIG. 9) are treated as a single block, through formation of these nonvolatile memory elements using a semiconductor layer separated into one island shape, the erasing operation can be performed in block units.

The operation of a NOR-type is as follows, for example. For the data writing, the source line SL is set to 0 V, a high voltage is applied to the word line WL selected for writing of data, and a potential is applied in response to data of "0" or "1" written to the bit line BL. For example, a potential of H level and L level is applied to the bit line BL for data of "0" and "1," respectively. In order for data of "0" to be written, a hot electron is generated near a drain in the nonvolatile memory element to which an H level has been given, and this hot electron is injected into the floating gate. When data of "1" is written, this kind of electron injection is not generated.

In a memory cell to which data of "0" has been given, due to a strong transverse electric field between the source and drain, hot electrons are generated near the source, and these hot electrons are injected into the charge accumulation layer. As a result, the condition in which electrons are injected into the charge accumulation layer and the threshold voltage increases is "0." For data of "1," no hot electrons are generated, and a state in which no electrons are injected into the charge accumulation layer and the threshold voltage remains low, that is, an erasing state, is maintained.

When data is being erased, a voltage of positive polarity of approximately 10 V is applied to the source line S1, and the bit line BL is set to be in a floating state. Then, a high voltage of negative polarity is applied to the word line WL (a high voltage of negative polarity is applied to the control gate), and electrons are discharged from the charge accumulation layer. Because of this, the memory cell comes to be in the erasing state which occurs when data of "1" is given to the memory cell.

For the reading of data, the source line SL is set to 0 V with the bit line BL being set to approximately 0.8 V, the mean value of the threshold voltage when data is "1" and the threshold voltage when data of "0" is given as the set reading voltage to the word line WL, which is performed through a determination of the presence of current draw in the nonvolatile memory element by a sensing amplifier connected to the bit line BL.

Figure 10:
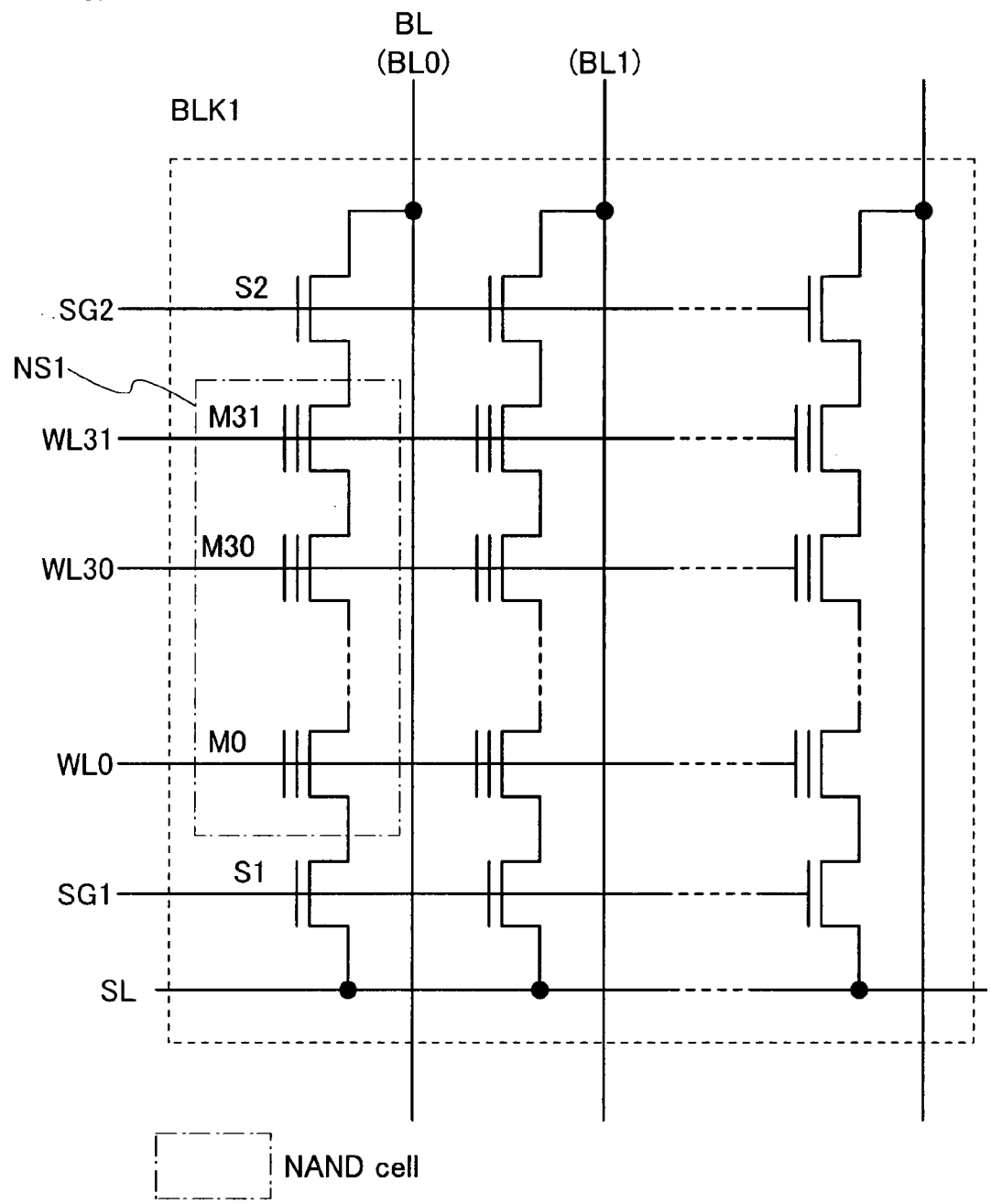
FIG. 10 is a diagram used to illustrate an example of an equivalent circuit of a NAND-type nonvolatile memory cell array.

FIG. 10 shows an equivalent circuit for a NAND-type memory cell array. A NAND cell NS1 to which is connected in series a plurality of nonvolatile memory elements is connected to the bit line BL. A block BLK1 is composed of a collection of a plurality of the NAND cells. There are 32 lines of word lines (word lines WL0 to WL31) for the block BLK1 shown in FIG. 10. A word line corresponding to the row in which the nonvolatile semiconductor memory element is located in the same row as the block BLK1 is connected in common to the nonvolatile semiconductor memory element.

In this case, because select transistors S1 and S2 and nonvolatile memory elements M0 to M31 are connected in series, these may be formed as a single unit over a single semiconductor layer. Because circuit traces connecting the nonvolatile memory elements can be omitted through this, integration can be achieved. In addition, separation of adjacent NAND cells can be performed easily. Furthermore, the semiconductor layer over which the select transistors S1 and S2 are formed and the semiconductor layer over which the NAND cell NS1 is formed may be formed separately. When an erasing operation during which electrons are extracted from the charge accumulation layer of each of the nonvolatile memory cells M0 to M31 is performed, the erasing operation may be performed in units of the NAND cells. Alternatively, nonvolatile memory elements (for example, elements in the row of the nonvolatile memory element M30) connected in common to a single word line may be formed over a single semiconductor layer.

During the writing operation, the NAND cell NS1 is in an erasing state; in other words, the writing operation is performed after the threshold voltage for each of the nonvolatile memory cells of the NAND cell NS1 is set to be in a negative voltage state. The writing is performed, in order, starting from memory element M0 on the side of the source line SL. An explanation using the writing of data to the memory element M0 as an example is as outlined hereinafter.

As in FIG. 11A, when "0" is written, a voltage, for example, Vcc (power supply voltage), is applied to a select gate line SG2 to turn the select transistor S2 on with the voltage (grounding voltage) of the bit line BL0 set to 0 V. The voltage of a select gate line SG1 is set to 0 V, and the select transistor S1 is set to off. Next, the voltage of the word line WL0 of the memory cell M0 is set to be a high voltage Vpgm (approximately 20 V), and the voltage of all other word lines is set to be a mean voltage Vpass (approximately 10 V). Because the voltage of the bit line BL is 0 V, the voltage of the channel formation region of the selected memory cell M0 comes to be 0 V. Because the potential difference between the word line WL0 and the channel formation region is large, electrons are injected into the charge accumulation layer of the memory cell M0 by F-N tunneling current as explained above. As a result, the threshold voltage of the memory cell M0 becomes positive (a state under which "0" has been written).

In contrast, when "1" is written, as shown in FIG. 11B, a voltage, for example, Vcc (power supply voltage), is applied to the bit line BL. Because the voltage of the select gate line SG2 is Vcc, as opposed to the threshold voltage Vth of the select transistor S2, with Vcc minus Vth (Vcc-Vth), the select transistor S2 goes into cutoff. For this reason, the channel formation region of the memory cell M0 comes to be in a floating state. Next, when a high voltage Vpgm (20 V) is applied to the word line WL0, and a mean voltage Vpass (10 V) is applied to all other word lines, through capacitor coupling of each word line and the channel formation region, the voltage of the channel formation region increases from Vcc-Vth to become, for example, approximately 8 V. Because the voltage of the channel formation region is increased to a high voltage, the potential difference between the word line WL0 and the channel formation region is small, which is different from when "0" is written. Accordingly, in the floating gate of the memory cell M0, electron injection by F-N tunneling current does not occur. Consequently, the threshold voltage of the memory cell M31 becomes negative (a state under which "1" has been written).

During an erasing operation, as shown in FIG. 49, a high voltage of negative polarity (Vers) is applied to all of the word lines in a selected block. The bit line BL and the source line SL are each placed into a floating state. Herewith, the electrons in floating gates of all of the memory cells of the block are discharged into the semiconductor layer by tunneling current. As a result, the threshold voltages of these memory cells shift in the negative direction.

In addition, when a nonvolatile memory element using a semiconductor substrate 30 instead of the semiconductor substrate 14 is formed, as shown in FIG. 12A, the voltages of all of the word lines in a selected block are set to 0 V, and a high voltage of negative polarity (Vers) is applied to a p-well. The bit line BL and the source line SL are each placed into a floating state. Herewith, the electrons in floating gates of all of the memory cells of the block are discharged into the semiconductor substrate by tunneling current. As a result, the threshold voltages of these memory cells shift in the negative direction.

Figure 13:
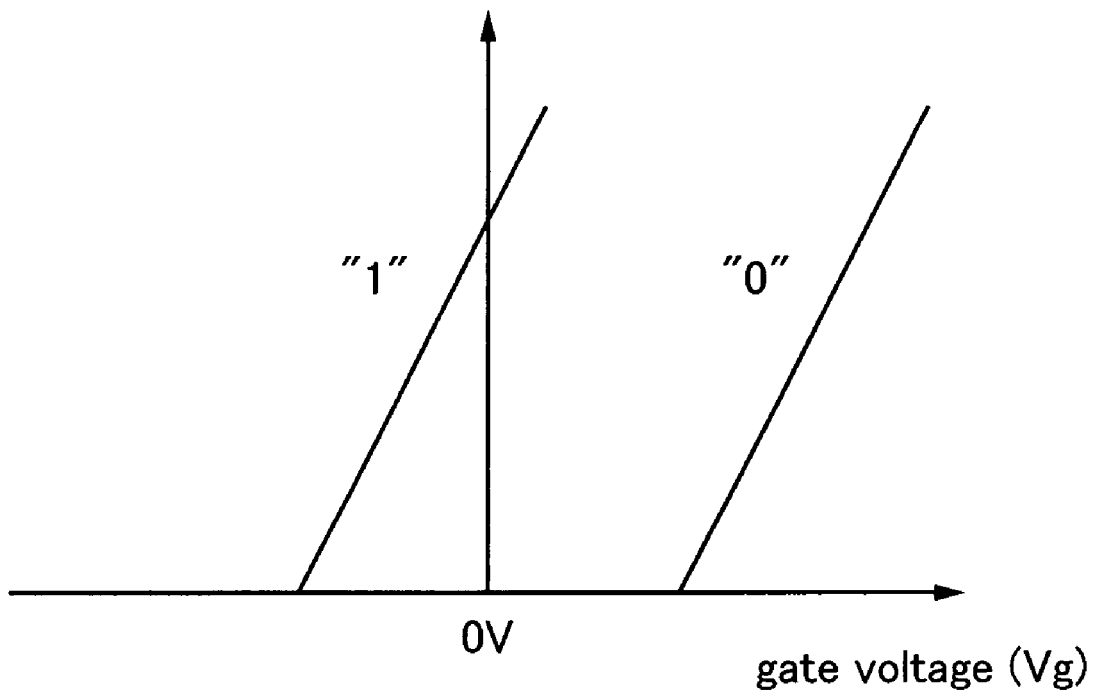
FIG. 13 is a diagram illustrating the change in threshold voltage of a nonvolatile memory element for data of "0" when electric charge is stored and for data of "1" when data is erased.

In the reading operation shown in FIG. 12B, the voltage of the word line WL0 of the memory cell M0 that is selected for reading is set to be a voltage Vr (for example, a voltage of 0 V), and the voltages of the word lines WL1 to WL31 of the unselected memory cells and select gate lines SG1 and SG2 are set to be a little higher than the power supply voltage at a mean voltage Vread used for the reading operation. In other words, as shown in FIG. 13, all memory cells other than the selected memory cell function as transfer transistors. By this, whether current flows in the memory cell M0 selected for reading or not can be detected. In other words, when data of "0" is stored in the memory cell M30, because the memory cell M0 is off, discharge from the bit line BL does not occur. In contrast, when data of "1" is stored in the memory cell M30, because the memory cell M0 is on, discharge from the bit line BL does occur.

Figure 14:
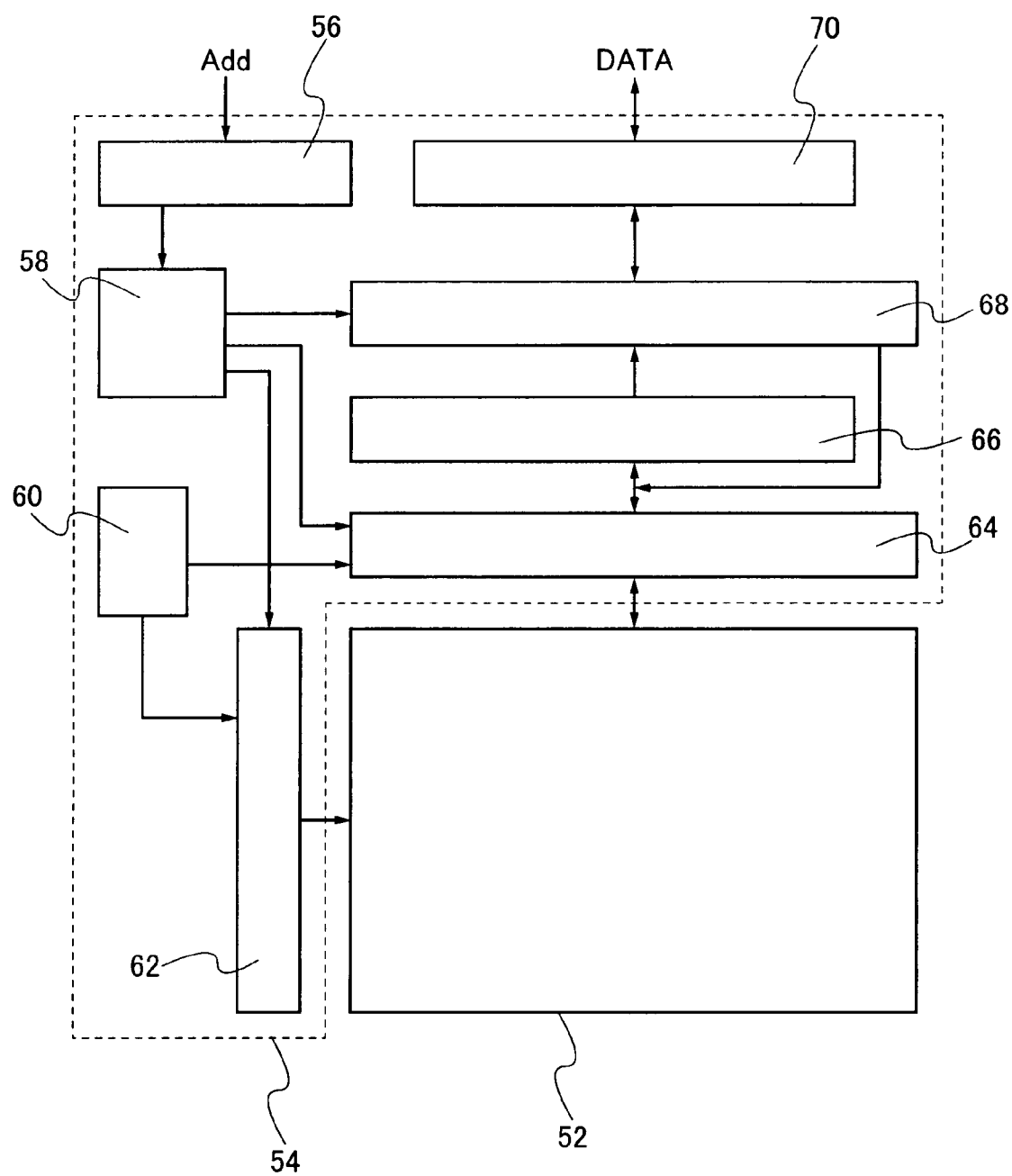
FIG. 14 is a diagram used to illustrate an example of a circuit block diagram of a nonvolatile semiconductor memory device.

FIG. 14 shows an example of a circuit block diagram for a nonvolatile semiconductor memory device. The nonvolatile semiconductor memory device is formed over the same substrate as a memory cell array 52 and a periphery circuit 54. The memory cell array 52 has a structure like the structures shown in FIG. 8, FIG. 9, and FIG. 10. The structure of the periphery circuit is as will be explained hereinafter.

A row decoder 62 used for selecting a word line and a column decoder 64 used for selecting a bit line are provided in the periphery of the memory cell array 52. An address is transmitted through an address buffer 56 to a control circuit 58, and an internal row address signal and an internal column address signal are transferred to the row decoder 62 and the column decoder 64, respectively.

During data writing and erasing operations, a potential which is obtained by boosting the power supply potential is used. For this reason, a booster circuit 60, which is controlled in response to the operation mode by the control circuit 58, is provided. The output of the booster circuit 60 is supplied to a word line WL and a bit line BL through the row decoder 62 and the column decoder 64. Data output from the column decoder 64 is input into a sense amplifier 66. Data read by the sense amplifier 66 is retained by a data buffer 68; the data is randomly accessed in accordance with a control of the control circuit 58; and the data comes to be output through a data input and output buffer 70. Written data is once retained by the data buffer 68 through the data input and output buffer 70 and forwarded to the column decoder 64 in accordance with the control of the control circuit 58.

As thus described, in a nonvolatile semiconductor memory device, it is necessary to use a potential different from the power supply potential in the memory cell array 52. For this reason, it is desirable that the memory cell array 52 and the periphery circuit 54, at least, be electrically insulated and isolated from each other. In this case, as will be explained hereinafter in Embodiments 1 through 3, if transistors of a nonvolatile memory element and a periphery circuit are formed from a semiconductor layer that is formed over an insulating surface, elements can be insulated and isolated easily. Through this, malfunction is eliminated, and a nonvolatile semiconductor memory device with low power consumption can be obtained.

Hereinafter, a nonvolatile semiconductor memory device of the present invention will be explained in detail in the embodiments. In the composition of the present invention to be explained hereinafter, there may be cases where the same elements referred to in different drawings are denoted by the same reference numerals and detailed descriptions thereof are omitted.

EMBODIMENT 1

In the present embodiment, an example of a nonvolatile semiconductor memory device will be explained with reference to drawings. It is to be noted that, here, a case is shown in which, in the nonvolatile semiconductor memory device, a nonvolatile memory element forming a memory component and elements such as transistors, which are formed over the same substrate as the nonvolatile memory element, forming a logic component which performs controls and the like of the memory component are formed simultaneously.

First, a schematic block diagram of a memory component in a nonvolatile semiconductor memory device is shown in FIG. 8.

In the memory component described in the present embodiment, a plurality of memory cells that have controlling transistors S and nonvolatile memory elements M is provided. In FIG. 8, one memory cell is formed of a controlling transistor S01 and a nonvolatile memory element M01. In addition, in the same way, a memory cell is formed of a controlling transistor S02 and a nonvolatile memory element M02, another memory cell is formed of a controlling transistor S03 and a nonvolatile memory element M03, another memory cell is formed of a controlling transistor S11 and a nonvolatile memory element M11, another memory cell is formed of a controlling transistor S12 and a nonvolatile memory element M12, and another memory cell is formed of a controlling transistor S13 and a nonvolatile memory element M13.

A gate electrode of the controlling transistor S01 is connected to a word line WL1, one of a source or drain of the controlling transistor S01 is connected to a bit line BL0, and the other one of the source or drain of the controlling transistor S01 is connected to the nonvolatile memory element M01. In addition, a gate electrode of the nonvolatile memory element M01 is connected to a word line WL11, one of a source or drain of the nonvolatile memory element M01 is connected to the source or drain of the controlling transistor S01, and the other one of the source or drain of the nonvolatile memory element M01 is connected to a source line SL0.

It is to be noted that, because the driving voltage of a controlling transistor formed in a memory component is high compared to the driving voltage of a transistor formed in a logic component, it is preferable that a gate insulating film and the like of the controlling transistor formed in the memory component and a gate insulating film and the like of the transistor formed in the logic component be formed at different thicknesses. For example, when a low driving voltage and a reduction in variations in the threshold voltage are desired, it is preferable that the gate insulating film be used to form a thinner thin film transistor; when a high driving voltage and a gate insulating film that has resistance to pressure are required, it is preferable that the gate insulating film be used to form a thicker thin film transistor.

Figure 22:
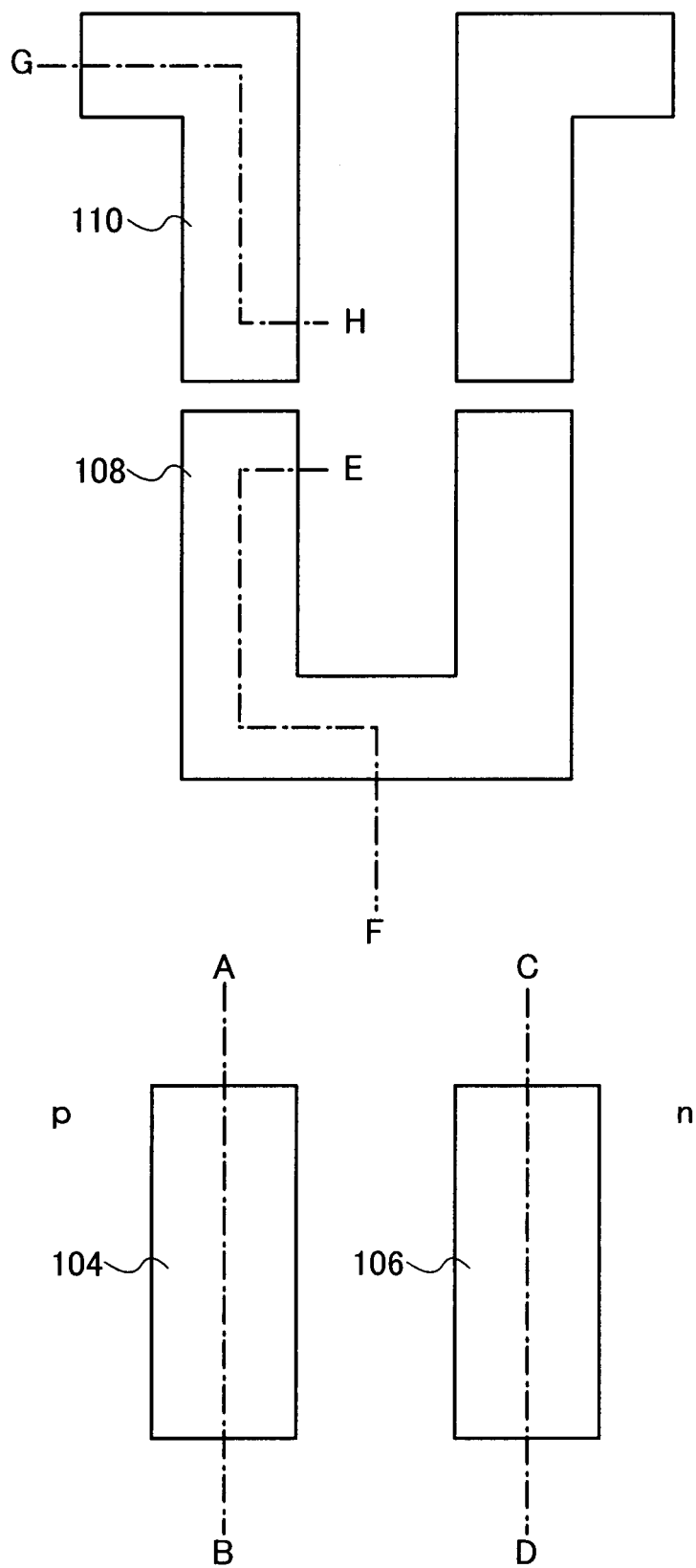
FIG. 22 is a diagram used to illustrate an example of a top view of a nonvolatile semiconductor memory device of the present invention.
Figure 24:
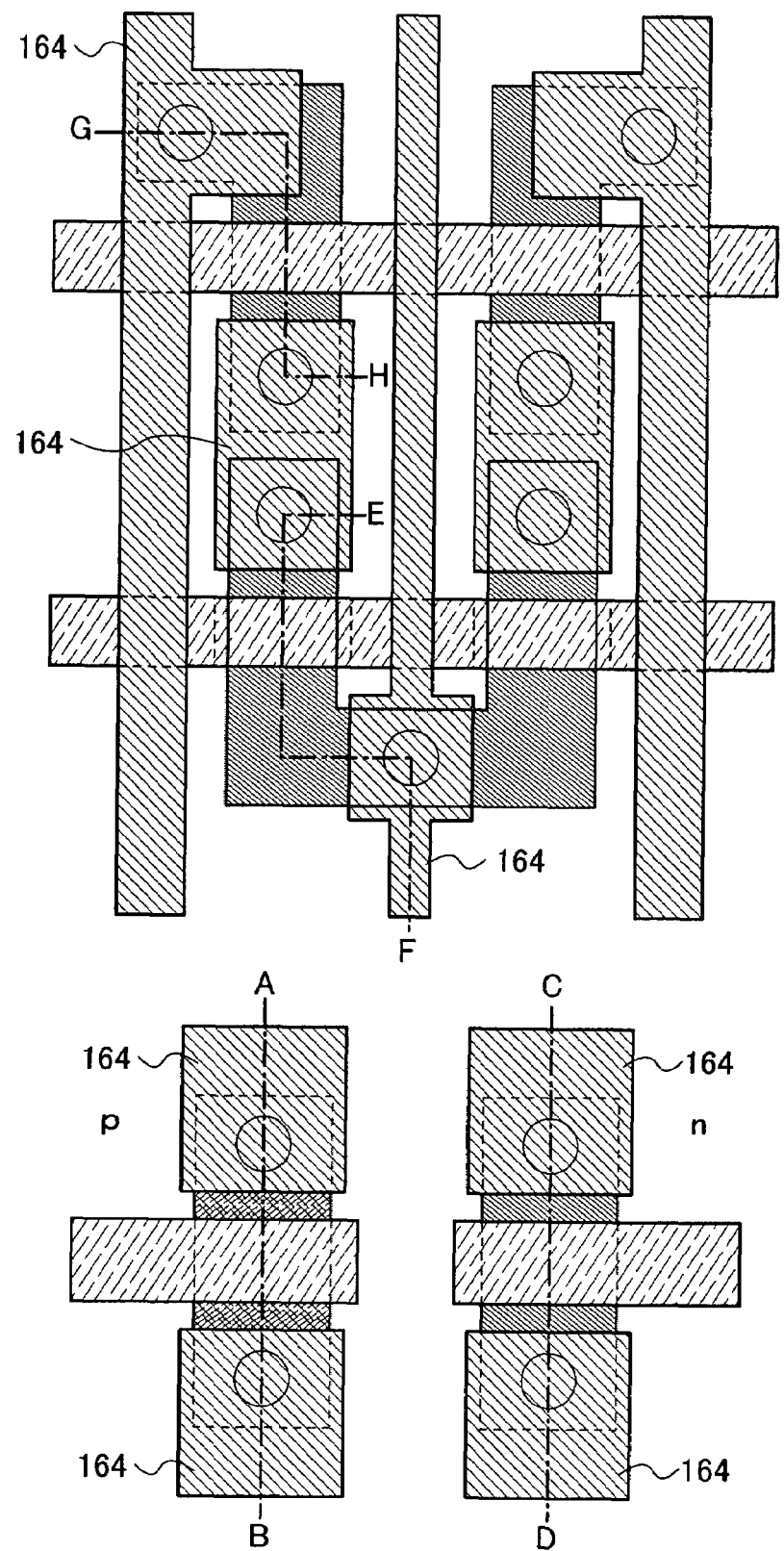
FIG. 24 is a diagram used to illustrate an example of a top view of a nonvolatile semiconductor memory device of the present invention.

Accordingly, in the present embodiment, an explanation will be given hereinafter with reference to drawings in which an insulating layer with a thinner thickness is made for a transistor of the logic component for which a low driving voltage and a reduction in variations in the threshold voltage are desired and an insulating layer with a thicker thickness is made for a memory component for which a high driving voltage and a gate insulating film that has resistance to pressure are required. It is to be noted that FIGS. 22 to 24 show top views, and FIGS. 19A and 19B, FIGS. 20A to 20C, and FIGS. 21A and 21B show cross-sectional views of FIGS. 22 to 24 taken along the intervals of A-B, C-D, E-F, and G-H. In addition, the interval along A-B and the interval along C-D show a thin film transistor provided in the logic component, the interval along E-F shows a nonvolatile memory element provided in the memory component, and the interval along G-H shows a thin film transistor provided in the memory component. Furthermore, in the present embodiment, the thin film transistor formed in the interval of A-B is a p-channel transistor; the thin film transistors formed in the intervals of C-D and G-H are n-channel transistors; and an explanation will be given for when charge accumulation of the nonvolatile memory element provided in the interval along E-F is performed using electrons; however, a nonvolatile semiconductor memory device of the present invention is not limited to this.

First, island-like semiconductor layers 104, 106, 108, and 110 are formed over a substrate 100 with an insulating layer 102 interposed between the island-like semiconductor layers 104, 106, 108, and 110 and the substrate 100. A first insulating layer 112 is formed so as to cover the island-like semiconductor layers 104, 106, 108, and 110 (refer to FIG. 16A and FIG. 22).

The island-like semiconductor layers 104, 106, 108, and 110 are formed as amorphous semiconductor layers over the insulating layer 102, which has been formed in advance over the substrate 100, using a sputtering method, an LPCVD method, a plasma CVD method, or the like with a material or the like containing silicon as the main component. After the amorphous semiconductor layers have been crystallized, the island-like semiconductor layers 104, 106, 108, and 110 are formed by etching of selected portions of the amorphous semiconductor layers. It is to be noted that crystallization of the amorphous semiconductor layers may be performed using a laser crystallization method, a thermal crystallization method using an RTA method or an annealing furnace, a thermal crystallization method using a metallic element that promotes crystallization, or a combination of one or more of any of these methods, or the like.

In addition, when semiconductor crystallization or recrystallization is performed using laser beam irradiation, a continuous wave oscillation (CW) laser of LD excitation ($YVO_4$, at the second harmonic (wavelength of 532 nm)) can be used as the laser beam source. Although there is no particular need to limit the laser beam to a wavelength at the second harmonic, a laser beam of the second harmonic is superior to a laser beam of harmonics of a higher order on the point of energy efficiency. A semiconductor layer is irradiated by a CW laser, energy is imparted to the semiconductor layer continuously, the semiconductor layer is once placed in a melted state, and the melted state can be made to be continued. Moreover, the location of an interface between solid and liquid phases in the semiconductor layer is moved by scanning with the CW laser, crystal grains that are long in one direction, the direction along which movement occurs, can be formed. In addition, comparing the use of a solid state laser to the use of a gas laser or the like, stability of the output of a solid state laser is high, with the reason being that stable processing is expected. It is to be noted that the laser used is not limited to a CW laser, and use of a pulse laser with a repetition frequency of 10 MHz or more is possible. When a pulse laser with a high repetition frequency is used, if the time between laser pulses is shorter than the time until solidifying occurs after the semiconductor layer has been melted, the semiconductor layer can usually be left in a melted state, and a semiconductor layer composed of crystal grains that are long in one direction along the interface between solid and liquid phases can be formed. In addition, a CW laser and a pulse laser that has a repetition frequency of 10 MHz or more can be used. For example, for gas lasers, there are an Ar laser, a Kr laser, a $CO_2$ laser, and the like. For solid state lasers, there are a YAG laser, a YLF laser, a YAlO laser, a $GdVO_4$ laser, a KGW laser, a KYW laser, an alexandrite laser, a Ti:sapphire laser, a $Y_2O_3$ laser, a $YVO_4$ laser, and the like. In addition, there are ceramic lasers such as a YAG laser, a $Y_2O_3$ laser, a $GdVO_4$ laser, a $YVO_4$ laser, and the like. For a metal vapor laser, a helium cadmium laser and the like can be given. In addition, as for a laser oscillator, a laser beam is oscillated and emitted at $TEM_{00}$ (single transverse mode), and because uniformity in energy of a linear beam spot obtained at an irradiated surface can be achieved, this type of linear oscillator is preferable. Alternatively, an excimer laser of pulsed oscillation may be used.

A substrate such as a glass substrate, a quartz substrate, a ceramic substrate, a metal substrate (for example, a stainless steel substrate or the like), a semiconductor substrate such as an Si substrate or the like, or the like can be used for the substrate 100. Alternatively, for a plastic substrate, a polyethylene terephthalate (PET) substrate, a polyethylene naphthalate (PEN) substrate, a polyether sulfone (PES) substrate, an acrylic substrate, or the like can be used, as well.

The insulating layer 102 is formed using a CVD method, a sputtering method, or the like using an insulating material such as silicon oxide, silicon nitride, silicon oxynitride, or the like. When the insulating layer 102 is formed as a two-layer structure, for example, an insulating layer formed as the first layer may be formed using a silicon oxynitride layer, and an insulating layer formed as the second layer may be formed using a silicon oxynitride layer that has a composition differing from the composition of the silicon oxynitride layer of the first layer. Alternatively, an insulating layer formed as the first layer may be formed using a silicon nitride layer, and an insulating layer formed as the second layer may be formed using a silicon oxide layer. In this way, with the insulating layer 102 functioning as a blocking layer being formed, adverse effects on an element formed over the substrate 100 by alkali metals or alkali-earth metals such as Na or the like from the substrate 100 can be prevented. It is to be noted that, when a quartz substrate is used for the substrate 100, the insulating layer 102 may be omitted.

The first insulating layer 112 is formed as a single-layer or multilayer structure using a CVD method, a sputtering method, or the like, using an insulating material such as silicon oxide, silicon nitride, silicon oxynitride, or the like. When the first insulating layer 112 is formed as a single-layer structure, for example, the first insulating layer 112 is formed as a silicon oxynitride layer with a thickness of from 5 nm to 50 nm by a CVD method. Alternatively, when the first insulating layer 112 is formed as a three-layer structure, a silicon oxynitride layer is formed as the first insulating layer, a silicon nitride layer is formed as the second insulating layer, and a silicon oxynitride layer is formed as the third insulating layer.

It is to be noted that the first insulating layer 112 formed above a semiconductor layer 110 functions as a gate insulating film in a thin film transistor to be completed later.

Next, selected portions of the first insulating layer 112 formed over the semiconductor layers 104, 106, and 108 are removed, and the surfaces of the semiconductor layers 104, 106, and 108 are exposed. Here, selected portions of the semiconductor layer 110 provided in a memory component are covered by a resist 114, and selected portions of the first insulating layer 112 formed over the semiconductor layers 104, 106, and 108 are removed by etching (refer to FIG. 16B).

Next, second insulating layers 116, 118, and 120 are formed over the semiconductor layers 104, 106, and 108, respectively (refer to FIG. 16C).

The second insulating layers 116, 118, and 120 can be formed by performance of heat treatment, plasma treatment, or the like on the semiconductor layers 104, 106, and 108. By performance of oxidation, nitridation, or oxynitridation of the semiconductor layers 104, 106, and 108 by high density plasma treatment, for example, the second insulating layers 116, 118, and 120 each made from an oxide layer, a nitride layer, or an oxynitride layer can be formed over the semiconductor layers 104, 106, and 108, respectively. It is to be noted that the second insulating layers 116, 118, and 120 may be formed using a CVD method or a sputtering method; the second insulating layers 116, 118, and 120 may also be formed by performance of high density plasma treatment on a layer formed using a CVD method or a sputtering method.

When oxidation or nitridation is performed by high density plasma treatment using a semiconductor layer that contains Si as the main component for the semiconductor layers 104, 106, and 108, for example, silicon oxide layers or silicon nitride layers are formed as the second insulating layers 116, 118, and 120. Furthermore, after oxidation of the semiconductor layers 104, 106, and 108 by high density plasma treatment is performed, nitridation may be performed by performance of another high density plasma treatment. In this case, a silicon oxide layer to be in contact with the semiconductor layers 104, 106, and 108 is formed, and a nitrogen plasma treated layer is formed in the interface between the silicon oxide layer that comes into contact with the semiconductor layers 104, 106, and 108 and a charge accumulation layer or formed over a silicon oxide layer in the interface therebetween.

Here, the second insulating layers 116, 118, and 120 are each formed at a thickness greater than or equal to 1 nm and less than or equal to 10 nm; preferably, the thickness is greater than or equal to 1 nm and less than or equal to 5 nm. After a silicon oxide layer approximately 3 nm thick is formed over the surface of each of the semiconductor layers 104, 106, and 108 by oxidation performed on the semiconductor layers 104, 106, and 108 by high density plasma treatment, for example, a nitrogen plasma treated layer is formed over the surface of the silicon oxide layer or near the surface of the silicon oxide layer by performance of nitridation by high density plasma treatment. Specifically, first, a silicon oxide layer 16a is formed over a semiconductor layer 14 at a thickness greater than or equal to 3 nm and less than or equal to 6 nm by plasma treatment under an oxygen atmosphere. Subsequently, a nitrogen plasma treated layer with a high concentration of nitrogen is formed over the surface or near the surface of the silicon oxide layer by performance of plasma treatment under a nitrogen atmosphere successively. Here, by performance of plasma treatment under a nitrogen atmosphere, a structure in which nitrogen at a rate of from 20 at. % to 50 at. % has been included at approximately 1 nm from the surface of the silicon oxide layer can be obtained. Over the nitrogen plasma treated layer, silicon containing oxygen and nitrogen (silicon oxynitride) is formed. In addition, this time, it is preferable that oxidation and nitridation be performed consecutively by high density plasma treatment without any exposure to the atmosphere. By performance of high density plasma treatments consecutively, prevention of the introduction of contaminants and improvement in production efficiency can be achieved. Furthermore, in this instance, there may be cases in which the surface of the first insulating layer 120 formed over the semiconductor layer 110 is oxidized or nitrided, as well, and a silicon oxynitride layer is formed.

It is to be noted that, when a semiconductor layer is oxidized by high density plasma treatment, high density plasma treatment is performed under an atmosphere containing oxygen (for example, under an atmosphere of either oxygen ($O_2$) or nitrous oxide ($N_2O$) and a noble gas (including at least one selected from He, Ne, Ar, Kr, and Xe) or under an atmosphere of either oxygen or nitrous oxide and hydrogen ($H_2$) and a noble gas). In contrast, when a semiconductor layer is nitrided by high density plasma treatment, high density plasma treatment is performed under an atmosphere containing nitrogen (for example, under an atmosphere of nitrogen ($N_2$) and a noble gas (including at least one or more of He, Ne, Ar, Kr, and Xe); under an atmosphere of nitrogen, hydrogen, and a noble gas; or under an atmosphere of $NH_3$ and a noble gas).

For a noble gas, Ar, for example, can be used. Alternatively, a mixture of Ar and Kr may be used. When high density plasma treatment is performed in a noble gas atmosphere, there are cases where the first insulating layer 112 and the second insulating layers 116, 118, and 120 contain the noble gas (including at least one or more of He, Ne, Ar, Kr, and Xe) used in the plasma treatment; when Ar is used, there are cases where the first insulating layer 112 and the second insulating layers 116, 118, and 120 contain Ar.

In addition, high density plasma treatment is performed in an atmosphere of the aforementioned gas at an electron concentration of $1\times10^{11}$ cm$^{-3}$ or more and a plasma electron temperature of 1.5 eV or less. More specifically, high density plasma treatment is performed at an electron concentration of greater than or equal to $1\times10^{11}$ cm$^{-3}$ and less than or equal to $1\times10^{13}$ cm$^{-3}$ and a plasma electron temperature of greater than or equal to 0.5 eV and less than or equal to 1.5 eV. Because plasma electron concentration is high and electron temperature near objects to be treated (here, the semiconductor layers 104, 106, 108, and 110) formed over the substrate 100 is low, damage to the objects to be treated by the plasma can be prevented. Furthermore, because the plasma electron concentration is of a high concentration at $1\times10^{11}$ cm$^{-3}$ or more, an oxide layer or a nitride layer formed by oxidation or nitridation of an object to be irradiated by plasma treatment is superior compared to a layer formed by a CVD method or sputtering method in terms of uniformity in thickness and the like, and a precise layer can be formed. In addition, because the plasma electron temperature is low at 1.5 eV or less, oxidation or nitridation can be performed at a temperature lower than the temperature at which traditional plasma treatment and heat oxidation methods are performed. For example, even if plasma treatment is performed at a temperature lower than the strain point of a glass substrate by 100 degrees or more, oxidation or nitridation can be performed adequately enough. For frequencies for forming the plasma, a high frequency such as a frequency in the microwave range (for example, a frequency of 2.45 GHz) or the like can be used.

In the present embodiment, when oxidation of an object to be treated is performed by high density plasma treatment, a gas mixture of oxygen ($O_2$), hydrogen ($H_2$), and argon (Ar) is introduced into the plasma treatment chamber. The gas mixture used here may be introduced with oxygen at 0.1 to 100 sccm, hydrogen at 0.1 to 100 sccm, and argon at 100 to 5000 sccm. It is to be noted that it is preferable that the ratio for the introduced gas mixture be such that oxygen:hydrogen:argon=1:1:100. For example, oxygen may be introduced at 5 sccm, hydrogen at 5 sccm, and argon at 500 sccm.

Alternatively, when nitridation by high density plasma treatment is performed, a mixture of nitrogen ($N_2$) and argon (Ar) may be introduced into the plasma treatment chamber. The gas mixture used here may be introduced with nitrogen at 20 to 2000 sccm and argon at 100 to 10000 sccm. For example, nitrogen may be introduced at 200 sccm and argon at 1000 sccm.

In the present embodiment, the second insulating layer 120 is formed over a semiconductor layer 108 provided in a memory component and functions as a tunnel oxide film in a nonvolatile memory element that is to be completed later. Consequently, the thickness of the second insulating layer 120 is thin so that tunneling current flows easily, and achieving high speed operation for memory becomes possible. Furthermore, the thickness of the second insulating layer 120 is thin so that it becomes possible to store charge at low voltage in a charge accumulation layer to be formed later in order that power consumption by a nonvolatile semiconductor memory device can be reduced. For that reason, it is preferable that the second insulating layers 116, 118, and 120 each be formed at a thin thickness (for example, at a thickness of 10 nm or less).

Generally, there is a thermal oxidation method used for thinly forming an insulating layer over a semiconductor layer, but when a substrate, such as a glass substrate or the like, that does not have a high enough melting point is used for the substrate 100, forming the second insulating layers 116, 118, and 120 by the thermal oxidation method is extremely difficult. Furthermore, for an insulating layer formed using a CVD method or a sputtering method, because defects are contained inside the layer, film quality is not adequate, and there are problems in that defects such as pinholes and the like are generated when the layer is formed thinly. In addition, when an insulating layer is formed using a CVD method or a sputtering method, the edge of a semiconductor layer is not covered adequately, and there are cases where leakage occurs between a conductive layer and the like formed over the second insulating layer 120 later and the semiconductor layer. Consequently, as described in the present embodiment, by formation of the second insulating layers 116, 118, and 120 by high density plasma treatment, an insulating layer that is denser than an insulating layer formed by a CVD method or a sputtering method can be formed; furthermore, the edges of the semiconductor layers 104, 106, and 108 can be covered by the second insulating layers 116, 118, and 120 adequately. As a result, high speed operation and charge retention characteristics for memory can be improved. It is to be noted that, when the second insulating layers 116, 118, and 120 are formed using a CVD method or a sputtering method, it is preferable that, after the insulating layers are formed, oxidation, nitridation, or oxynitridation of the surface of the insulating layers be performed by performance of high density plasma treatment.

Figure 17A:
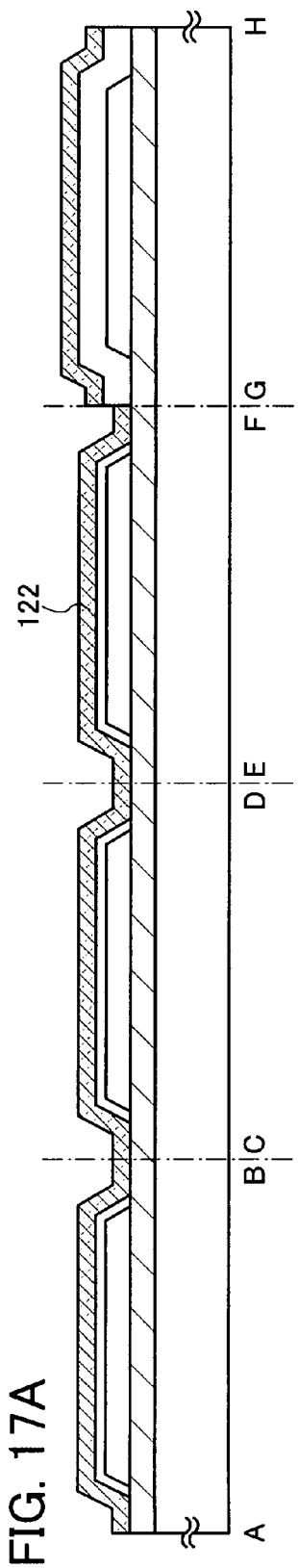
FIGS. 17A to 17C are diagrams used to illustrate an example of a manufacturing method of the nonvolatile semiconductor memory device of the present invention.

Next, a charge accumulation layer 122 is formed so as to cover the first insulating layer 122 and the second insulating layers 116, 118, and 120 (refer to FIG. 17A). The charge accumulation layer 122 can be formed using an insulating layer that has defects to trap charge in the film or using an insulating layer containing conductive particles or semiconductor particles such as particles of silicon or the like. For example, the charge accumulation layer 122 can be formed using a germanium compound such as germanium nitride, germanium oxide, germanium nitride to which oxygen is added, germanium oxide to which nitrogen is added, germanium nitride to which oxygen and hydrogen are added, germanium oxide to which nitrogen and hydrogen are added, or the like. Alternatively, germanium particles or silicon germanium particles may be included in a layer formed using one or more of these germanium compounds.

When the charge accumulation layer 122 is formed using a germanium compound such as germanium nitride, germanium oxide, germanium nitride to which oxygen is added, germanium oxide to which nitrogen is added, germanium nitride to which oxygen and hydrogen are added, germanium oxide to which nitrogen and hydrogen are added, or the like, the charge accumulation layer 122 can be formed by a plasma CVD method performed under an atmosphere containing elemental germanium (for example, under an atmosphere containing $GeH_4$ and $N_2$, $GeH_4$ and $NH_3$, $GeH_4$ and $N_2O$, or the like). Alternatively, the charge accumulation layer 122 formed using germanium nitride can be formed by depositing of a sintered body that is obtained from heating of germanium oxide under an ammonia atmosphere. The thickness of the charge accumulation layer 122 is greater than or equal to 1 nm and less than or equal to 20 nm; it is preferable that the thickness of the charge accumulation layer 122 be greater than or equal to 1 nm and less than or equal to 10 nm.

Alternatively, by performance of a plasma CVD method under an atmosphere containing GeH$_4$ and H$_2$; GeH$_4$, SiH$_4$, and H$_2$; or the like, germanium particles or silicon-germanium particles can be formed. For example, using germane (GeH$_4$) gas diluted to from 5% to 10% with hydrogen, with the heating temperature of the substrate 100 set to from 200° C. to 350° C., by application of high-frequency power of from 13.56 MHz to 60 MHz (for example, 27 MHz), germanium particles can be formed. The diameter of germanium particles or silicon-germanium particles contained in the charge accumulation layer 122 is greater than or equal to 0.1 nm and less than or equal to 10 nm; it is preferable that the diameter be greater than or equal to 1 nm and less than or equal to 3 nm.

Here, for the charge accumulation layer 122, GeH$_4$ and NH$_3$ are set as raw materials, and germanium nitride formed by a plasma CVD method at a thickness greater than or equal to 1 nm and less than or equal to 20 nm, preferably, a thickness greater than or equal to 1 nm and less than or equal to 10 nm, is used. It is to be noted that the charge accumulation layer 122 provided in a memory component functions as a layer used to trap charge in a nonvolatile memory element to be completed later.

Figure 17B:
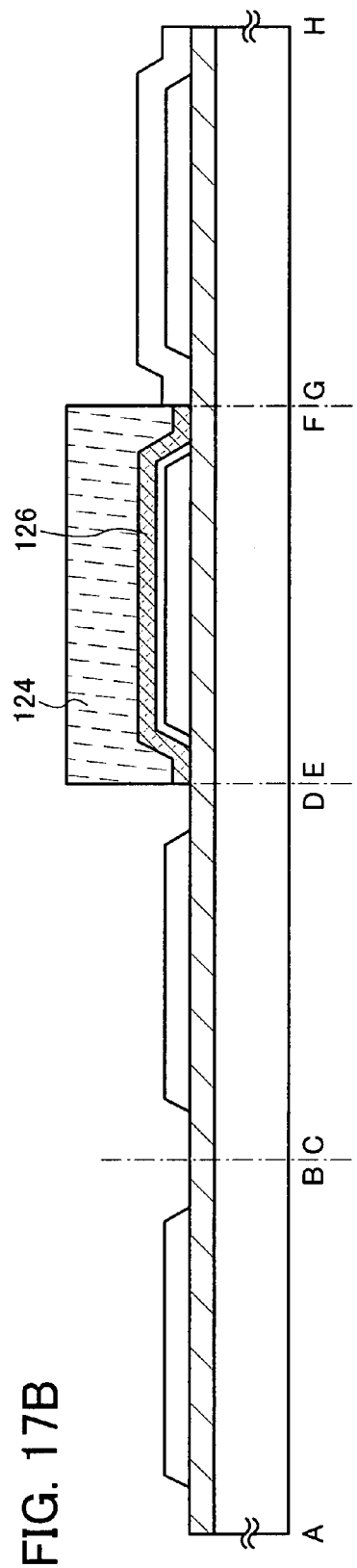

Next, selected portions of the second insulating layers 116 and 118 formed over the semiconductor layers 104 and 106, respectively, the charge accumulation layer 122 formed thereover, and the charge accumulation layer 122 formed over the semiconductor layer 110 are removed, and the second insulating layer 120 and the charge accumulation layer 122 formed over the semiconductor layer 108 are left remaining. Here, selected portions of the semiconductor layer 108 provided in a memory component are covered by a resist 124, and selected portions of the second insulating layers 116 and 118 and the charge accumulation layer 122 not covered by the resist 124 are removed by etching (refer to FIG. 17B). It is to be noted that FIG. 17B shows an example in which, by removal of selected portions of the charge accumulation layer by etching, part of the charge accumulation layer is left remaining, and a charge accumulation layer 126 is formed.

Figure 17C:
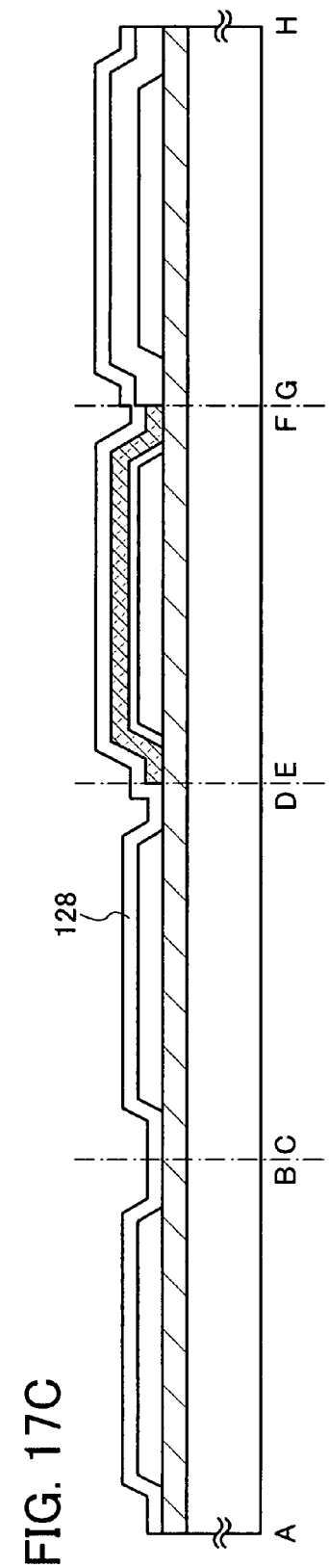

Next, a third insulating layer 128 is formed so as to cover the first insulating layer 120 formed above the charge accumulation layer 126 and the semiconductor layer 110 formed above the semiconductor layers 104 and 106 and the semiconductor layer 108 (refer to FIG. 17C).

The third insulating layer 128 is formed using a CVD method, a sputtering method, or the like as single-layer or multilayer using an insulating material such as silicon oxide, silicon nitride, silicon oxynitride, or the like. For example, when the third insulating layer 128 is formed as a single layer, the third insulating layer 128 is formed as a silicon oxynitride layer at a thickness greater than or equal to 5 nm and less than or equal to 50 nm by a CVD method. Alternatively, when the third insulating layer 128 is formed as a three-layer structure, a silicon oxynitride layer is formed as the first insulating layer, a silicon nitride layer is formed as the second insulating layer, and a silicon oxynitride layer is formed as the third insulating layer.

It is to be noted that the third insulating layer 128 formed above the semiconductor layer 108 functions as a control insulating layer in a nonvolatile memory element to be completed later, and the third insulating layer 128 formed above the semiconductor layers 104 and 106 functions as a gate insulating film in a transistor to be completed later.

Next, a conductive layer is formed so as to cover the third insulating layer 128 formed above the semiconductor layers 104, 106, 108, and 110 (refer to FIG. 18A). Here, for the conductive layer, an example is shown in which a conductive layer 130 and a conductive layer 132 are formed and stacked in order. Of course, the conductive layer may be formed as a single layer or as a multilayer structure of three or more layers.

The conductive layers 130 and 132 can be formed using one or more of the elements tantalum (Ta), tungsten (W), titanium (Ti), molybdenum (Mo), aluminum (Al), copper (Cu), chromium (Cr), niobium (Nb), or the like; or as an alloy material or compound material with one or more of these elements as the main component or components. Alternatively, the conductive layers 130 and 132 can be formed as a metal nitride layer of a nitride of one or more of these elements, as well. In addition, the conductive layers 130 and 132 may be formed using a semiconductor material represented by polycrystalline silicon doped with an impurity element such as phosphorus or the like.

Here, the conductive layer 130 is formed using tantalum nitride, and the conductive layer 132 is formed over the conductive layer 130 as a multilayer structure using tungsten. Furthermore, in addition to this structure, the conductive layer 130 may be formed using a single-layer or multilayer structure formed of materials such as tungsten nitride, molybdenum nitride, titanium nitride, or the like; and the conductive layer 132 may be formed using a single-layer or multilayer structure formed of materials such as tantalum, molybdenum, titanium, or the like.

Next, by removal by etching of selected portions of the conductive layers 130 and 132, which are provided as a multilayer structure, portions of the conductive layers 130 and 132 formed over the semiconductor layers 104, 106, 108, and 110 are left remaining, and conductive layers 134, 136, 138, and 140, each functioning as a gate electrode, are formed (refer to FIG. 18B). It is to be noted that the conductive layer 138 formed over the semiconductor layer 108 provided in the memory component functions as a control gate in a nonvolatile memory element to be completed later. In addition, the conductive layers 134, 136, and 140 function as gate electrodes in transistors to be completed later.

Next, a resist 142 is formed so as to cover selected portions of the semiconductor layer 104, and impurity regions are formed by the introduction of an impurity element into the semiconductor layers 106, 108, and 110, with the resist 142 and the conductive layers 136, 138, and 140 acting as masks (refer to FIG. 18C). For the impurity element, an impurity element imparting n-type conductivity or an impurity element imparting p-type conductivity is used. For an impurity element imparting n-type conductivity, phosphorus (P), arsenic (As), or the like can be used. For an impurity element imparting p-type conductivity, boron (B), aluminum (Al), gallium (Ga), or the like can be used. Here, phosphorus (P) is used for the impurity element.

In FIG. 18C, by introduction of an impurity element, impurity regions 146 each forming a source region or drain region and a channel formation region 144 are formed in the semiconductor layer 106. In addition, in the semiconductor layer 108, impurity regions 150 forming a source region or drain region and a channel formation region 148 are formed. Furthermore, in the semiconductor layer 110, impurity regions 154 forming a source region or drain region and a channel formation region 152 are formed. After this, the resist 142 is removed.

Next, a resist 156 is formed so as to cover selected portions of the semiconductor layers 106, 108, and 110, and impurity regions are formed by the introduction of an impurity element into the semiconductor layer 104, with the resist 156 and the conductive layer 134 acting as masks (refer to FIG. 19A and FIG. 23). For the impurity element, an impurity element imparting n-type conductivity or an impurity element imparting p-type conductivity is used. For an impurity element imparting n-type conductivity, phosphorus (P), arsenic (As), or the like can be used. For an impurity element imparting p-type conductivity, boron (B), aluminum (Al), gallium (Ga), or the like can be used. Here, an impurity element (for example, boron (B)) imparting conductivity of a type differing from the conductivity type imparted by the impurity element introduced into the semiconductor layers 106, 108, and 110, in FIG. 18C, is introduced into the semiconductor layer 104. As a result, impurity regions 160 each forming a source region or drain region and a channel formation region 158 are formed in the semiconductor layer 104. After this, the resist 156 is removed.

Next, an insulating layer 162 is formed so as to cover the third insulating layer 128 and the conductive layers 134, 136, 138, and 140, and a conductive layer 164 is formed over the insulating layer 162 to be electrically connected to the impurity regions 146, 150, 154, and 160 formed in the semiconductor layers 104, 106, 108, and 110, respectively (refer to FIG. 19B and FIG. 24).

The insulating layer 162 may be formed by a CVD method, a sputtering method, or the like as a single-layer or multilayer structure formed from materials such as an insulating layer containing oxygen or nitrogen such as silicon oxide, silicon nitride, silicon oxynitride, or the like; a layer containing carbon such as DLC (diamond-like carbon) or the like; an organic material such as epoxy, polyimide, polyamide, polyvinyl phenol, benzocyclobutene, acryl, or the like; and siloxane materials such as a siloxane resin or the like. It is to be noted that siloxane materials correspond to materials containing a Si—O—Si bond. Siloxane includes a skeletal structure of a bond of silicon (Si) and oxygen (O). For a substituent, an organic group (for example, an alkyl group or an aromatic hydrocarbon group) containing at least hydrogen is used. For a substituent, a fluoro group can also be used. In addition, for a substituent, an organic group containing hydrogen, at least, and a fluoro group may be used.

The conductive layer 164 can be formed by a CVD method, a sputtering method, or the like as single-layer or multilayer using one or more elements of aluminum (Al), tungsten (W), titanium (Ti), tantalum (Ta), molybdenum (Mo), nickel (N1), platinum (Pt), copper (Cu), gold (Au), silver (Ag), manganese (Mn), neodymium (Nd), carbon (C), and silicon (Si); or an alloy material or a compound material with one or more of these elements as the main component or components. An alloy material with aluminum as the main component corresponds to, for example, a material containing nickel with aluminum as the main component or an alloy material containing nickel and either carbon or silicon or both carbon and silicon with aluminum as the main component. For the conductive layer 164, a multilayer structure, for example, a multilayer structure of a barrier layer, an aluminum-silicon (Al—Si) layer, and a barrier layer or a multilayer structure of a barrier layer, an aluminum-silicon (Al—Si) layer, a titanium nitride (TiN) layer, and a barrier layer, may be employed. It is to be noted that the barrier layer corresponds to a thin film made up of titanium, a nitride of titanium, molybdenum, or a nitride of molybdenum. Because aluminum and aluminum-silicon have low resistance and are inexpensive, aluminum and aluminum-silicon are the most suitable materials for forming the conductive layer 164. In addition, with formation of an upper barrier layer and a lower barrier layer, the generation of a hillock of aluminum or aluminum-silicon can be prevented. Furthermore, with formation of a barrier layer using titanium, an easily reducible element, even if a thin, natural oxide layer is formed over a crystalline semiconductor layer, this natural oxide layer is reduced, and good contact with the crystalline semiconductor layer can be obtained.

It is to be noted that, in the present embodiment, an example (FIG. 17C) is shown in which an insulating layer functioning as a control insulating film of a nonvolatile memory element in a memory component and a gate insulating film of a thin film transistor formed in a logic component are formed simultaneously; however, the embodiment is not limited to being formed in this way. For example, a structure may be formed as shown in FIGS. 20A to 20C. Hereinafter, a specific explanation will be given.

First, after a structure formed in the same manner as the structure up to FIG. 17A has been formed, a third insulating layer 128 is formed over a charge accumulation layer 122 (FIG. 20A). Next, after a resist 124 is formed so as to cover selected portions of a semiconductor layer 108, selected portions of a charge accumulation layer 122 and a third insulating layer 128 formed above the semiconductor layers 104, 106, and 110 are removed (FIG. 20B). After that, insulating layers 168 and 170 functioning as gate insulating films are formed over exposed surfaces of semiconductor layers 104 and 106. The insulating layers 168 and 170 may be formed using high density plasma treatment as is explained in formation of the second insulating layers 116, 118, and 120, or the insulating layers 168 and 170 may be formed using a CVD method or a sputtering method.

By formation of a structure as shown in FIGS. 20A to 20C, a gate insulating film of a thin film transistor formed in a logic component and a control insulating film of a nonvolatile memory element formed in a memory component can be formed at different thicknesses and using different materials.

In addition, in the steps shown in the present embodiment, an insulating layer 172 (also referred to as a sidewall) may be formed so as to be in contact with a side surface of each of the conductive layers 134, 136, 138, and 140 functioning as gate electrodes (refer to FIGS. 21A and 21B). By introduction of an impurity element into the semiconductor layers 104, 106, 108, and 110, with the insulating layer 172 acting as a mask, low-concentration impurity regions 180, 174, 176, and 178, each functioning as an LDD, can be formed in the semiconductor layers 104, 106, 108, and 110.

It is to be noted that the insulating layer 172 may be formed so as to be in direct contact with the semiconductor layer 104 (refer to FIG. 21A), and a structure may be provided in which another insulating layer or charge accumulation layer is formed below the insulating layer 172 (refer to FIG. 21B).

Figure 46:
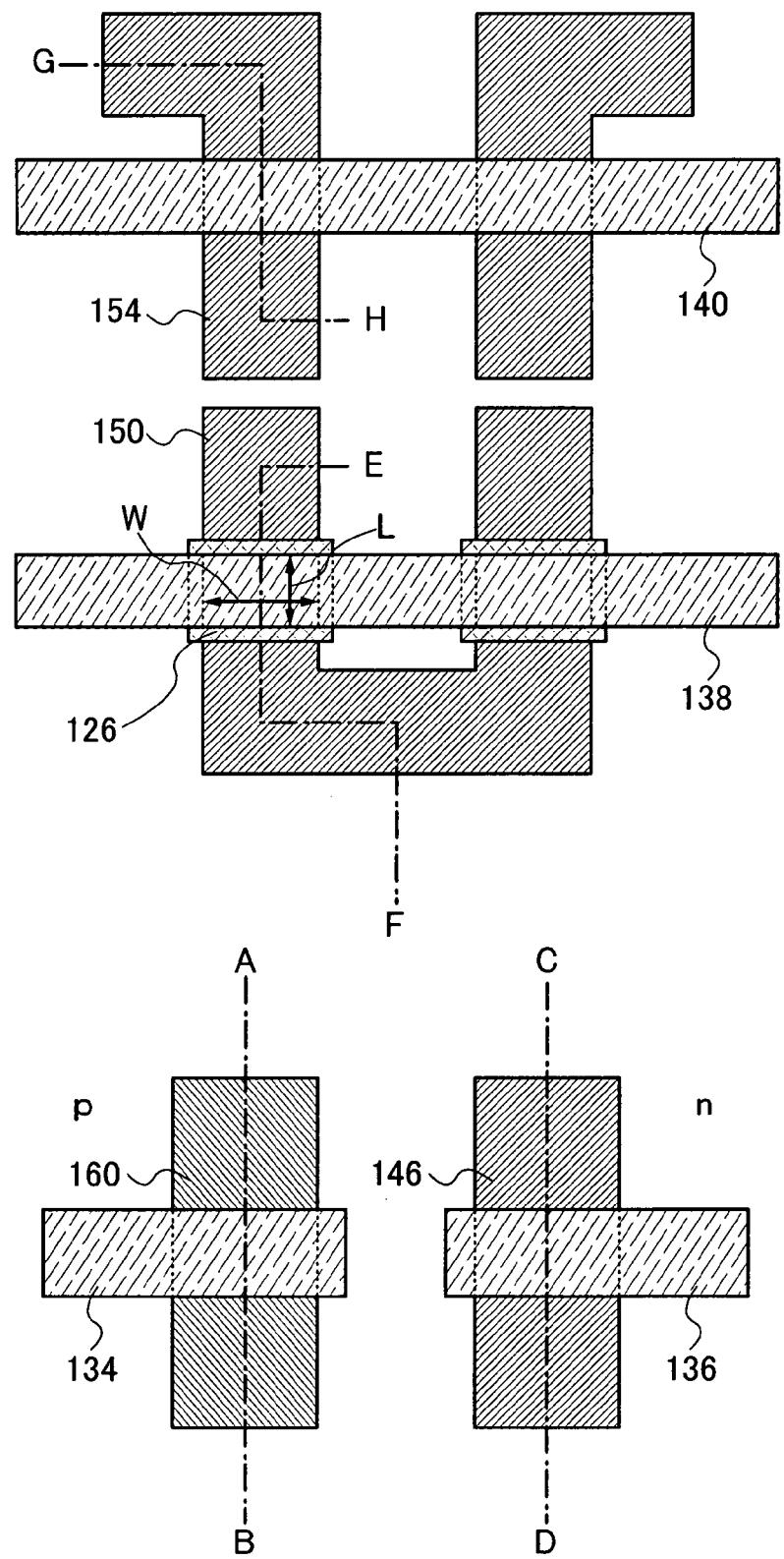
FIG. 46 is a diagram used to illustrate an example of a top view of the nonvolatile semiconductor memory device of the present invention.

In addition, in the present embodiment, a structure in which the charge accumulation layer 126 is formed above the entire surface of the semiconductor layer 108 provided in a memory component is described; however, the present embodiment is not limited to this structure. For example, the structure may be a structure in which the charge accumulation layer 126 is formed as selected over a portion in which the semiconductor layer 108 and the conductive layer 138 intersect (refer to FIG. 46). It is to be noted that when, in a nonvolatile memory element, channel length is set to L and channel width is set to W, the charge accumulation layer 126 may be formed so as to have dimensions larger than the channel length L and the channel width W (refer to FIG. 46), the charge accumulation layer 126 may be formed so as to have a dimension larger than either the channel length L or the channel width W, or the charge accumulation layer 126 may be formed so as to have dimensions smaller than the channel length L and the channel width W (which is the condition when the charge accumulation layer is formed over the semiconductor layer 108).

Steps in the present embodiment can be performed in combination with steps in the Embodiment Mode or in other embodiments described in the present specification.

EMBODIMENT 2

In the present embodiment, a manufacturing method of a nonvolatile semiconductor memory device differing from the manufacturing method of the above embodiment will be explained with reference to drawings. It is to be noted that elements that are the same as those referred to in the above embodiment are denoted by the same reference numerals and detailed descriptions thereof will be omitted. In FIGS. 25A to 25C, FIGS. 26A to 26C, and FIGS. 27A to 27C, the interval taken along A-B and the interval taken along C-D show a thin film transistor provided in a logic component, the interval taken along E-F shows a nonvolatile memory element provided in a memory component, and the interval along G-H shows a thin film transistor provided in a memory component.

First, as described in the above embodiment mode, after a structure formed in the same manner as the structure up to FIG. 16A has been formed, a resist 114 is formed as selected so as to cover edges of semiconductor layers 104, 106, and 108 and a semiconductor layer 110. Selected portions of a first insulating layer 112 that are not covered by the resist 114 are removed (refer to FIG. 25A). That is to say, here, a structure in which the semiconductor layer 110 and edges of the semiconductor layers 104, 106, and 108 are covered by the first insulating layer 112 is used.

When the first insulating layer 112 formed over the semiconductor layers 104, 106, and 108 is removed entirely by etching, the first insulating layer 112 is formed in order to prevent formation of a depression (a countersink) in an insulating layer 102 in the edges of the semiconductor layers 104, 106, and 108 and a portion of the insulating layer 102. When a depression is formed in the insulating layer 102, because problems such as covering defectiveness or the like are generated when an insulating layer or the like is formed to cover the semiconductor layers 104, 106, and 108 after the depression is formed, in this way, covering the edges of the semiconductor layers 104, 106, and 108 with a first insulating layer 112 becomes effective. After this, the resist 114 is removed.

Next, second insulating layers 116, 118, and 120 are formed over the semiconductor layers 104, 106, and 108, respectively (refer to FIG. 25B). The second insulating layers 116, 118, and 120 can be formed using any one of the methods described in the above embodiment. Here, by performance of oxidation and nitridation in succession using high density plasma treatment, after silicon oxide layers are formed for the second insulating layers 116, 118, and 120, nitrogen plasma treated layers each with a high concentration of nitrogen are formed over the surface or near the surface of the silicon oxide layer.

Next, a charge accumulation layer 122 is formed over the first insulating layer 112 formed over a semiconductor layer 110 and over the second insulating layers 116, 118, and 120 (refer to FIG. 25C). The charge accumulation layer 122 can be formed using any of the materials described in the above embodiment. Here, the charge accumulation layer 122 is formed as a germanium nitride layer containing germanium particles.

Next, selected portions of the second insulating layers 116 and 118 and the charge accumulation layer 122 formed over the semiconductor layers 104 and 106 are removed, and the second insulating layer 120 and the charge accumulation layer 122 formed over the semiconductor layer 108 and the charge accumulation layer 122 formed over the semiconductor layer 110 are left remaining. Here, selected portions of the semiconductor layer 108 and semiconductor layer 110 provided in the memory component are covered by a resist 124, and selected portions of the second insulating layers 116 and 118 and charge accumulation layer 122 that are not covered by the resist 124 are removed by etching (refer to FIG. 26A). It is to be noted that, in FIG. 26A, an example is shown in which, by removal of selected portions of the charge accumulation layer 122 by etching, a portion of the charge accumulation layer 122 is left remaining and a charge accumulation layer 126 is formed. As described in the above embodiment, the charge accumulation layer 122 formed above the semiconductor layer 110 may be removed. After this, the resist 124 is removed.

Next, a third insulating layer 128 is formed so as to cover the semiconductor layers 104 and 106 and the charge accumulation layer 126 formed over the semiconductor layers 108 and 110 (refer to FIG. 26B).

The third insulating layer 128 may be formed using any of the materials described in the above embodiment. For example, the third insulating layer 128 may be formed using a silicon oxynitride layer at a thickness greater than or equal to 5 nm and less than or equal to 50 nm by a CVD method.

It is to be noted that the third insulating layer 128 formed above the semiconductor layer 108 functions as a control insulating layer in a nonvolatile memory element to be completed later, and the third insulating layer 128 formed over the semiconductor layers 104 and 106 functions as a gate insulating film in a transistor to be completed later.

Next, conductive layers 134, 136, 138, and 140, each functioning as a gate electrode, are formed over the semiconductor layers 104, 106, 108, and 110, respectively (refer to FIG. 26C). It is to be noted that the conductive layer 138 formed over the semiconductor layer 108 provided in a memory component functions as a control gate in a nonvolatile memory element to be completed later. In addition, the conductive layers 134, 136, and 140 function as gate electrodes in transistors to be completed later.

Next, a resist 142 is formed so as to cover selected portions of the semiconductor layer 104, and impurity regions are formed by the introduction of an impurity element into the semiconductor layer 106, 108, and 110, with the resist 142 and the conductive layers 136, 138, and 140 acting as masks (refer to FIG. 27A). For the impurity element, an impurity element imparting n-type conductivity or an impurity element imparting p-type conductivity may be used. For the impurity element imparting n-type conductivity, phosphorus (P), arsenic (As), or the like can be used. For the impurity element imparting p-type conductivity, boron (B), aluminum (Al), gallium (Ga), or the like can be used. Here, phosphorus (P) is used for the impurity element. After this, the resist 142 is removed.

In FIG. 27A, by the introduction of an impurity element, impurity regions 146 each forming a source region or drain region and a channel formation region 144 are formed in the semiconductor layer 106. In addition, in the semiconductor layer 108, impurity regions 150 each forming a source region or drain region and a channel formation region 148 are formed. Furthermore, in the semiconductor layer 110, impurity regions 154 each forming a source region or drain region and a channel formation region 152 are formed.

Next, a resist 156 is formed so as to cover selected portions of the semiconductor layers 106, 108, and 110, and impurity regions are formed by the introduction of an impurity element into the semiconductor layer 104, with the resist 156 and the conductive layer 134 acting as masks (refer to FIG. 27B). For the impurity element, an impurity element imparting n-type conductivity or an impurity element imparting p-type conductivity is used. For the impurity element imparting n-type conductivity, phosphorus (P), arsenic (As), or the like can be used. For the impurity element imparting p-type conductivity, boron (B), aluminum (Al), gallium (Ga), or the like can be used. Here, an impurity element (for example, boron (B)) imparting conductivity of a type differing from the conductivity type imparted by the impurity element introduced into the semiconductor layers 106, 108, and 110, in FIG. 27A, is introduced into the semiconductor layer 104. As a result, impurity regions 160 each forming a source region or drain region and a channel formation region 158 are formed in the semiconductor layer 104. After this, the resist 156 is removed.

Next, an insulating layer 162 is formed so as to cover the third insulating layer 128 and the conductive layers 134, 136, 138, and 140, and a conductive layer 164 is formed over the insulating layer 162 so as to be electrically connected to the impurity regions 160, 150, 154, and 146 formed in the semiconductor layers 104, 106, 108, and 110, respectively (refer to FIG. 27C).

The insulating layer 162 and the conductive layer 164 can be formed using any of the materials described in the above embodiment.

Steps in the present embodiment can be performed in combination with steps in the Embodiment Mode or in other embodiments described in the present specification.

EMBODIMENT 3

In the present embodiment, a manufacturing method of a nonvolatile semiconductor memory device differing from the manufacturing method of the above embodiments will be explained with reference to drawings. It is to be noted that elements that are the same as those referred to in the above embodiments are denoted by the same reference numerals and detailed descriptions thereof will be omitted. In FIGS. 28A to 28C, FIGS. 29A to 29C, and FIGS. 30A to 30C, the interval along A-B and the interval along C-D show a thin film transistor provided in a logic component, the interval along E-F shows a nonvolatile memory element provided in a memory component, and the interval along G-H shows a thin film transistor provided in a memory component.

First, a semiconductor layer 103 is formed over a substrate 100 with an insulating layer 102 interposed between the substrate 100 and the semiconductor layer 103, and a first insulating layer 112 is formed over the semiconductor layer 103 (refer to FIG. 28A).

The semiconductor layer 103 is formed as an amorphous semiconductor layer over the insulating layer 102, which has been formed over the substrate 100 in advance, using a sputtering method, an LPCVD method, a plasma CVD method, or the like with a material or the like containing silicon as the main component. The amorphous semiconductor layer can be formed by crystallization. It is to be noted that crystallization of the amorphous semiconductor layer may be performed using a laser crystallization method, a thermal crystallization method using an RTA method or an annealing furnace, a thermal crystallization method using a metallic element that promotes crystallization, or a method in which one or more of any of these methods are combined.

Next, a resist 114 is formed over selected portions of the first insulating layer 112, and a second insulating layer 113 can be formed by etching using the resist 114 as a mask and allowing a portion of the first insulating layer 112 to remain (refer to FIG. 28B).

Next, a second insulating layer 115 is formed over the exposed semiconductor layer 103 (refer to FIG. 28C).

The second insulating layer 115 can be formed by performance of heat treatment, plasma treatment, or the like of the exposed semiconductor layer 103. For example, by performance of oxidation, nitridation, or oxynitridation of the semiconductor layer 103 by high density plasma treatment, a silicon oxide layer with a nitrogen plasma treated layer on the surface or near the surface can be formed over the semiconductor layer 103 as the second insulating layer 115. It is to be noted that the second insulating layer 115 may be formed using a CVD method or a sputtering method and then performance of high density plasma treatment of the layer formed by the CVD method or sputtering method.

For example, when oxidation or nitridation is performed by high density plasma treatment using a semiconductor layer that contains Si as the main component for the semiconductor layer 103, the second insulating layer 115 may be formed as a silicon oxide layer or as a silicon nitride layer. In addition, when oxidation of the semiconductor layer 103 is performed by high density plasma treatment, nitridation may be performed by performance of another high density plasma treatment. In this case, a silicon oxide layer is formed in contact with the semiconductor layer 103, and a nitrogen plasma treated layer is formed over the surface or near the surface of the silicon oxide layer.

Here, the second insulating layer 115 is formed at a thickness greater than or equal to 1 nm and less than or equal to 10 nm; preferably, the second insulating layer 115 is formed at a thickness greater than or equal to 1 nm and less than or equal to 5 nm. For example, after a silicon oxide layer is formed over the surface of the semiconductor layer 103 by oxidation of the semiconductor layer 103 by high density plasma treatment, a nitrogen plasma treated layer is formed over the surface or near the surface of the silicon oxide layer by performance of nitridation by high density plasma treatment. In addition, at this time, it is preferable that oxidation and nitridation be performed consecutively by high density plasma treatments without any exposure to the atmosphere. By performance of high density plasma treatments consecutively, prevention of the introduction of contaminants and improvement in production efficiency can be achieved. Furthermore, in this instance, there may be cases in which the surface of the first insulating layer 113 is oxidized or nitrided and a silicon oxynitride layer is formed.

Next, a charge accumulation layer 122 is formed over the second insulating layer 115 and the first insulating layer 113 (refer to FIG. 29A). The charge accumulation layer 122 may be formed using any of the materials described in the above embodiments. Here, the charge accumulation layer 122 is formed using a germanium nitrogen layer.

Next, a resist 123 is formed over selected portions of the first insulating layer 133 and the second insulating layer 115. Selected portions of the second insulating layer 115 and the charge accumulation layer 122 are removed with the resist 123 acting as a mask and a multilayer structure of the second insulating layer 115 and the charge accumulation layer 122 are left remaining, whereby a second insulating layer 120 and a charge accumulation layer 126 are formed. In addition, with the charge accumulation layer 122 formed over the first insulating layer 113 left remaining, a charge accumulation layer 127 is formed. It is to be noted that it is possible to remove the charge accumulation layer 127 (refer to FIG. 29B). The second insulating layer 120 provided in a memory component functions as a tunneling insulating layer in a nonvolatile memory element to be completed later.

Next, island-like semiconductor layers 104, 106, 108, and 110 are formed by etching of selected portions of the semiconductor layer 103 (refer to FIG. 29C).

Figure 30A:
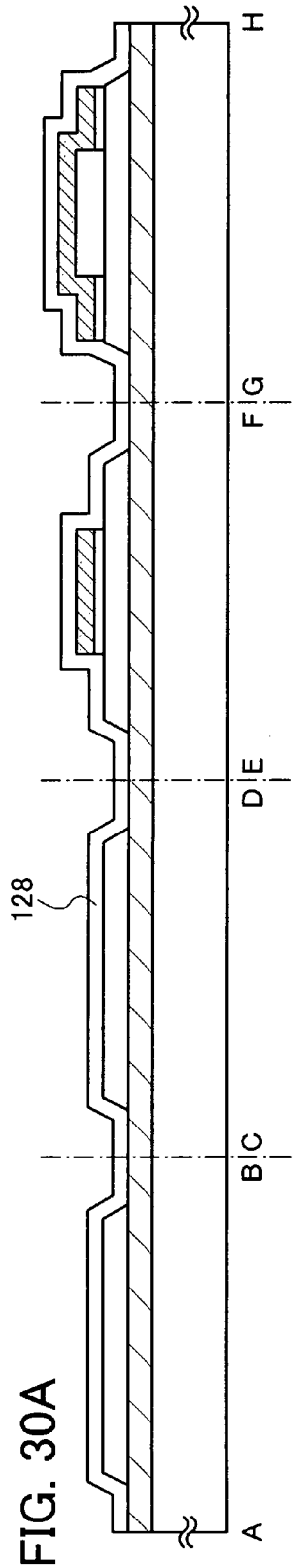
FIGS. 30A to 30C are diagrams used to illustrate an example of a manufacturing method of the nonvolatile semiconductor memory device of the present invention.

Next, a third insulating layer 128 is formed so as to cover the semiconductor layers 104 and 106, the charge accumulation layer 126 formed over the semiconductor layer 108, and the charge accumulation layer 127 formed over the semiconductor layer 110 (refer to FIG. 30A).

Figure 30B:
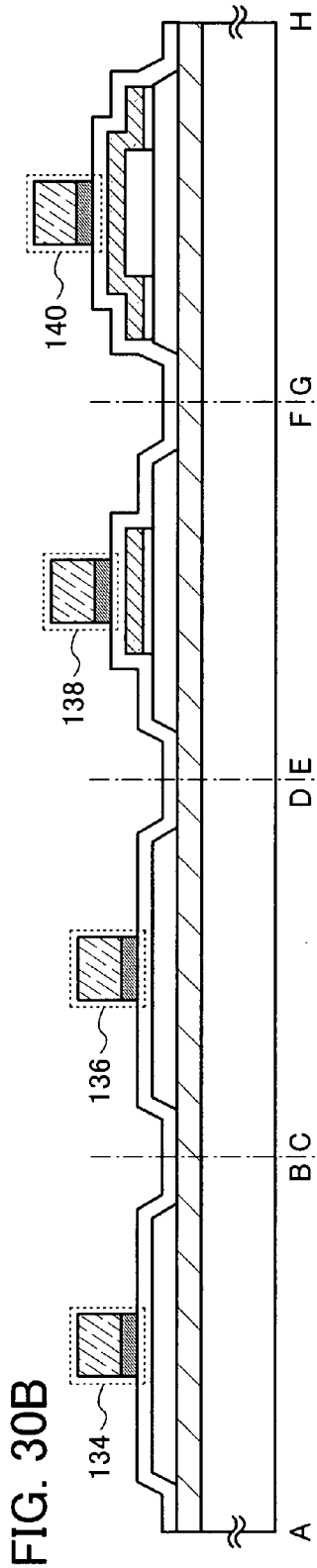

Next, conductive layers 134, 136, 138, and 140, each functioning as a gate electrode, are formed above the semiconductor layers 104, 106, 108, and 110, respectively (refer to FIG. 30B). It is to be noted that the conductive layer 138 formed above the semiconductor layer 108 provided in the memory component functions as a control gate in a nonvolatile memory element to be completed later. In addition, the conductive layers 134, 136, and 140 function as gate electrodes in transistors to be completed later.

Figure 30C:
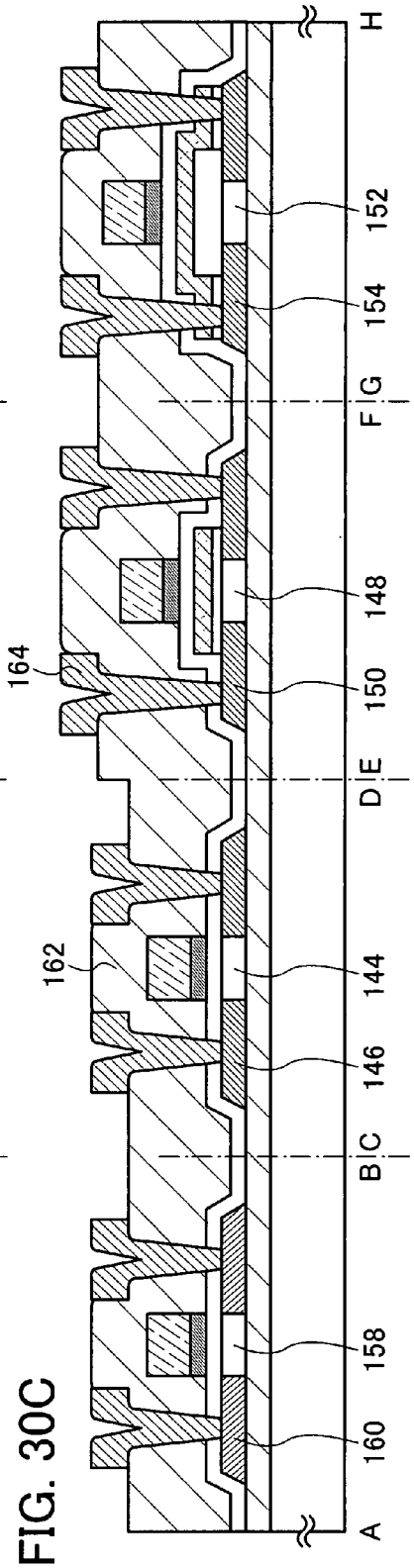

Next, as described in the above embodiments, after a channel formation region and impurity regions are formed in each of the semiconductor layers 104, 106, 108, and 110, an insulating layer 162 is formed so as to cover the third insulating layer 128 and the conductive layers 134, 136, and 140, and a conductive layer 164 is formed over the insulating layer 162 so as to be electrically connected to the impurity regions 160, 150, 154, and 146 formed in the semiconductor layers 104, 106, 108, and 110, respectively (refer to FIG. 30C).

Steps in the present embodiment can be performed in combination with steps in the Embodiment Mode or in other embodiments described in the present specification.

EMBODIMENT 4

Figure 40A:
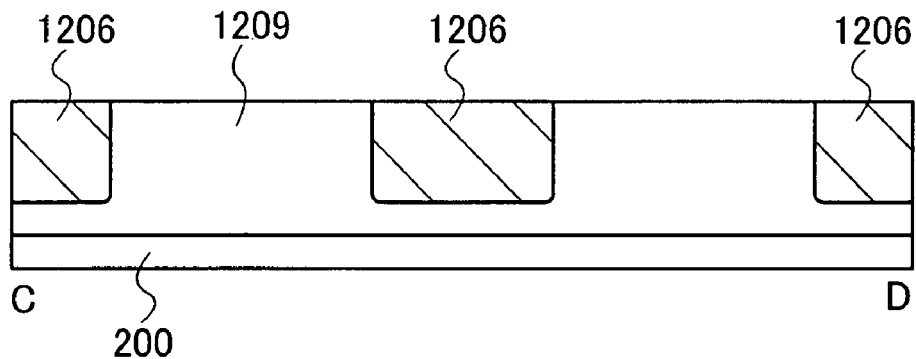
FIGS. 40A to 40C are diagrams used to illustrate an example of a manufacturing method of the nonvolatile semiconductor memory device of the present invention.
Figure 40B:
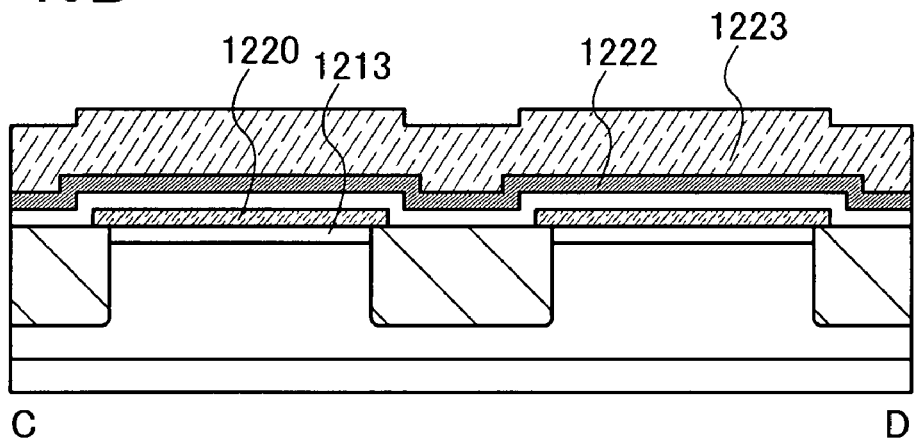
Figure 40C:
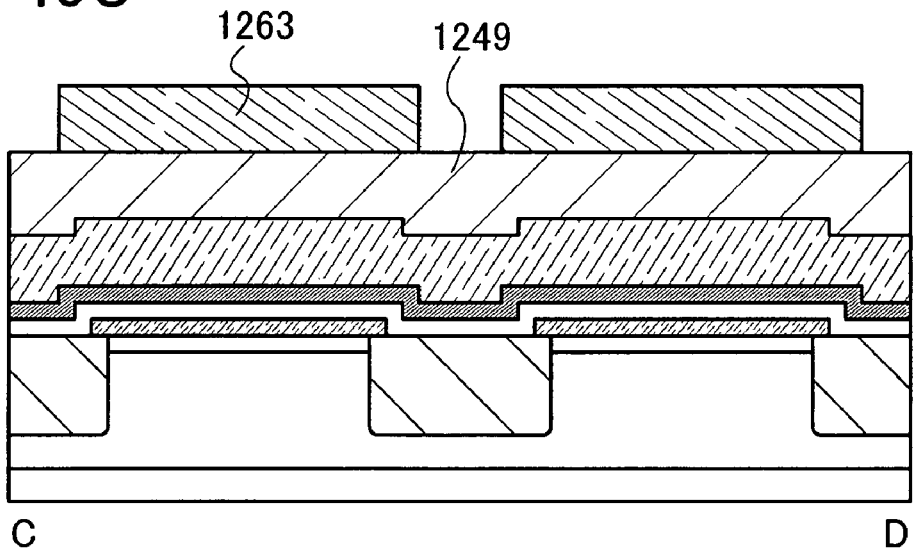

In the present embodiment, a manufacturing method of a nonvolatile semiconductor memory device differing from the manufacturing method of the above embodiments will be explained with reference to drawings. It is to be noted that FIGS. 37A and 37B, FIGS. 38A and 38B, and FIGS. 39A and 39B show top views; FIGS. 31A to 31C, FIGS. 32A to 32C, FIGS. 33A to 33C, FIGS. 34A to 34C, and FIGS. 35A to 35C are cross-sectional views of lines A-B and E-F from FIGS. 37A and 37B, FIGS. 38A and 38B, and FIGS. 39A and 39B; and FIGS. 40A to 40C are cross-sectional views of line C-D from FIG. 37A, FIG. 38A and FIG. 39A. In addition, the interval taken along A-B shows a transistor and a nonvolatile memory element provided in a memory component, the interval taken along C-D shows a nonvolatile memory element provided in a memory component, and the interval taken along E-F shows a transistor provided in a logic component. In addition, a transistor provided in a region 1207 of a substrate 1200 shown in the interval taken along E-F is set to be a p-channel transistor, and a transistor provided in a region 1208 is set to be an n-channel transistor; a transistor provided in a region 1209 of the substrate 1200 shown in the interval taken along A-B is set to be an n-channel transistor. A case will be explained in which the mobility of carriers in a nonvolatile memory element is performed using electrons; however, the nonvolatile semiconductor device of the present invention is not limited to this.

First, an insulating layer is formed over a substrate 1200. Here, single-crystal Si with n-type conductivity is used for the substrate 1200, and an insulating layer 1201 and an insulating layer 1202 are formed over the substrate 1200 (refer to FIG. 31A). For example, silicon oxide is formed as the insulating layer 1201 by performance of heat treatment of the substrate 1200, and silicon nitride is formed over the insulating layer 1202 by a CVD method.

In addition, there are no particular limitations on a substrate used for the substrate 1200, as long as the substrate is a semiconductor substrate. For example, a single-crystal Si substrate with n-type or p-type conductivity, a compound semiconductor substrate (a GaAs substrate, an InP substrate, a GaN substrate, an SiC substrate, a sapphire substrate, a ZnSe substrate, or the like), an SOI (Silicon On Insulator) substrate formed using an affixing method or a SIMOX (Separation by IMplanted OXygen) method, or the like can be used.

Furthermore, the insulating layer 1202 may be formed by nitridation of the insulating layer 1201 by high density plasma treatment after the insulating layer 1201 has been formed. It is to be noted that an insulating layer formed over the substrate 1200 may be formed as a single-layer structure or as a multilayer structure of three or more layers.

Next, a pattern of a resist mask 1203 is formed over selected portions of the insulating layer 1202, and depressions 1204 are formed in selected portions of the substrate 1200 by performance of selective etching using the resist mask 1203 as a mask (refer to FIG. 31B). For etching of the substrate 1200 and the insulating layers 1201 and 1202, dry etching using plasma can be performed.

Next, after the pattern of the resist mask 1203 is removed, an insulating layer 1205 is formed over the substrate 1200 so that the depressions 1204 are filled (refer to FIG. 31C).

The insulating layers 1205 are formed using insulating materials, such as a material such as silicon oxide, silicon nitride, silicon nitride containing oxygen, silicon oxide containing nitride, or the like, by a CVD method, a sputtering method, or the like. Here, the insulating layers 1205 are formed as silicon oxide layers using a TEOS (tetraethyl orthosilicate) gas by an atmospheric pressure CVD method or by a low pressure CVD method.

Next, by performance of a grinding treatment, a polishing treatment, or a CMP (Chemical Mechanical Polishing) treatment, the surface of the substrate 1200 is exposed. Here, by exposure of the surface of the substrate 1200, regions 1207, 1208, and 1209 are formed in between regions 1206 formed in the depressions 1204 of the substrate 1200. It is to be noted that the regions 1206 are obtained by removal of the insulating layers 1205 formed over the surface of the substrate 1200 by a grinding treatment, a polishing treatment, or a CMP treatment. By introduction of an impurity element with p-type conductivity as selected, p-wells 1210 are formed in the regions 1208 and 1209 of the substrate 1200 (refer to FIG. 32A, FIGS. 37A and 37B, and FIG. 40A).

For an impurity element imparting p-type conductivity, boron (B), aluminum (Al), gallium (Ga), or the like can be used. Here, for the impurity element, boron (B) is introduced into the regions 1208 and 1209.

It is to be noted that, in the present embodiment, because a semiconductor substrate with n-type conductivity is used for the substrate 1200, no impurity element is introduced into the region 1207, but an n-well may be formed in the region 1207 by introduction of an impurity element imparting n-type conductivity. For the impurity element imparting n-type conductivity, phosphorus (P), arsenic (As), or the like can be used.

On the other hand, when a semiconductor substrate with p-type conductivity is used for the substrate 1200, the structure may be a structure in which an n-well is formed in the region 1207 by introduction of an impurity element imparting n-type conductivity and introduction of an impurity element into the regions 1208 and 1209 is not performed.

Figure 32A:
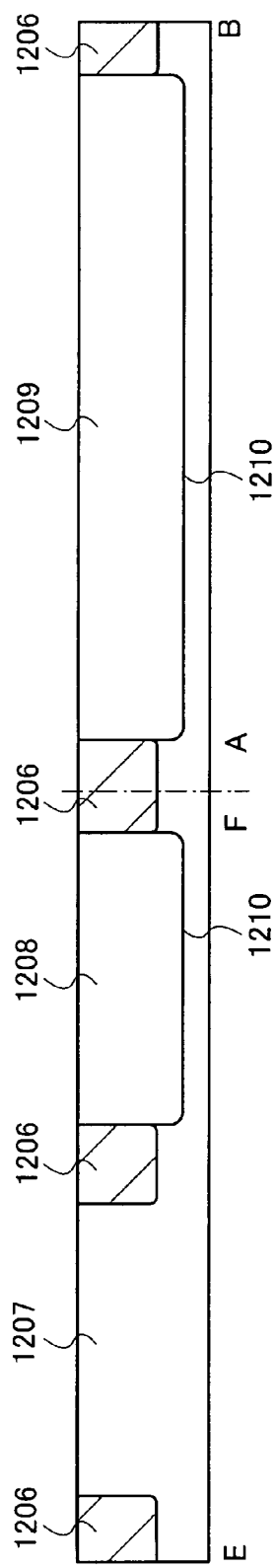
FIGS. 32A to 32C are diagrams used to illustrate an example of a manufacturing method of the nonvolatile semiconductor memory device of the present invention.
Figure 32B:
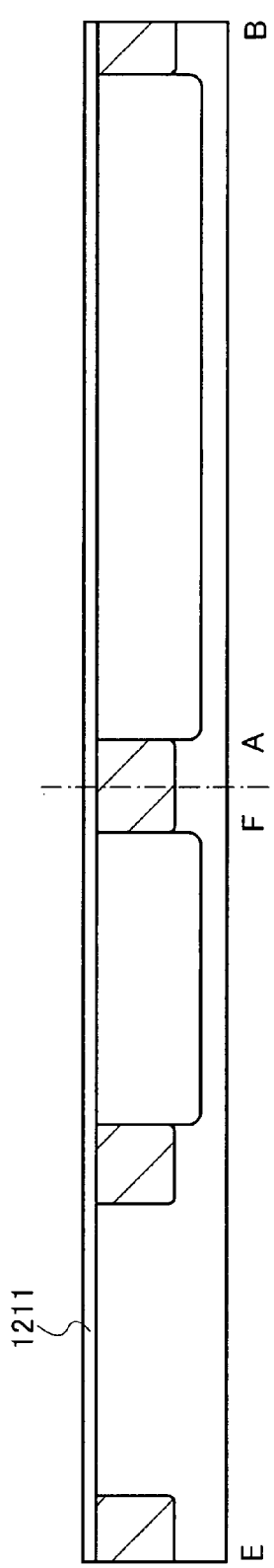
Figure 32C:
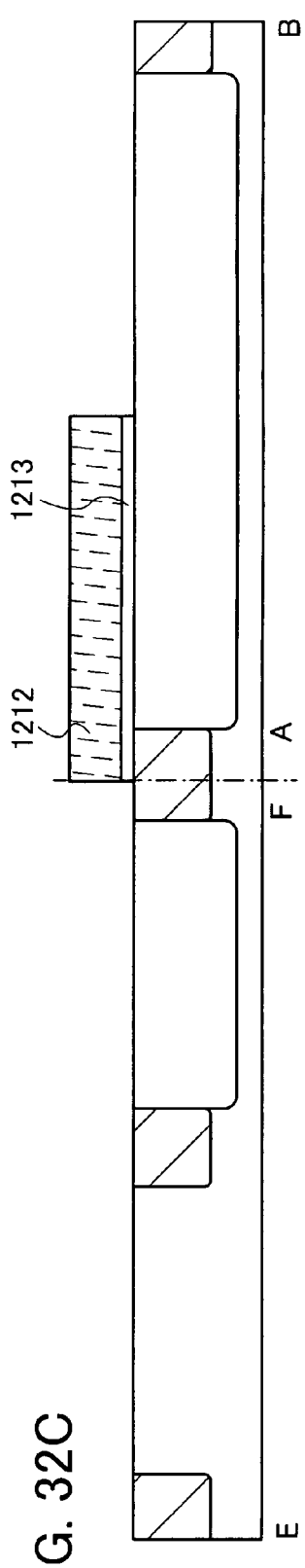

Next, a first insulating layer 1211 is formed over the regions 1207, 1208, and 1209 provided in the substrate 1200 (refer to FIG. 32B).

The first insulating layer 1211 can be formed in a manner similar to the manner in which a first insulating layer 112 described in Embodiment 1 is formed. Here, the first insulating layer 1211 is formed by a CVD method using silicon oxynitride.

It is to be noted that the first insulating layer 1211 formed in the region 1209 in which part of the substrate 1200 is exposed functions as a gate insulating film in a thin film transistor to be completed later.

Next, a resist mask 1212 is formed so as to cover selected portions of the first insulating layer 1211 formed in the region 1209 of the substrate 1200, and selected portions of the first insulating layers 1211 formed in the regions 1207 and 1208 of the substrate 1200 are removed. A portion of the first insulating layer 1211 formed in the region 1209 that has been left remaining is set to be a first insulating layer 1213 is formed (refer to FIG. 32C).

Next, after the resist mask 1212 is removed, second insulating layers 1214, 1215, and 1216 are formed over a portion of the surface of each of the regions 1207, 1208, and 1209, respectively. Next, a charge accumulation layer 1217 is formed so as to cover the first insulating layer 1213 and the second insulating layers 1214, 1215, and 1216 (refer to FIG. 33A).

The second insulating layers 1214, 1215, and 1216 may be formed using plasma treatment, as was described above. For example, after the substrate 1200 is heated and the surface of each of the regions 1207, 1208, and 1209 is oxidized to form a silicon oxide layer, plasma treatment is performed on the surface of each of the silicon oxide layers and a nitrogen plasma treated layer with a high concentration of nitrogen is formed over the surface or near the surface of each of the silicon oxide layers. In addition, after oxidation has been performed on the surface of each of the regions 1207, 1208, and 1209 by high density plasma treatment, nitridation may be performed by performance of high density plasma treatment once again. In this case, a silicon oxide layer is formed in contact with the surface of each of the regions 1207, 1208, and 1209, and in the interface of the silicon oxide layer and a charge accumulation layer or near the interface of the silicon oxide layer, a nitrogen plasma treated layer with a high concentration of nitrogen is formed. In other words, by formation of a silicon oxide layer with a nitrogen plasma treated layer with a high concentration of nitrogen formed over the surface or near the surface of the silicon oxide layer, the second insulating layers 1214, 1215, and 1216 can be formed.

In addition to this, by oxidation of the surface of each of the regions 1207, 1208, and 1209 by performance of heat treatment on the substrate 1200, the second insulating layers 1214, 1215, and 1216 can be formed using silicon oxide layers.

Here, for the second insulating layers 1214, 1215, and 1216, after oxidation has been performed on the surface of each of the regions 1207, 1208, and 1209 provided in the substrate 1200 by high density plasma treatment, nitridation is performed, and stacked layers of a silicon oxide layer and a nitrogen plasma treated layer are formed.

In the present embodiment, the second insulating layer 1216 formed over the region 1209 provided in a memory component in the substrate 1200 functions as a tunnel oxide film in a nonvolatile memory element to be completed later. Consequently, when the thickness of the second insulating layer 1216 is made thinner, tunneling current flows easily and high speed operation for memory is enabled. In addition, when the thickness of the second insulating layer 1216 is made thinner, storing charge in the charge accumulation layer 1217 at a low voltage becomes possible, and power consumption of a nonvolatile semiconductor memory device can be reduced. For these reasons, it is preferable that the second insulating layer 1216 be formed thinly.

The charge accumulation layer 1217 can be formed of a germanium compound such as germanium nitride, germanium oxide, germanium nitride to which oxygen is added, germanium oxide to which nitrogen is added, germanium nitride to which oxygen and hydrogen are added, germanium oxide to which nitrogen and hydrogen are added, or the like. Here, the charge accumulation layer 1217 is formed in a manner similar to the manner in which the charge accumulation layer 122 described in Embodiment 1 is formed.

Next, a resist mask 1218 is formed over the charge accumulation layer 1217, and selected portions of the charge accumulation layer 1217 and the second insulating layers 1214, 1215, and 1216 are removed with the resist mask 1218 acting as a mask. Here, the resist mask 1218 is formed so as to cover a portion of the region 1209 in the substrate 1200, and by removal of the charge accumulation layer 1217 and the second insulating layers 1214, 1215, and 1216 that are not covered by the resist mask 1218, a portion of the second insulating layer 1216 and charge accumulation layer 1217 provided in the region 1209 are left remaining and set to be a second insulating layer 1219 and a charge accumulation layer 1220 (refer to FIG. 33B). Specifically, the second insulating layer 1219 and the charge accumulation layer 1220 provided in a region of the region 1209 formed as a nonvolatile memory element to be completed later are left remaining. Furthermore, the surface of each of the regions 1207 and 1208 and a portion of the surface of the region 1209 of the substrate 1200 are exposed.

Figure 33A:
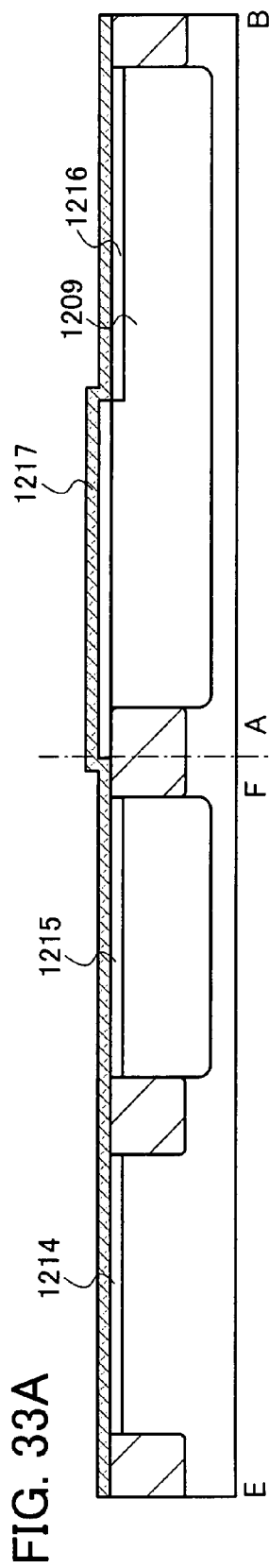
FIGS. 33A to 33C are diagrams used to illustrate an example of a manufacturing method of the nonvolatile semiconductor memory device of the present invention.
Figure 33B:
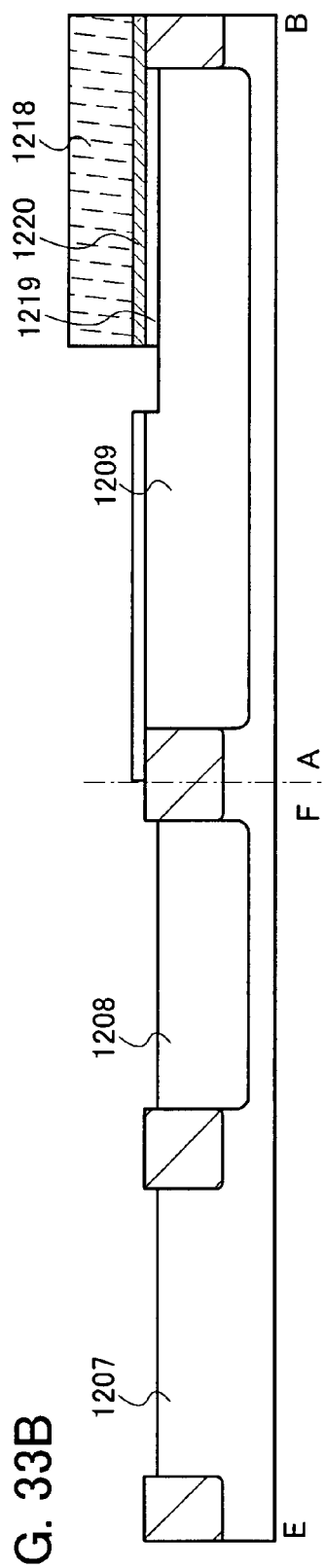
Figure 33C:
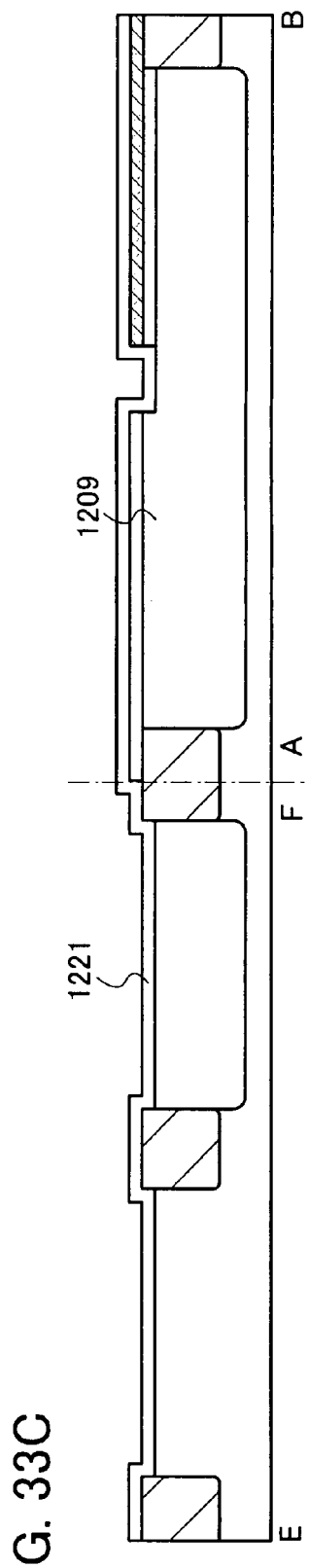

Next, after the resist mask 1218 is removed, a third insulating layer 1221 is formed so as to cover the regions 1207, 1208, and 1209 of the substrate 1200 and the charge accumulation layer 1220 (refer to FIG. 33C).

In a manner similar to the manner in which the first insulating layer 1211 is formed, the third insulating layer 1221 is formed by a CVD method, a sputtering method, or the like as a single-layer or multilayer structure using an insulating material such as silicon oxide, silicon nitride, silicon oxynitride or the like. Here, the third insulating layer 1221 is formed by a CVD method using silicon oxynitride.

It is to be noted that the third insulating layer 1221 formed over the charge accumulation layer 1220 in the region 1209 of the substrate 1200 functions as a control insulating film in a nonvolatile memory element to be completed later.

Figure 34A:
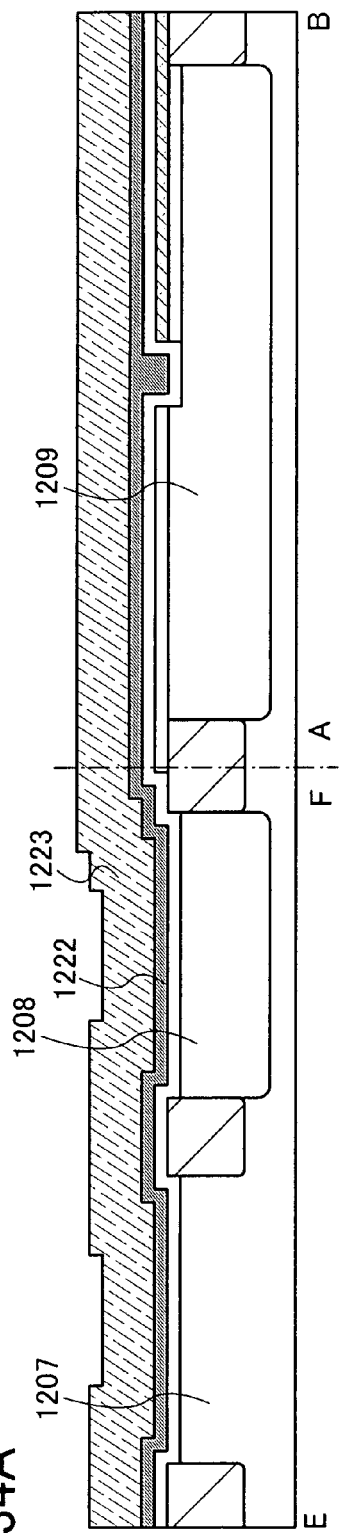
FIGS. 34A to 34C are diagrams used to illustrate an example of a manufacturing method of the nonvolatile semiconductor memory device of the present invention.

Next, a conductive layer is formed over the third insulating layer 1221 (refer to FIG. 34A). Here, for the conductive layer, an example is shown in which the conductive layer is formed as a stacked layer stacked in order of a conductive layer 1222 and a conductive layer 1223. Of course, the conductive layer may also be formed as a single layer or as a multilayer structure of three or more layers.

The conductive layers 1222 and 1223 may be formed in a manner similar to the manner in which the conductive layers 130 and 132 described in Embodiment 1 are formed.

Here, the conductive layer 1222 is formed using tantalum nitride, and a multilayer structure is provided with the conductive layer 1223 formed of tungsten being formed over the conductive layer 1222.

Figure 34B:
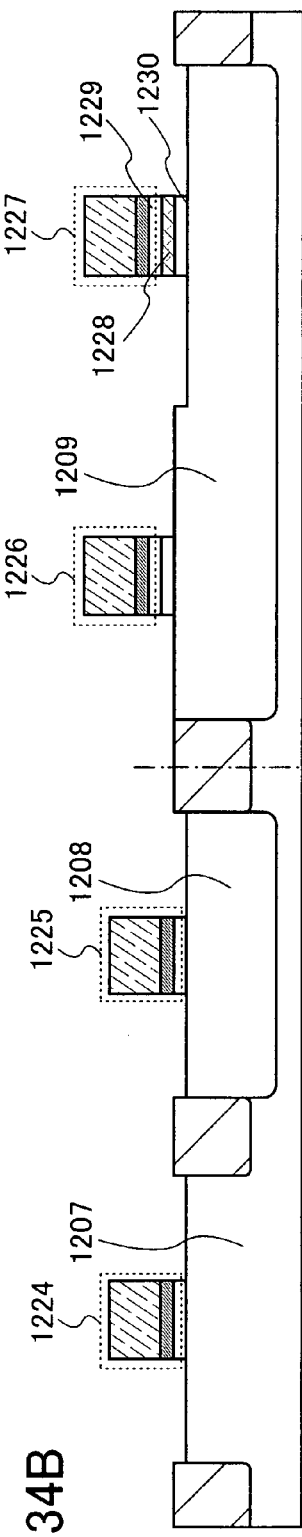

Next, by removal by etching of selected portions of the conductive layers 1222 and 1223 provided as a multilayer structure, the conductive layers 1222 and 1223 are left remaining in a portion formed above the regions 1207, 1208, and 1209 of the substrate 1200, and conductive layers 1224,

1225, 1226, and 1227, each functioning as a gate electrode, are formed (refer to FIG. 34B and FIG. 40B). In addition, here, in the substrate 1200, the surface of each of the regions 1207, 1208, and 1209 that do not overlap with the conductive layers 1224, 1225, 1226, and 1227 are set so as to be exposed. It is to be noted that the conductive layer 1227 functions as a control gate in a nonvolatile memory element to be completed later.

Specifically, in the region 1207 of the substrate 1200, selected portions of the third insulating layer 1221 formed below the conductive layer 1224 that do not overlap with the conductive layer 1224 are removed, and the conductive layer 1224 and the third insulating layer 1221 are formed so that their edges roughly coincide. In addition, in the region 1208 of the substrate 1200, selected portions of the third insulating layer 1221 formed below the conductive layer 1225 that do not overlap with the conductive layer 1225 are removed, and the conductive layer 1225 and the etched third insulating layer 1221 are formed so that their edges roughly coincide. Furthermore, in the region 1209 of the substrate 1200, selected portions of the third insulating layer 1221 formed below the conductive layer 1226 that do not overlap with the conductive layer 1226 are removed, and the conductive layer 1226 and the etched third insulating layer 1221 are formed so that their edges roughly coincide. In addition, in the region 1209 of the substrate 1200, selected portions of the third insulating layer 1221, the charge accumulation layer 1220, and the second insulating layer 1219 formed below the conductive layer 1227 that do not overlap with the conductive layer 1227 are removed, and the conductive layer 1227, the etched third insulating layer 1221 (referred to as a third insulating layer 1229), the etched charge accumulation layer 1228, and the etched second insulating layer 1219 (referred to as a second insulating layer 1230) are formed so that the edges roughly coincide.

In this case, insulating layers and the like that are formed at the same time as the conductive layers 1224, 1225, 1226, and 1227 are formed and that do not overlap with the conductive layers 1224, 1225, 1226, and 1227 may be removed, and insulating layers and the like that do not overlap with the conductive layers 1224, 1225, 1226, and 1227 may be removed with a resist mask left remaining after the conductive layers 1224, 1225, 1226, and 1227 are formed acting as a mask or with the conductive layers 1224, 1225, 1226, and 1227 acting as masks.

Figure 34C:
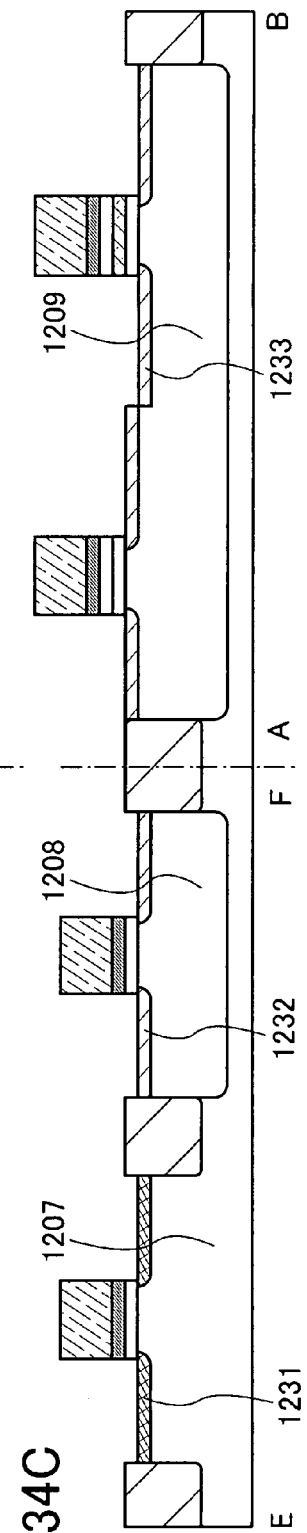

Next, impurity elements are introduced into selected portions of the regions 1207, 1208, and 1209 of the substrate 1200, and low-concentration impurity regions 1231, 1232, and 1233 are formed (refer to FIG. 34C). Here, the low-concentration impurity regions 1232 and 1233 are formed by introduction as selected of an impurity element imparting n-type conductivity at a low concentration into the regions 1208 and 1209, with the conductive layers 1225, 1226, and 1227 acting as masks, and the low-concentration impurity region 1231 is formed by selective introduction of an impurity element imparting p-type conductivity at a low concentration into the region 1207, with the conductive layer 1224 acting as a mask. For an impurity element imparting n-type conductivity, phosphorus (P), arsenic (As), or the like can be used. For an impurity element imparting p-type conductivity, boron (B), aluminum (Al), gallium (Ga), or the like can be used.

Next, insulating layers 1234, 1235, 1236, and 1237 (also called sidewalls) are formed so as to be in contact with a side surface of each of the conductive layers 1224, 1225, 1226, and 1227. Specifically, by a plasma CVD method, a sputtering method, or the like, the insulating layers 1234, 1235, 1236, and 1237 are each formed as a single-layer or multi-layer structure using layers containing inorganic materials such as silicon, silicon oxide, silicon nitride, or the like or using layers containing organic materials such as an organic resin or the like. Selected portions of the insulating layers are etched by anisotropic etching in which the subject is etched in a vertical direction, and the insulating layers 1234, 1235, 1236, and 1237 can be formed so as to be in contact with side surfaces of the conductive layers 1224, 1225, 1226, and 1227. It is to be noted that the insulating layers 1234, 1235, 1236, and 1237 are used as masks for doping when LDD (Lightly Doped Drain) regions are formed. In addition, here, the insulating layers 1234, 1235, 1236, and 1237 are formed so as to also be in contact with side surfaces of insulating layers or charge accumulation layers formed below the conductive layers 1224, 1225, 1226, and 1227.

Subsequently, by introduction of impurity elements into the regions 1207, 1208, and 1209 of the substrate 1200 with the insulating layers 1234, 1235, 1236, and 1237 and the conductive layers 1224, 1225, 1226, and 1227 acting as masks, impurity regions 1238, 1239, and 1240, each functioning as a source region or drain region, are formed (refer to FIG. 35A and FIGS. 38A and 38B). Here, the impurity regions 1239 and 1240 are formed by introduction of an impurity element imparting n-type conductivity at a high concentration into the regions 1208 and 1209, with the insulating layers 1235, 1236, and 1237 and the conductive layers 1225, 1226, and 1227 acting as masks, and the impurity region 1238 is formed by introduction of an impurity element imparting p-type conductivity at a high concentration into the region 1207, with the insulating layer 1234 and the conductive layer 1224 acting as a mask.

Accordingly, in the region 1207 of the substrate 1200, an impurity region 1238 forming a source region or drain region, a low-concentration impurity region 1241 forming an LDD region, and a channel formation region 1245 are formed. In addition, in the region 1208 of the substrate 1200, an impurity region 1239 forming a source region or drain region, a low-concentration impurity region 1242 forming an LDD region, and a channel formation region 1246 are formed. Furthermore, in the region 1209 of the substrate 1200, an impurity region 1240 forming a source region or drain region, low-concentration impurity regions 1243 and 1244 that each form an LDD region, and channel formation regions 1247 and 1248 are formed.

It is to be noted that, in the present embodiment, introduction of impurity elements is performed under a condition in which the regions 1207, 1208, and 1209 of the substrate 1200 that do not overlap with the conductive layers 1224, 1225, 1226, and 1227 are exposed. Consequently, the channel formation regions 1245, 1246, 1247, and 1248 formed in each of the regions 1207, 1208, and 1209 of the substrate 1200 can be formed, respectively, with the conductive layers 1224, 1225, 1226, and 1227 in a self-aligned manner.

Figures 35A, 35B, 35C:
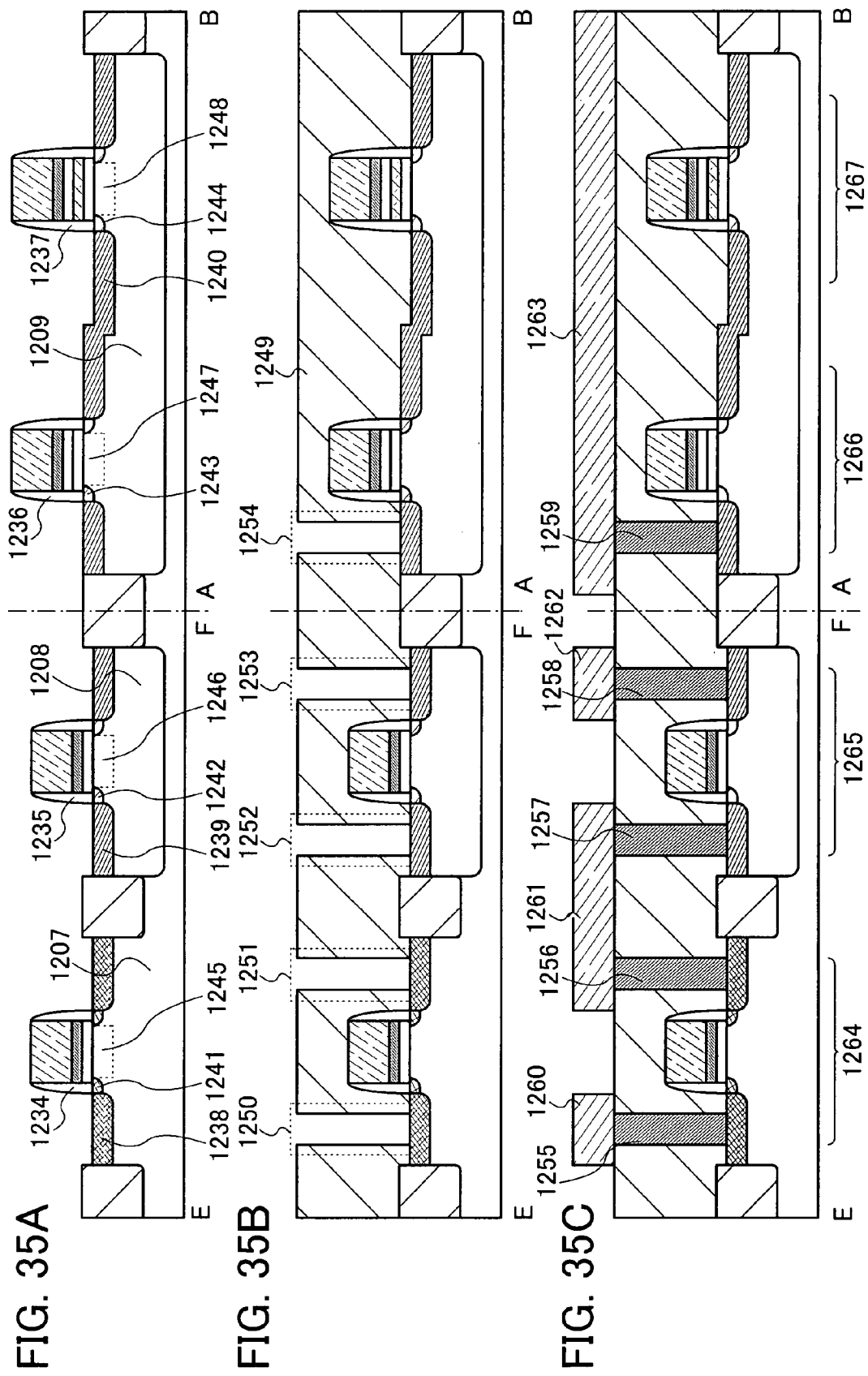
FIGS. 35A to 35C are diagrams used to illustrate an example of a manufacturing method of the nonvolatile semiconductor memory device of the present invention.

Next, an insulating layer 1249 is formed so as to cover insulating layers, conductive layers, and the like provided in the regions 1207, 1208, and 1209 of the substrate 1200, and openings 1250, 1251, 1252, 1253, and 1254 are formed in the insulating layer 1249 (refer to FIG. 35B).

The insulating layer 1249 can be formed in a manner similar to the manner in which the insulating layer 162 described in Embodiment 1 is formed. Here, the insulating layer 1249 is formed using polysilazane.

Next, conductive layers 1255, 1256, 1257, 1258, and 1259 are formed in the openings 1250, 1251, 1252, 1253, and 1254, respectively, using a CVD method, and conductive layers 1260, 1261, 1262, and 1263 are formed over the insulating layer 1249 so as to be electrically connected to the conductive layers 1255, 1256, 1257, 1258, and 1259 (refer to FIG. 35C, FIGS. 39A and 39B, and FIG. 40C).

The conductive layers 1255, 1256, 1257, 1258, and 1259 and the conductive layers 1260, 1261, 1262, and 1263 can be formed in a manner similar to the manner in which the conductive layer 164 described in Embodiment 1 is formed. Here, the conductive layers 1255, 1256, 1257, 1258, and 1259 can be formed by a CVD method by using selective growth of tungsten (W).

By performance of the above steps, a nonvolatile semiconductor memory device equipped with a p-type transistor 1264 formed in the region 1207 of the substrate 1200, an n-type transistor 1265 formed in the region 1208 of the substrate 1200, an n-type transistor 1266 formed in the region 1209 of the substrate 1200, and a nonvolatile memory element 1267 can be obtained.

Figure 36:
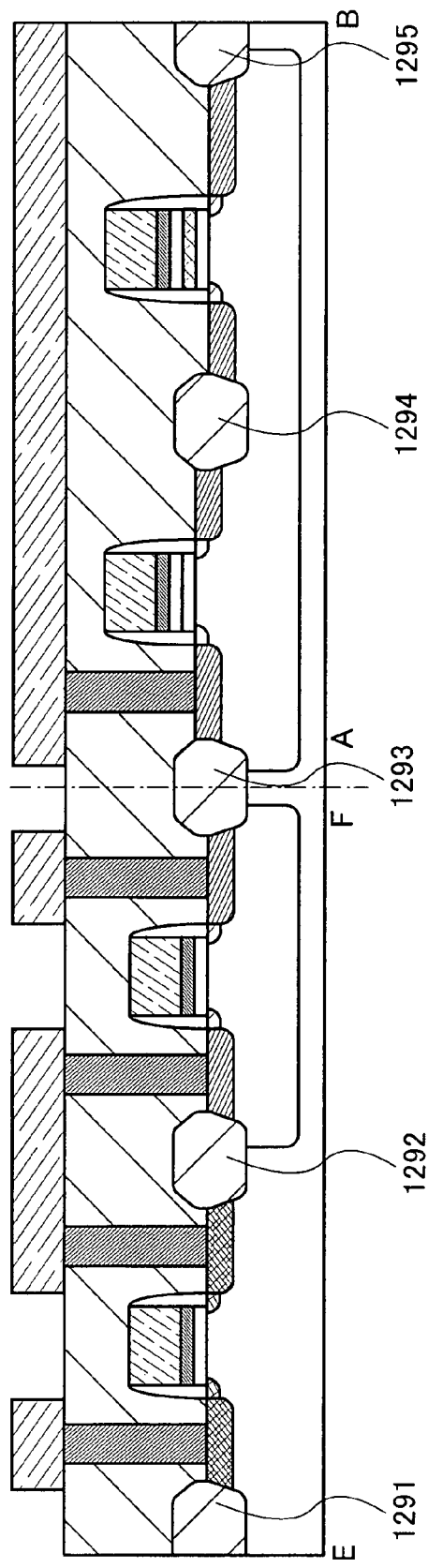
FIG. 36 is a diagram used to illustrate an example of a manufacturing method of the nonvolatile semiconductor memory device of the present invention.
Figure 37A:
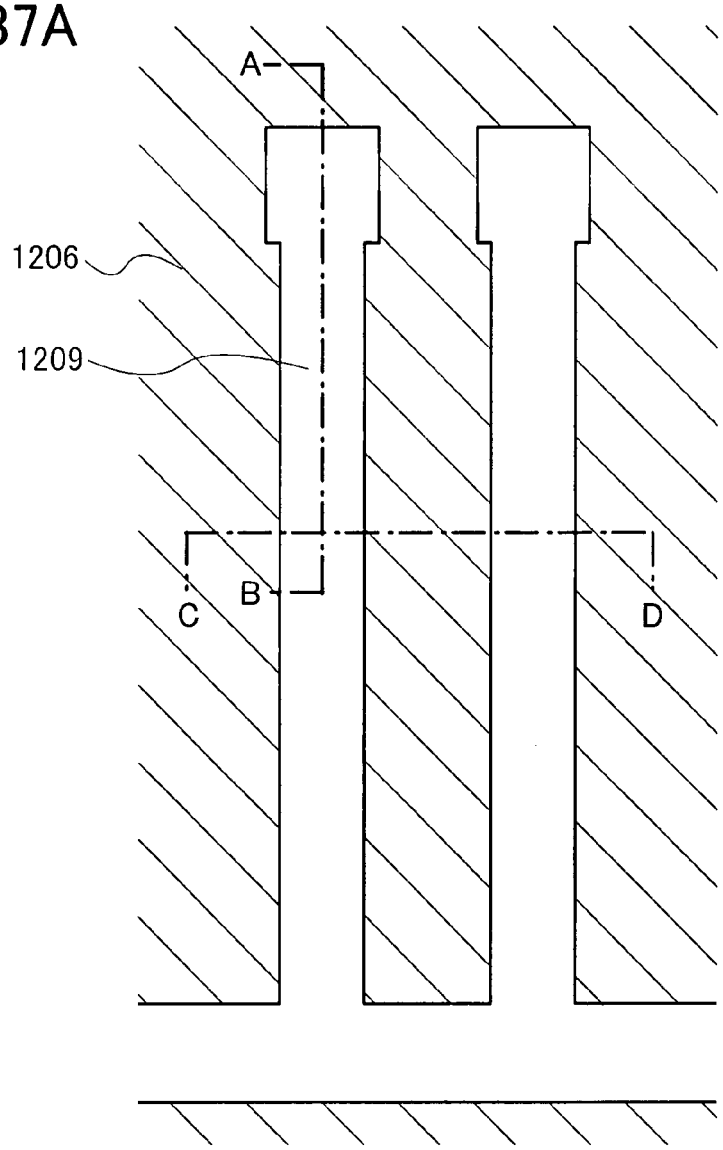
FIGS. 37A and 37B are diagrams used to illustrate examples of top views of the nonvolatile semiconductor memory device of the present invention.
Figure 37B:
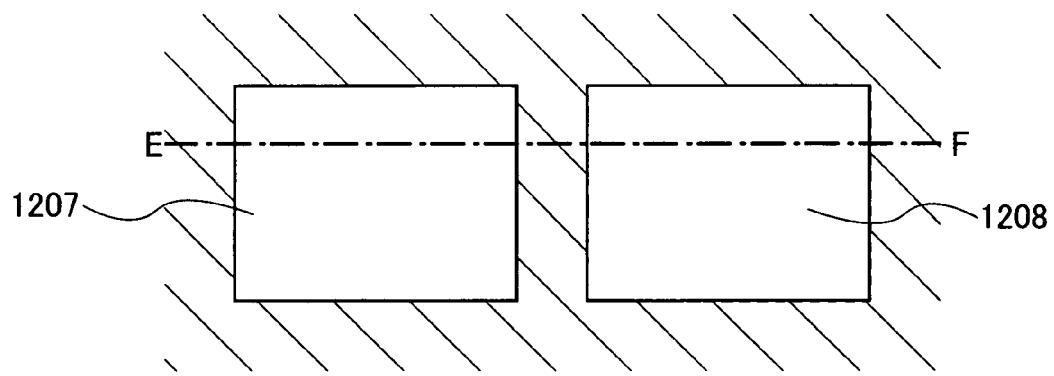

It is to be noted that, in place of the insulating layer 1206 functioning as an element separation region, insulating layers 1291, 1292, 1293, 1294, and 1295 formed using a selective oxidation method (a LOCOS (LOCal Oxidation of Silicon) method) can be used (refer to FIG. 36).

In addition, steps in the present embodiment can be performed in combination with steps in the Embodiment Mode or in other embodiments described in the present specification.

EMBODIMENT 5

In the present embodiment, a manufacturing method of a nonvolatile semiconductor memory device differing from the manufacturing method of the above embodiments will be explained with reference to drawings.

By performance of steps similar to the steps in Embodiment 4, a first insulating layer 1213, second insulating layers 1214, 1215, and 1216, and a charge accumulation layer 1217 are formed over a substrate 1200. Next, a third insulating layer 1271 is formed over the charge accumulation layer 1217 (refer to FIG. 41A).

The third insulating layer 1271 can be formed in a manner similar to the manner in which the third insulating layer 1221 described in Embodiment 4 is formed.

Next, a resist mask 1218 is formed over the third insulating layer 1271, and, with the resist mask 1218 acting as a mask, selected portions of the third insulating layer 1271, the charge accumulation layer 1217, and the second insulating layers 1214, 1215, and 1216 are removed. Portions of the second insulating layer 1216, the charge accumulation layer 1217, and the third insulating layer 1271 formed in a region 1209 are left remaining and set to be a second insulating layer 1219, a charge accumulation layer 1220, and a third insulating layer 1272 (refer to FIG. 41B).

After the resist mask 1218 is removed, fourth insulating layers 1273, 1274, and 1275 are formed in exposed portions of regions 1207, 1208, and 1209 of the substrate 1200. The fourth insulating layers 1273, 1274, and 1275 can be formed, in a manner similar to the manner in which the second insulating layers 1214 and 1215 described in Embodiment 4 are formed, by oxidation of the surface of the substrate 1200 by heat treatment or by oxidation or nitridation of the surface of the substrate 1200 by plasma treatment. Because of this, the thickness of each of the fourth insulating layers 1273, 1274, and 1275 can be made thin. In addition, the fourth insulating layers 1273 and 1274 function as gate insulating films of transistors provided in a logic component. Because of this, a transistor in which high speed operation is possible can be manufactured.

Here, for the fourth insulating layers 1273, 1274, and 1275, after oxidation by high density plasma treatment is performed on the surface of the regions 1207, 1208, and 1209 provided in the substrate 1200, nitridation is performed, and silicon oxide layers with nitrogen plasma treated layers with a high concentration of nitrogen formed over the surface or near the surface of the silicon oxide layers.

Next, conductive layers 1222 and 1223 are formed over the first insulating layer 1213, the third insulating layer 1272, and the fourth insulating layers 1273, 1274, and 1275 (refer to FIG. 41C).

Next, by performance of steps similar to the steps in Embodiment 4, selected portions of the conductive layers 1222 and 1223 are removed by etching, the conductive layers 1222 and 1223 in a portion above the regions 1207, 1208, and 1209 of the substrate 1200 are left remaining, and conductive layers 1224, 1225, and 1226 each functioning as a gate electrode and conductive layer 1227 functioning as a control gate are formed (refer to FIG. 42A and FIG. 40B). In addition, in the region 1209 of the substrate 1200, selected portions of a third insulating layer 1221, a charge accumulation layer 1228, and a second insulating layer 1219 formed below the conductive layer 1227 that do not overlap with the conductive layer 1227 are removed, and the conductive layer 1227, the third insulating layer 1229, the charge accumulation layer 1228, and the second insulating layer 1230 are formed so that their edges roughly coincide.

Figure 38A:
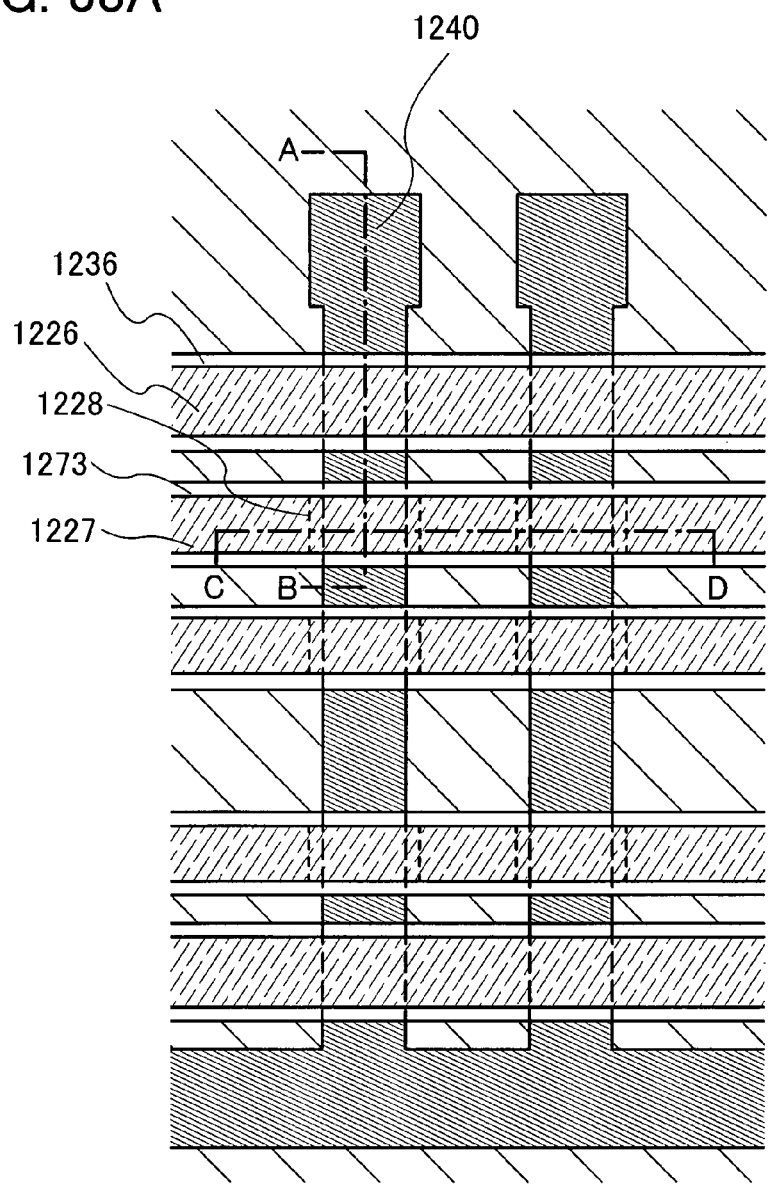
FIGS. 38A and 38B are diagrams used to illustrate examples of top views of the nonvolatile semiconductor memory device of the present invention.
Figure 38B:
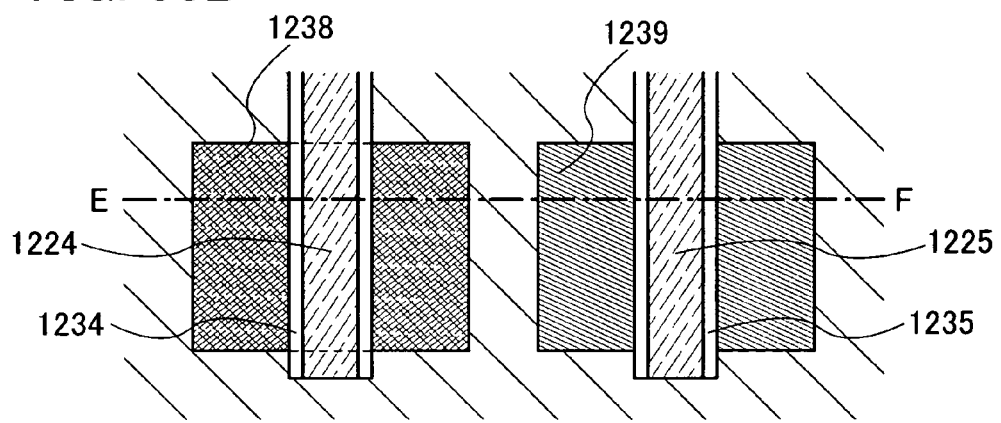
Figure 39A:
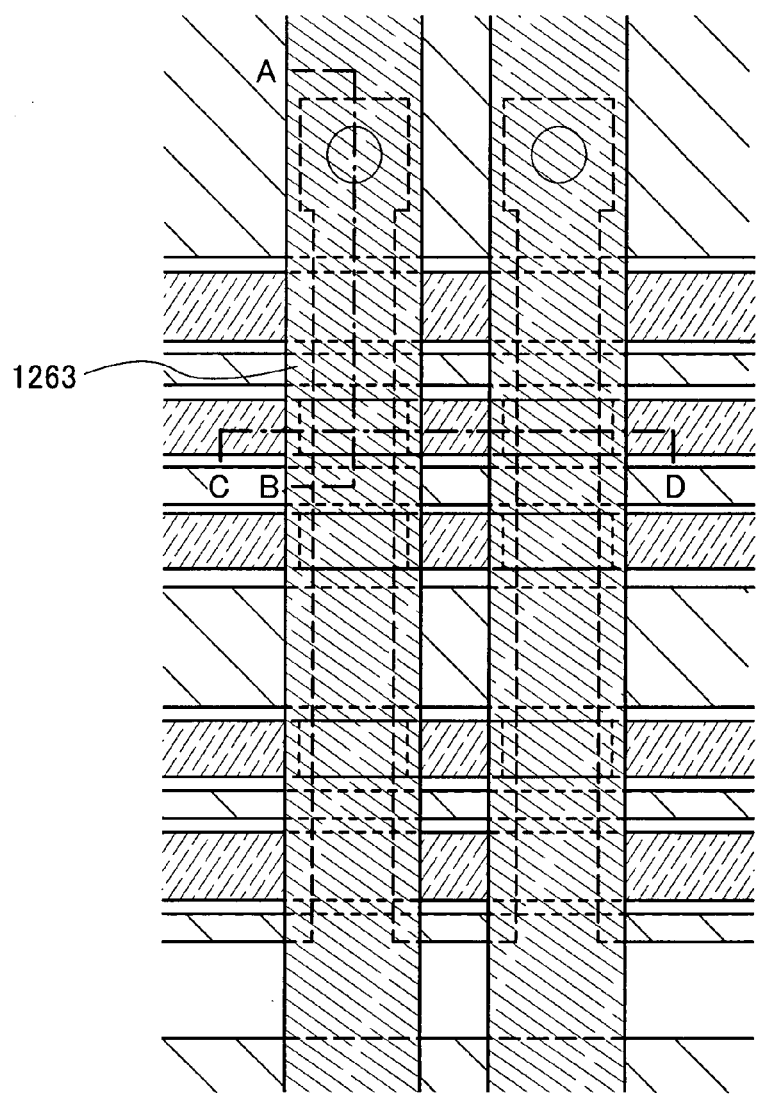
FIGS. 39A and 39B are diagrams used to illustrate examples of top views of the nonvolatile semiconductor memory device of the present invention.
Figure 39B:
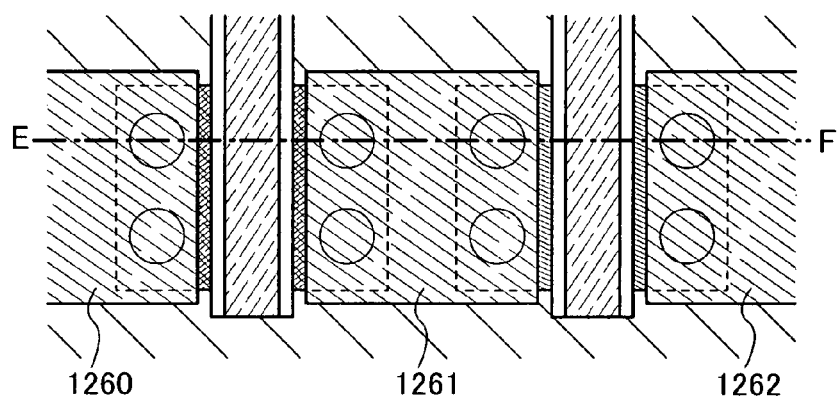

Next, by performance of steps similar to the steps in Embodiment 4, insulating layers 1234, 1235, 1236, and 1237 to be in contact with side surfaces of the conductive layers 1224, 1225, 1226, and 1227, impurity regions 1238, 1239, and 1240 each functioning as a source region or drain region, and low-concentration impurity regions 1241, 1242, 1243, and 1244 forming LDD regions are formed (refer to FIG. 42B and FIGS. 38A and 38B).

Next, an insulating layer 1249, conductive layers 1255, 1256, 1257, 1258, and 1259, and conductive layers 1260, 1261, 1262, and 1263 formed so as to be electrically connected to the conductive layers 1255, 1256, 1257, 1258, and 1259 are formed as selected (refer to FIG. 42C, FIGS. 39A and 39B, and FIG. 40C).

By performance of the above steps, a nonvolatile semiconductor memory device equipped with a p-type transistor 1274 formed in the region 1207 of the substrate 1200, an n-type transistor 1275 formed in the region 1208 of the substrate 1200, an n-type transistor 1276 formed in the region 1209 of the substrate 1200, and a nonvolatile memory element 1277 can be obtained.

EMBODIMENT 6

Figure 43:
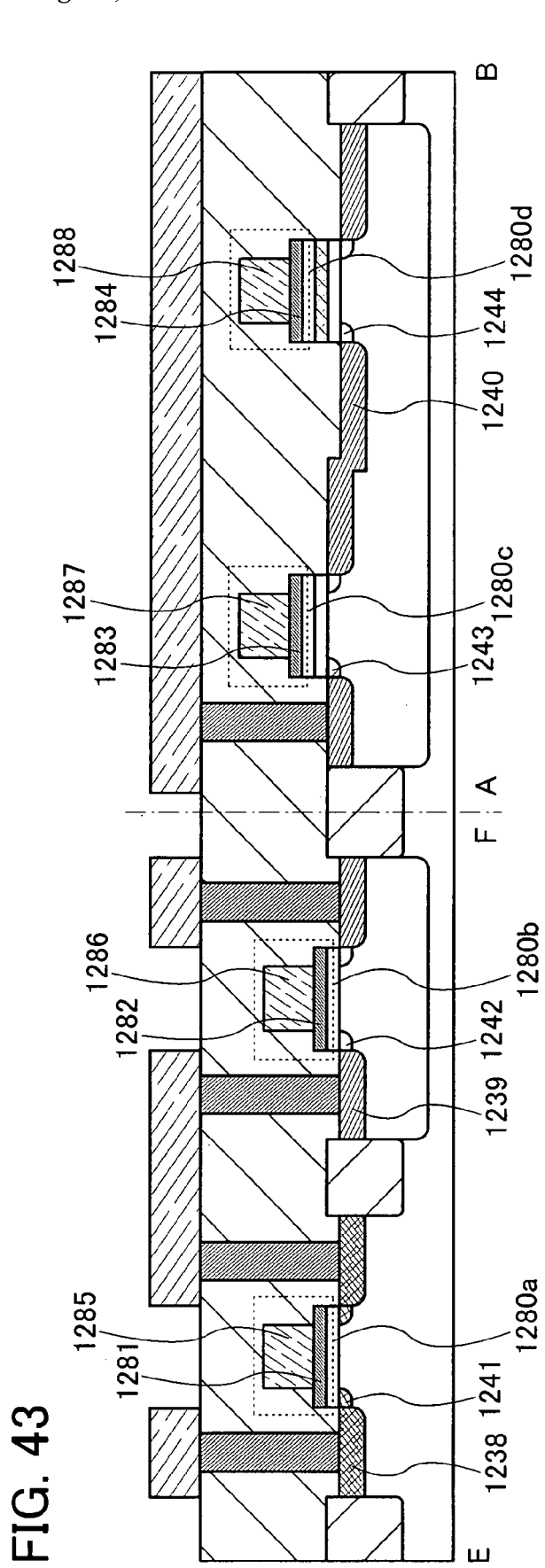
FIG. 43 is a diagram used to illustrate an example of a manufacturing method of the nonvolatile semiconductor memory device of the present invention.

In the present embodiment, the conductive layers 1224, 1225, 1226, and 1227, each functioning as a gate electrode, of Embodiment 4 and Embodiment 5 will be explained with reference to FIG. 43. Here, an explanation will be made using the explanation described in Embodiment 4, but the explanation of Embodiment 5 can be applied to the present embodiment, as well.

In the present embodiment, each of conductive layers 1280a, 1280b, 1280c, and 1280d, which each function as a gate electrode, is formed as a multilayer structure in which each of first layers 1281, 1282, 1283, and 1284 formed from a metal nitride and each of second layers 1285, 1286, 1287, and 1288 formed from metal are included, with a shape in which edges of each of the first layers extend beyond edges of each of the second layers. At this time, with the first layers each being formed from a metal nitride, each of the first layers can be used as a barrier metal. In other words, diffusion of the metallic elements of which the second layers are formed into an insulating layer functioning as a gate insulating film or into a substrate 1200 below the insulating layer can be prevented.

By use of the conductive layers 1280a, 1280b, 1280c, and 1280d with this kind of shape as gate electrodes and introduction of impurity elements into regions 1207, 1208, and 1209 of the substrate 1200, impurity regions 1238, 1239, and 1240, each functioning as a source or drain region, and low-concentration impurity regions 1241, 1242, 1243 and 1244, each forming an LDD region can be formed simultaneously. In other words, the regions of the first layers extending beyond the edges of the second layers function as masks for the low-concentration impurity regions. Because of this, the number of manufacturing steps can be reduced and throughput can be improved.

EMBODIMENT 7

In the present embodiment, an application of a semiconductor device equipped with a nonvolatile semiconductor memory device of the present invention described above in which input and output of data by non-contact is possible will be explained hereinafter with reference to drawings. The semiconductor device in which input and output of data by non-contact is possible is called an RFID tag, an ID tag, an IC chip, an RF tag, a wireless tag, an electronic tag, or a wireless chip, depending on the form of use.

Figure 44A:
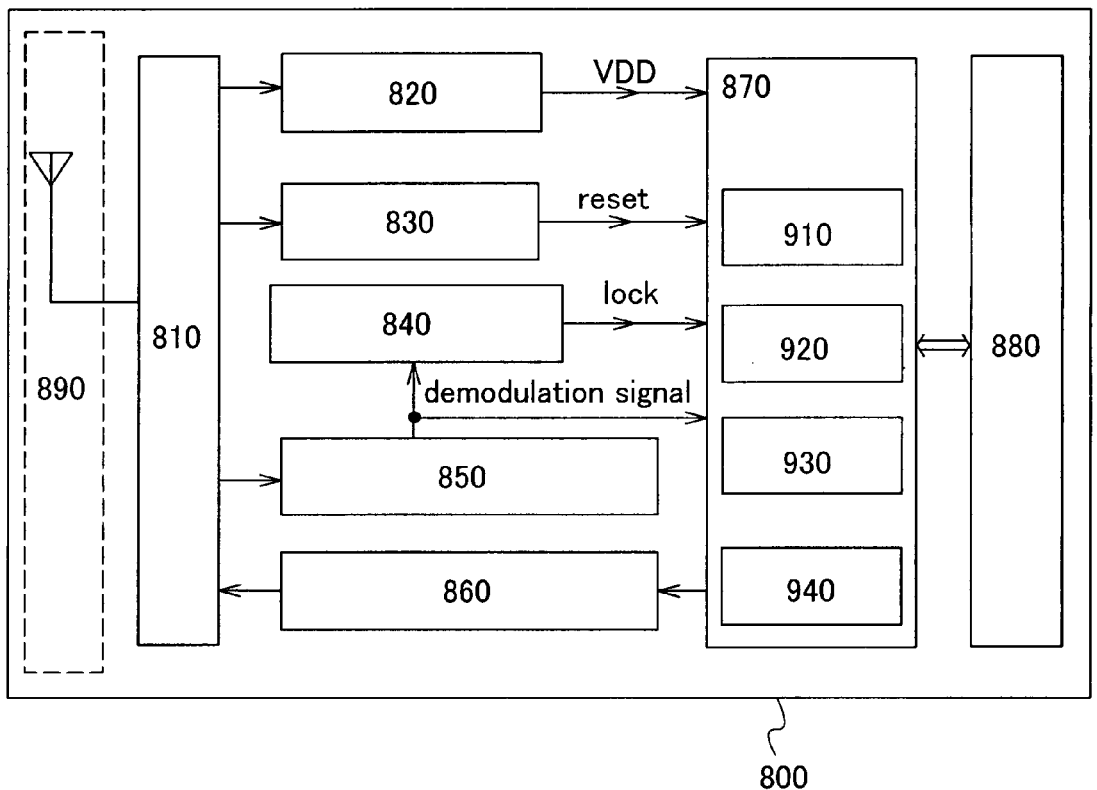
FIGS. 44A to 44C are diagrams used to illustrate an example of the nonvolatile semiconductor memory device of the present invention.

A semiconductor device 800 has a function of communication of data by noncontact and includes a high frequency circuit 810, a power supply circuit 820, a reset circuit 830, a clock generating circuit 840, a data demodulation circuit 850, a data modulation circuit 860, a control circuit 870 used for performing control of other circuits, a memory circuit 880, and an antenna 890 (FIG. 44A). The high frequency circuit 810 receives a signal by the antenna 890 and is a circuit that outputs a signal from the antenna 890 received by the data modulation circuit 860. The power supply circuit 820 is a circuit that generates a power supply potential from a received signal. The reset circuit 830 is a circuit that generates a reset signal. The clock generating circuit 840 is a circuit that generates various clock signals based on a received signal. The data demodulation circuit 850 is a circuit that demodulates and outputs a received signal to the control circuit 870. The data modulation circuit 860 is a circuit that modulates a signal received from the control circuit 870. In addition, for the control circuit 870, for example, a code extraction circuit 910, a code judgment circuit 920, a CRC judgment circuit 930, and an output unit circuit 940 are provided. It is to be noted that the code extraction circuit 910 is a circuit that extracts each of a plurality of codes included in commands transmitted by the control circuit 870, the code judgment circuit 920 is a circuit that compares extracted codes and codes corresponding to a reference and determines the content of commands, and the CRC judgment circuit 930 is a circuit that detects the presence of transmission errors and the like based on a determined code.

Next, an example of an operation of the semiconductor device described above will be explained. First, a wireless signal is received by the antenna 890. The wireless signal is transmitted through the high frequency circuit 810 to the power supply circuit 820, and a high power supply potential (hereinafter, referred to as VDD) is generated. VDD is supplied to every circuit included in the semiconductor device 800. In addition, a signal transmitted to the data demodulation circuit 850 through the high frequency circuit 810 is demodulated (hereinafter, referred to as a demodulated signal). Moreover, a signal passing through the reset circuit 830 via the high frequency circuit 810 and the demodulated signal passing through the clock generating circuit 840 are transmitted to the control circuit 870. The signal transmitted to the control circuit 870 is analyzed by the code extraction circuit 910, the code judgment circuit 920, the CRC judgment circuit 930, and the like. Then, in accordance with the analyzed signal, information about the semiconductor device stored in the memory circuit 880 is output. The output information about the semiconductor device passes through the output unit circuit 940 and is encoded. Furthermore, the encoded information about the semiconductor device passes through the data modulation circuit 860 and is transmitted as a radio signal by the antenna 890. It is to be noted that, in a plurality of circuits included in the semiconductor device 800, a low power supply potential (hereinafter, referred to as VSS) is common, and VSS can be set as GND. In addition, a nonvolatile semiconductor memory device of the present invention can be applied to the memory circuit 880. Because the driving voltage of the nonvolatile semiconductor memory device of the present invention can be reduced, it is possible to lengthen the distance at which data communication by noncontact can be performed.

In this way, a signal is transmitted to the semiconductor device 800 from a reader/writer, and by receipt by the reader/writer of the signal transmitted from the semiconductor device 800, the reading of data of a semiconductor device becomes possible.

Furthermore, the semiconductor device 800 may be a type in which, for supply of a power supply voltage to each circuit, no electric power supply (battery) is installed, and a power supply voltage is supplied by use of electromagnetic waves; or the semiconductor device 800 may be a type in which, for supply of a power supply voltage to each circuit, an electric power supply (battery) is installed, and a power supply voltage is supplied to each circuit by use of electromagnetic waves and a battery.

Figure 44B:
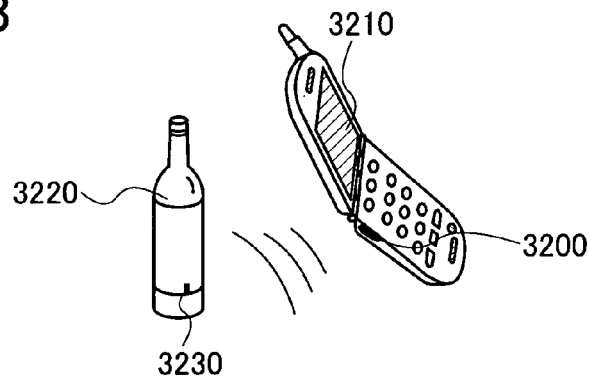
Figure 44C:
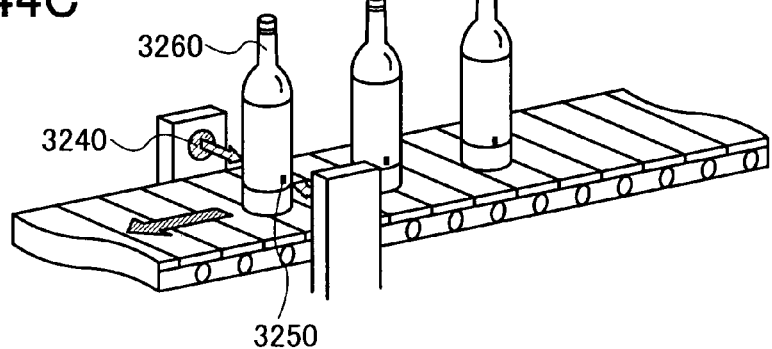

Next, an example of a usage mode of a semiconductor device in which input and output of data by noncontact is possible will be explained. A reader/writer 3200 is provided on a side surface of a portable terminal including a display, and a semiconductor device 3230 is provided on a side surface of a product 3220 (FIG. 44B). When the reader/writer 3200 is held over the semiconductor device 3230 which is provided on the product 3220, information related to products such as the materials used in and place of origin of the product, test results of a manufacturing process, records and the like for the distribution process of the product, as well as explanation of products are displayed on the display 3210. In addition, when a product 3260 is transported along on a conveyor belt, by use of a reader/writer 3240 and a semiconductor device 3250 installed in the product 3260, the product 3260 can be inspected (FIG. 44C). As thus described, by application of a semiconductor device in a system, acquisition of information can be performed easily, and high functionalization and a shift to a higher added value can be realized.

In addition, a nonvolatile semiconductor memory device of the present invention can be used in electronic devices of every field in which memory is provided. For example, for electronic devices to which a nonvolatile semiconductor memory device of the present invention can be applied, a camera such as a video camera, a digital camera, or the like; a goggles-type display (a head-mounted display); a navigation system; a sound reproduction system (a car audio system, an audio component, or the like); a computer; a game machine; a handheld terminal (a mobile computer, a cellular phone, a portable game machine, an electronic book reader, or the like); an image reproduction device including recording media (specifically, a device that can play storage media such as a DVD (Digital Versatile Disc) and the like and that includes a display that can display the images); and the like can be given. Some specific examples of these electronic devices are shown in FIGS. 45A to 45E.

Figure 45A:
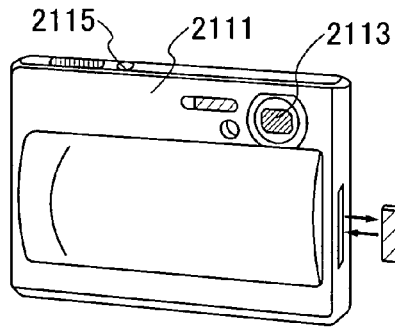
FIGS. 45A to 45E are diagrams used to illustrate an application mode of the nonvolatile semiconductor memory device of the present invention.
Figure 45B:
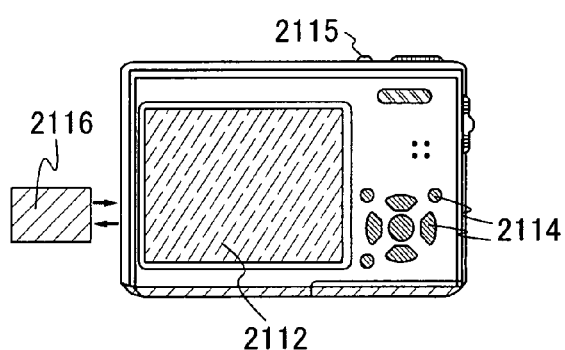

In FIGS. 45A and 45B, a digital camera is shown. FIG. 45B is a diagram showing the backside of the camera shown in FIG. 45A. This digital camera includes a housing 2111, a display 2112, a lens 2113, operation keys 2114, a shutter button 2115, and the like. In addition, the digital camera includes nonvolatile memory chips 2116 that can be removed, and the memory component 2116 has a structure in which data taken with the digital camera can be stored. A nonvolatile semiconductor memory device formed using the present invention can be applied to the memory component 2116.

Figure 45C:
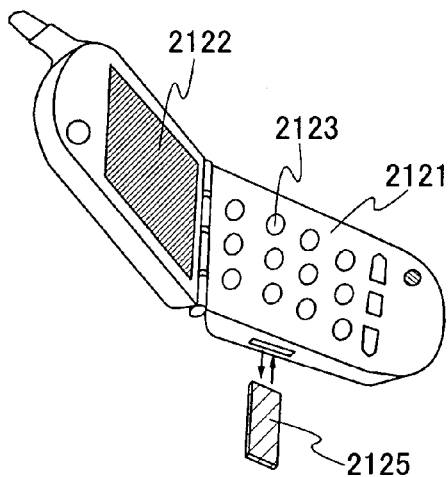

In addition, a cellular phone, one typical example of a handheld terminal, is shown in FIG. 45C. This cellular phone includes a housing 2121, a display 2122, operation keys 2123, and the like. Furthermore, the cellular phone includes nonvolatile memory chips 2125 that can be removed, and data such as telephone numbers and the like, images, music data, or the like stored in the cellular phone can be played back using the memory component 2125. A nonvolatile semiconductor memory device formed using the present invention can be applied to the memory component 2125.

Figure 45D:
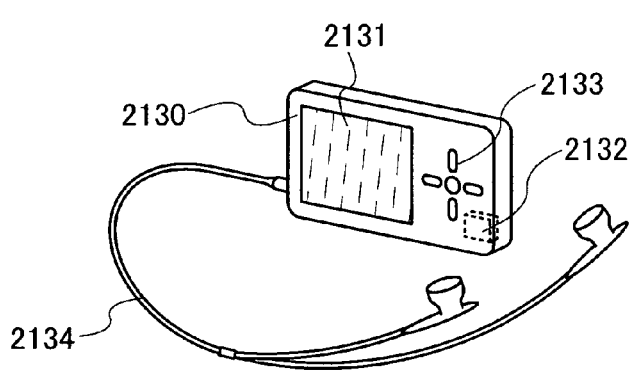

In addition, a digital audio player, one typical example of an audio device, is shown in FIG. 45D. The digital audio player shown in FIG. 45D includes a main body 2130, a display 2131, a memory component 2132, operation keys 2133, earphones 2134, and the like. It is to be noted that headphones or wireless earphones can be used in place of the earphones 2134. A nonvolatile semiconductor memory device formed using the present invention can be applied to the memory component 2132. For example, NAND-type nonvolatile memory chips with a storage capacity of from 20 to 200 gigabytes (GB) are used, and by operation of the operation keys 2133, images and audio (music) can be stored and played back. It is to be noted that power consumption can be suppressed by display of white characters on a black background with the display 2131. This is particularly effective in a portable audio device. It is to be noted that a nonvolatile semiconductor storage device provided in the memory component 2132 may have a structure in which removal of the memory component 2132 is possible.

Figure 45E:
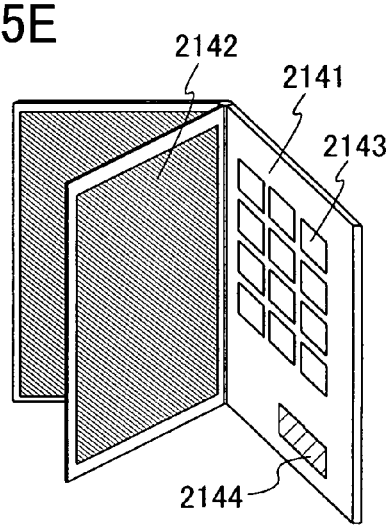

Furthermore, an electronic book reader (also called an electronic paper reader) is shown in FIG. 45E. The electronic book reader shown in FIG. 45E includes a main body 2141, a display 2142, operation keys 2143, a memory component 2144, and the like. In addition, a modem may be installed in the main body 2141, or the electronic book reader may have a structure in which data is transmitted and received wirelessly. A nonvolatile semiconductor memory device formed using the present invention can be applied to the memory component 2144. For example, NAND-type nonvolatile memory chips with a storage capacity of from 20 to 200 gigabytes (GB) are used, and by operation of the operation keys 2133, images and audio (music) can be stored and played back. It is to be noted that a nonvolatile semiconductor storage device provided in the memory component 2144 may have a structure in which the removal of the memory component 2144 is possible.

As described above, the application range of a nonvolatile semiconductor memory device of the present invention is extremely wide and can be used in electronic devices of every field in which memory is provided.

This application is based on Japanese Patent Application serial No. 2006-101052 filed with Japan Patent Office on Mar. 31, 2006, the entire contents of which are hereby incorporated by reference.

What is claimed is:

1. A nonvolatile semiconductor memory device comprising:
   a semiconductor layer including a channel formation region formed between a pair of impurity regions which are apart from each other;
   a first insulating layer over the channel formation region;
   a charge accumulation layer over the channel formation region with the first insulating layer interposed therebetween;
   a second insulating layer over the charge accumulation layer; and
   a control gate over the charge accumulation layer with the second insulating layer interposed therebetween,
   wherein the charge accumulation layer comprises a compound of germanium with an additional element of nitrogen and the compound is insulative, and
   wherein the semiconductor layer is formed on an insulating surface and into an island shape.

2. The nonvolatile semiconductor memory device according to claim 1, wherein the compound is at least one selected from germanium nitride, germanium nitride to which oxygen is added, germanium oxide to which nitrogen is added, germanium nitride to which oxygen and hydrogen are added, and germanium oxide to which nitrogen and hydrogen are added.

3. The nonvolatile semiconductor memory device according to claim 1, wherein the charge accumulation layer is formed at a thickness greater than or equal to 1 nm and less than or equal to 20 nm.

4. The nonvolatile semiconductor memory device according to claim 1, wherein the first insulating layer is a silicon oxide layer, and the silicon oxide layer or an interface of the silicon oxide layer comprises nitrogen.

5. The nonvolatile semiconductor memory device according to claim 4, wherein the silicon oxide layer is formed by a plasma treatment to the semiconductor layer under an oxidizing atmosphere and then treated by nitrogen plasma.

6. The nonvolatile semiconductor memory device according to claim 1, wherein a plurality of charge accumulation layers and control gates are arranged over the semiconductor layer.

7. A nonvolatile semiconductor memory device comprising: a semiconductor layer including a channel formation region formed between a pair of impurity regions which are apart from each other; a first insulating layer over the channel formation region; a charge accumulation layer over the channel formation region with the first insulating layer interposed therebetween; a second insulating layer over the charge accumulation layer; and a control gate over the charge accumulation layer with the second insulating layer interposed therebetween, wherein the charge accumulation layer comprises a compound of germanium with an additional element of nitrogen, the compound is insulative and the charge accumulation layer includes particles.

8. The nonvolatile semiconductor memory device according to claim 7, wherein the particles are germanium or silicon-germanium particles.

9. The nonvolatile semiconductor memory device according to claim 7, wherein the compound is at least one selected from germanium nitride, germanium nitride to which oxygen is added, germanium oxide to which nitrogen is added, germanium nitride to which oxygen and hydrogen are added, and germanium oxide to which nitrogen and hydrogen are added.

10. The nonvolatile semiconductor memory device according to claim 7, wherein the charge accumulation layer is formed at a thickness greater than or equal to 1 nm and less than or equal to 20 nm.

11. The nonvolatile semiconductor memory device according to claim 7, wherein the first insulating layer is a silicon oxide layer, and the silicon oxide layer or an interface of the silicon oxide layer comprises nitrogen.

12. The nonvolatile semiconductor memory device according to claim 11, wherein the silicon oxide layer is formed by a plasma treatment to the semiconductor layer under an oxidizing atmosphere and then treated by nitrogen plasma.

13. The nonvolatile semiconductor memory device according to claim 7, wherein a plurality of charge accumulation layers and control gates are arranged over the semiconductor layer.

14. The nonvolatile semiconductor memory device according to claim 7, wherein the semiconductor layer is formed on an insulating surface.

15. The nonvolatile semiconductor memory device according to claim 7, wherein the semiconductor layer is a semiconductor substrate.

* * * * *